US006242353B1

(12) United States Patent
Kobayashi et al.

(10) Patent No.: US 6,242,353 B1
(45) Date of Patent: Jun. 5, 2001

(54) WAFER HOLDING HEAD AND WAFER POLISHING APPARATUS, AND METHOD FOR MANUFACTURING WAFERS

(75) Inventors: Tatsunori Kobayashi; Hiroshi Tanaka; Naoki Rikita, all of Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/525,322

(22) Filed: Mar. 13, 2000

(30) Foreign Application Priority Data

| Mar. 12, 1999 | (JP) | 11-067583 |
| Mar. 23, 1999 | (JP) | 11-078688 |
| May 14, 1999 | (JP) | 11-135017 |
| Jun. 22, 1999 | (JP) | 11-175950 |
| Sep. 6, 1999 | (JP) | 11-251429 |

(51) Int. Cl.[7] .................................................. H01L 21/00
(52) U.S. Cl. ............................ 438/692; 156/345; 438/8; 438/14; 438/745
(58) Field of Search ........................... 438/8, 14, 692, 438/745; 156/345 LC, 345 LP; 216/38, 88; 451/36

(56) References Cited

U.S. PATENT DOCUMENTS

| 5,599,423 | * | 2/1997 | Parker et al. ........................ 438/692 |
| 5,804,507 | * | 9/1998 | Perlov et al. ........................ 438/692 |
| 5,877,088 | * | 3/1999 | Samitsu et al. ..................... 438/692 |
| 6,107,203 | * | 8/2000 | Vanell ................................. 438/692 |

FOREIGN PATENT DOCUMENTS

| 0 567 894 A1 | 4/1993 | (EP) . |
| 0 548 846 A1 | 6/1993 | (EP) . |
| 0 771 661 A2 | 5/1997 | (EP) . |
| 0 771 661 A3 | 9/1997 | (EP) . |
| 10 156711 | 6/1998 | (JP) . |
| 10 217105 | 8/1998 | (JP) . |

* cited by examiner

*Primary Examiner*—William Powell
(74) *Attorney, Agent, or Firm*—Oblon, Spivak, McClelland, Maier & Neustadt, P.C.

(57) ABSTRACT

The present invention provides wafer polishing apparatus in which the wafer holding head comprises a diaphragm substantially vertically expanded to the head axis in the head body; a carrier, which is fixed to the diaphragm and provided so as to be able to displace along the head axis direction together with the diaphragm; a retainer fixed to the diaphragm in a concentric relation to the carrier; a pressure adjusting mechanism for controlling the pressure of a fluid chamber formed between the diaphragm and the head body; a plurality of carrier torque mechanisms provided between the head body and the carrier for communicating the torque of the head body to the carrier; a plurality of first sensors, which is provided at individual torque transfer mechanism, for observing the force along the direction of rotation acting on the wafer; and a processor, which is connected to each first sensor, for calculating the force acting on the wafer based on the output from these first sensors.

18 Claims, 29 Drawing Sheets

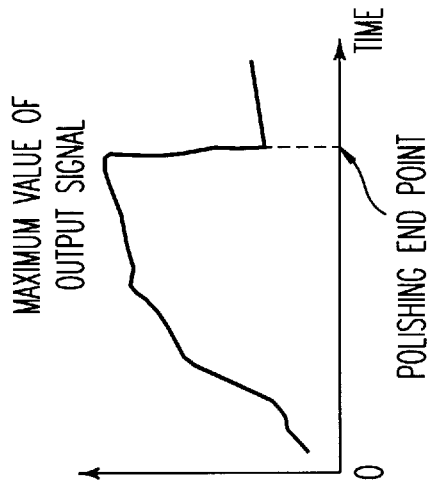
FIG. 13-A1
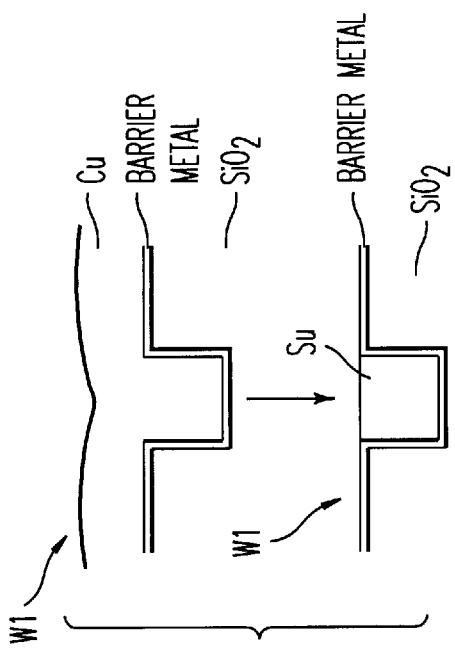
FIG. 13-A2
FIG. 13-B1
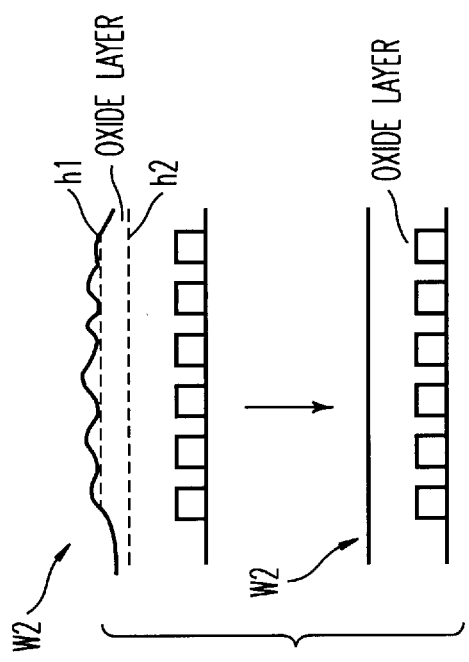
FIG. 13-B2

WAFER HOLDING HEAD AND WAFER POLISHING APPARATUS, AND METHOD FOR MANUFACTURING WAFERS

BACKGROUND OF THE INVENTION

1. Field of the Invention

The present invention relates to a wafer holding head to be used in an apparatus for polishing the surface of a semiconductor wafer in the process for manufacturing semiconductors and a wafer polishing apparatus, and a method for manufacturing wafers.

The specification of the present invention is based on the Japanese Patent Applications (Japanese Unexamined Patent Application Nos. 11-67583, 11-78688, 11-135017, 11-175950 and 11-251429), and the content of these Japanese applications are incorporated herein by references.

2. Description of the Related Art

Fine patterning of semiconductors have been developed in recent years as a result of development of highly integrated semiconductor devices. Since fine patterning of multilayer structures have been made easy and secure, it is particularly important to planarize the surface of semiconductor wafers to the best in the manufacturing process.

Finer planarization of the surface of the semiconductor wafers allows patterning precision to be improved besides making focusing of the exposed light easy when a photolithographic process is used for patterning. In addition, production of the semiconductor wafers can enjoy a low cost because the work efficiency is improved without providing complicated equipments for manufacturing the semiconductor wafers.

A chemical-mechanical polishing method (a CMP method) has been highlighted for this purpose since the method can polish the surface film with a high degree of planarity.

The surface of wafers are mechanically and chemically polished and planarized using a slurry of an abrasive such as an alkaline slurry containing $SiO_2$, a neutral slurry containing $SeO_2$, and an acidic slurry containing $Al_2O_3$ (these are simply referred as a slurry hereinafter) in the CMP method. An example of the wafer polishing apparatus used for this method is shown in FIG. 31.

In FIG. 31, the wafer polishing apparatus 200 is provided with a wafer holding head 201 holding a wafer to be polished, and a polishing pad 202 affixed on the entire surface of a disk shaped platen 203. A plurality of the wafer holding heads 201 are attached at the lower portion of a carousel 204 as a head driving mechanism, which is rotatably held on a spindle 211 and rotates with a planetary motion on the polishing pad 202. The center of the platen 203 may be provided eccentric to the center of the revolution of the wafer holding heads 201.

The platen 203 is horizontally placed at the center of a base 205, and is allowed to rotate around its axis line with a platen driving mechanism 206 provided in the base 205. Guide posts 207 are provided at the side portions of the base 205, while an upper mounting plate (a bridge) 209 for supporting a carousel driving mechanism 210 is disposed between the guide posts 207. The carousel driving mechanism 210 serves for allowing the carousel 204 provided below the driving mechanism to rotate around the axis line.

Bridge supports 212 are disposed so as to protrude from the base 205, and gap adjustable gap 213 are provided at the tips of the bridge supports 212. Support plates 214 are disposed in opposed relation to the bridge supports 212. These support plates 214 are fixed to the upper mounting plate 209 and protrude downward from the upper mounting plate 209. The distance from the wafer holding head 201 to the polishing pad 202 are properly adjusted by allowing the bridge supports 212 to contact the support plates 214. Wafers W are polished by allowing the wafers W held by the wafer holding head 201 to contact the surface of the polishing pad 202, followed by allowing the carousel 204 and the platen 203 to rotate.

U.S. Pat. No. 5,205,082 discloses an improved polishing apparatus having a wafer holding head as shown in FIG. 32. The wafer holding apparatus comprises a hollow head body 221, a diaphragm 222 horizontally expanding in the head body 221, and a carrier 224 fixed at the lower face of the diaphragm 222. A retainer ring 232 is disposed at the outer circumference of the carrier 224 in a concentric relation with a slight gap between them, and the retainer ring 232 is also fixed to the diaphragm 222. Further, stoppers 223 of the main head 221 are disposed at the outer circumference of the retainer ring 232 in a concentric relation with a slight gap. The carrier 224 and the retainer ring 232 are supported to the head body 221 in a floating manner as described above. An air chamber 226 is formed at upward of the diaphragm 222 by taking advantage of the head body 221 and the diaphragm 222, wherein a compressed air is supplied to the air chamber from a compressed air source 230 through inside of a shaft 228.

Polishing works are carried out by allowing a wafer W, fixed by being affixed to the carrier 224 via an insert S, to contact a polishing pad 202. The contact pressure is made to be adjustable by changing the pressure of the air supplied to the air chamber 226. The conventional wafer polishing apparatus as described above can even the contact pressure of the wafer W as described above with an advantage for improving uniformity of the polished face of the wafer. The diaphragm 222 to be used herein is usually made of an elastic material such as rubber and an extremely thin plate of a metal, which has a surface rigidity to an extent not to inhibit the movement of the carrier 224 along the axis line direction.

Meanwhile, a frictional force always generates between the wafer W and the polishing pad 202. Consequently, a horizontal force and torque applied to the carrier 224 and the retainer ring 223 are received by the retainer ring 232, the stopper 223 of the head body 221, and the diaphragm 222 in the conventional wafer polishing apparatus as described above. The carrier 224 and the retainer ring 232, and the retainer ring 232 and the stopper 223, each being a circular contour, are fitted with each other with a slight gap as described above. Accordingly, although the horizontal force applied to the carrier 224 and the retainer ring 232 may be received by allowing the side wall face of the former to contact the side wall face of the latter, the torque around the axis line is received only by the diaphragm 222.

The torque applied to the diaphragm 222 during the polishing work is unstable since it is caused by the frictional force, sometimes exceeding the strength limit of the diaphragm 222 to damage the diaphragm 222 made of a thin material. Since the frictional force caused by polishing, and the torque applied to the diaphragm 222 increase in response to the increase of the force for pressing the wafer W to the polishing pad 202 and increase of polishing rate, the pressing force and polishing rate is limited for preventing the diaphragm 222 from being damaged. Therefore, the polishing efficiency (polishing turns per unit time), precision of the polished face, and uniformity limit are determined by the limitations of the polishing conditions as described above.

Although increasing the strength of the diaphragm 222 by using a thicker material may be contemplated as a countermeasure for the foregoing problems, surface rigidity of the diaphragm will be inevitably increased to deteriorate trailing property of the carrier 224 along the axis line direction, thereby adversely affecting planarity and uniformity of the polished face.

When the wafer is polished using the wafer polishing apparatus 200 as hitherto described, whether the polished face of the wafer W has attained a desired conditions (detection of the end point of polishing, or end of the process) or not has been judged by observing, for example, fluctuations of the rotational power of the platen driving mechanism 206. That is, when polishing of the wafer W is insufficient, the frictional force acting between the polishing pad 202 and the wafer W is not stabilized to cause fluctuation, while the frictional force is stabilized when the wafer W is polished to a desired polished face. Since the platen 203 is allowed to rotate at a constant speed, the rotational powder of the platen driving mechanism 206 increases, for example, when the polishing resistance is large, and decreases when the polishing resistance is small. The polished face of the wafer W is judged to be in a desired state when the observed values obtained by observing the rotational power of the platen driving mechanism 206 has been stabilized.

However, the polishing end point (the end of the process) can not be individually detected for the plural wafer holding heads 201 merely by observing the fluctuation of the rotational power of the platen driving mechanism 206, thereby causing the problems of excess polishing and insufficient polishing of the wafer W, or mixing of excessively polished wafers and insufficiently polished wafers.

The platen 203 is often allowed to idle without making the wafer W to contact the polishing pad 202. When the wafer comprises a substance having intrinsically a small frictional resistance, fluctuation of the rotational power of the platen driving mechanism 206 between the states when the wafer W is on the way of polishing and when polishing has been completed becomes so small that the fluctuation can not be distinguished from idling components of the platen 203.

While a method for detecting the rotational power of respective wafer holding heads 201 for detecting the polishing end point may be contemplated, the method has so poor response that it was impossible to accurately detect the force acting on the wafer W. Since the force detected by the method above contains the frictional force acting on the contact portions between the portions of the wafer holding head 201 not holding the wafer W and the polishing pad 202, it was impossible to accurately detect the polishing end point.

The polishing pad 202 is deteriorated by polishing the wafer W. While a dressing treatment is applied to the deteriorated polishing pad 202, it is difficult to judge whether the dressing treatment should be applied or not during polishing of the wafer. Consequently, the timing for practically applying the dressing treatment has been determined to be a prescribed time interval (for example, after polishing a set of wafers), irrespective of the longer polishing time or shorter polishing time. Accordingly, polishing of the wafer is forced to halt for applying the dressing treatment even when the polishing pad 202 has not been deteriorated, thereby resulting in a poor work efficiency.

The polishing resistance acting on the wafer W gradually increases as the polishing pad 202 is deteriorated in some cases. When the difference of the polishing resistance changes between the state during polishing and the state when polishing has been completed is small, for example when the polishing end point is determined by the state when roughness on one layer (for example, an oxide film layer or an insulation layer) has been removed, the change can not be distinguished from the polishing resistance change due to deterioration of the polishing pad 202, making it difficult to detect the accurate polishing end point from fluctuation of the rotational power of the platen driving mechanism 206.

The force detected as described above contains the frictional force acting on the contact portions between the wafer holding head 201 not holding the wafer W, and the polishing pad 202, as well as the frictional force acting on the wafer W. Therefore, it was impossible to accurately detect the polishing end point when the frictional force changes due to deterioration of the polishing pad 202.

FIG. 33 illustrates an enlarged perspective view of the main part of the wafer polishing apparatus in an another example. In the wafer polishing apparatus 241 shown in FIG. 33, a polishing pad 244 comprising, for example, hard polyurethane is provided on a disk shaped rotation table 243 (a platen) attached to the center axis 242, and a wafer holding head 245 capable of revolving is disposed, with its face in opposed relation to the polishing pad 244, at the eccentric position to the center axis 242.

The wafer holding head 245 is approximately formed to be a disk shape having a smaller diameter than that of the polishing pad 244, and the wafer W is held at the lower part, or at the tip, of the head, to allow the wafer to come in contact with the polishing pad 244 while the upper end of the head is supported with an arm (not shown).

A fluidized slurry SL of an abrasive is fed on the polishing pad 244 when the wafer W is polished, and the slurry SL flows between the wafer W held with the wafer holding head 245 and the polishing pad 244. Since the wafer W held with the wafer holding head 245 rotates while the polishing pad 244 simultaneously revolves around the center axis 242, one face of the wafer W is polished with the polishing pad 244.

The slurry SL invades into the wafer holding head in the wafer polishing apparatus using the CMP method. The slurry penetrating into the wafer holding head is dried while polishing is continued, or is degraded by the heat of abrasion generated during polishing, thereby the slurry forms an aggregate or a gel, or is converted into a solid or a semi-solid. When the solid or semi-solid formed as described above flows out from the wafer holding head onto the polishing pad 244 (202), the solid or semisolid causes damages on the surface of the wafer W. Accordingly, a cleaning device such as a shower was used for enabling the wafer holding head to be cleaned, or a wafer holding head 245a capable of cleaning from the inside of the head (see the front cross section in FIG. 34) was used in the related art.

The wafer holding head 245a is provided with a head body 252 comprising a top plate 253 and a cylindrical circumference wall 254 provided below the outer circumference of the top plate 253, a diaphragm 255 vertically expanded to the head axis in the head body 252, a pressure adjusting mechanism 271 for adjusting the pressure (for example, air pressure) in a fluid chamber 264 formed between the diaphragm 255 and the head body 252, a carrier 256 fixed at the diaphragm 255 and provided so as to be able to displace along the direction of the head axis together with the diaphragm 255, and a retainer ring 257, which is provided so as to be able to displace along the head axis direction, provided so as to be positioned between the outer circumference face of the carrier 256 and the inner wall face of the head body 252. The carrier 256 is provided to hold the wafer face to be polished, and the retainer ring 257 is provided to lock the wafer W by contacting the polishing pad 244 (202) during polishing.

A pure water tube 262 as a device for cleaning the wafer holding head 245a is provided in the head body 252. The pure water tube 262 is coupled with a pure water feed tank 272 via a water-supply hose 272a, which leads pure water supplied from the pure water feed tank 272 to the lower part of the head body 252 to allow the water to spout among the head body 252, the carrier 256 and the retainer ring 257. The pressure adjusting mechanism 271 is provided for controlling the pressure, for allowing the wafer W held by the carrier 256 to contact the polishing pad 242 (202), within an appropriate range suitable for polishing, by adjusting the force for displacing the carrier 256, which displaces in response to the pressure in the fluid chamber 264, or together with the diaphragm 255, along the head axis direction.

However, the water supply hose 272a should be detached from the coupling port 262a of the pure water tube 262, in order to allow the wafer holding head 245a to rotate during polishing of the wafer W. Accordingly, the wafer polishing apparatus is forced to be on alert for every cleaning work of the wafer holding head 245a, and currently the water supply hose 272a is manually attached and detached.

Cleaning of the wafer holding head 245a is actually takes much time as described above, forcing the wafer polishing apparatus to be on alert during the cleaning work. Therefore, the wafer holding head 245a has been cleaned after completing the daily polishing work, not to adversely affect the work efficiency of wafer cleaning. However, the foregoing procedure brings about a cleaning work after solids or semi-solids have been formed by aggregation or gelation of the slurry SL. Once such solids or semi-solids have been formed, they can hardly removed by cleaning, and the remaining solids or semi-solids inevitably flow on the polishing pad 242 (202) in the succeeding polishing work.

When the wafer holding head is cleaned with a cleaning apparatus such as a shower, the slurry SL by any means remains in the wafer holding head, because the cleaning operation is applied from the outside of the head.

In addition, the wafer holding head 245a is heated by the heat of friction generated by polishing the wafer W, which adversely affect chemical reactions between the slurry SL and the wafer W to make it difficult to maintain an ideal condition for polishing the wafer W. Also, since the carrier 256, the wafer W and other members are subjected to heat-deformation, it is currently difficult to maintain machining accuracy of the wafer W.

SUMMARY OF THE INVENTION

Accordingly, the object of the present invention is to provide a wafer polishing apparatus that allows the loading torque limit to be increased without adversely affecting trailing ability of the wafer along the vertical direction, besides improving polishing efficiency and uniformity of the polished face, and a method for manufacturing the wafer using the apparatus as described above.

For attaining the foregoing object, the wafer polishing apparatus according to the present invention, or a polishing apparatus of a semiconductor wafer, comprises a platen on the surface of which a polishing pad is affixed, a wafer holding head for holding one face of the wafer to be polished and for allowing the other face of the wafer to contact the polishing pad, and a head driving mechanism for polishing the other face of the wafer by allowing the wafer holding head to drive, the wafer holding head comprising: a head body; a diaphragm substantially vertically expanded to a head axis in the head body; a fluid chamber formed between the diaphragm and the head body; a pressure adjusting mechanism for controlling the pressure of the fluid filled in the fluid chamber; a disk shaped carrier, which holds one face of the wafer to be polished, fixed to the diaphragm to displace along the head axis direction together with the diaphragm; a retainer ring that is disposed in concentric relation to the circumference of the carrier, is fixed to the diaphragm to displace along the head axis direction together with the diaphragm, and comes in contact with the polishing pad during polishing; and at least a pair of guide members, at least one of which is fixed to the head body, and the other of which is fixed to at least one of the carrier and the retainer to engage with each other, wherein the guide member is freely slidable along the head axis direction at the engaging part, and displacement is limited along the direction of rotation.

According to the wafer polishing apparatus of the present invention, a pair of the guide members receive the torque acting on the carrier around the axis by the frictional force of polishing. Accordingly, shear stress of the diaphragm is considerably reduced to prevent the diaphragm from being broken even when the diaphragm is made of a thin film. Since the pair of the guide members are freely slidable along the head axis direction, the sliding movement never compromises trailing ability of the carrier along the axis direction.

The wafer polishing apparatus as described above is used in the wafer polishing step in the method for manufacturing the wafer according to the present invention, wherein the wafer is polished by controlling the pressure in the fluid chamber, rotation speed of the platen, and driving speed of the head driving mechanism.

According to the method for manufacturing the wafer in the present invention, it was made possible to apply a wafer pressing condition or a wafer polishing speed, which have been impossible to apply for preventing the diaphragm from being damaged. Consequently, production efficiency of the wafer can be improved as a result of improvement of polishing efficiency, while improving uniformity of the polished surface of the wafer.

An another object of the present invention is to provide a wafer polishing apparatus and a method for manufacturing the wafer that can certainly detect the completed polishing state of the wafer.

For attaining the above object, the wafer polishing apparatus according to the present invention comprises a platen on the surface of which a polishing pad is adhered, and a wafer holding head for holding one face of the wafer to be polished and for allowing the other face of the wafer to contact the polishing pad, the wafer being polished with the polishing pad by a relative movement between the wafer holding head and the platen, wherein the wafer holding head is supported in a freely rotatable manner in the horizontal plane by a spindle coupled with the upper part of the head, and wherein a sensor for detecting the force acting on the wafer is provided at one face of the coupling part between the spindle and the wafer holding head.

According to the wafer polishing apparatus in the present invention, providing a sensor at the coupling portion between the spindle and the wafer holding apparatus allows the force acting on the wafers held on respective wafer holding heads to be observed, even when the apparatus is equipped with a plurality of wafer holding heads.

Accordingly, the wafer polishing end point can be securely detected without causing excess polishing or insufficient polishing of the wafer. Providing the sensors on respective wafer holding heads is not needed since a sensor is attached at the spindle side, thus enabling the number of available sensors to be saved.

Also, the present invention provides a method for manufacturing a wafer provided with a platen on the surface of which a polishing pad is adhered, and a wafer holding head for holding one face of the wafer to be polished and for allowing the other face of the wafer to contact the polishing pad, the method comprising a polishing step for polishing the wafer with the polishing pad by a relative movement between the wafer holding head and the platen, wherein the wafer holding head is supported in a freely rotatable manner in the horizontal plane by a spindle at the upper part of the head, and wherein a sensor for detecting the force acting on the wafer during polishing is provided at one face of the coupling part between the spindle and the wafer holding head, the polishing work being continued by detecting the polishing state of the wafer based on the observation result with the sensor.

According to the method for manufacturing the wafer in the present invention, polishing may be continued while securely observing the force acting on the wafer, even when a plurality of the wafer holding heads are provided. Consequently, the wafer in excess polishing and insufficient polishing may be prevented from being manufactured to practically manufacture the wafer with good efficiency.

The other object of the present invention is to provide a wafer polishing apparatus and a method for manufacturing the wafer that can certainly detect the polishing state and the completed polishing state of the wafer.

For attaining the above object, the wafer polishing apparatus according to the present invention is provided with a platen on the surface of which a polishing pad is adhered, and a wafer holding head for holding the wafer to be polished and for allowing one face of the wafer to contact the polishing pad, wherein the wafer is polished with the polishing pad by allowing the wafer holding head and the platen to individually rotate, the wafer holding head comprising: a head body comprising a top plate and a peripheral wall face provided below the circumference of the top plate; a diaphragm substantially vertically expanded to a head axis in the head body; a pressure adjusting mechanism for adjusting the pressure of the fluid filled in the fluid chamber formed between the diaphragm and the head body; a carrier, which is provided for holding one face of the wafer to be polished, fixed to the diaphragm so as to be able to displace along the head axis direction together with the diaphragm; a retainer ring, which is disposed in concentric relation between the inner wall of the peripheral wall and the outer circumference of the carrier, fixed to the diaphragm and disposed so as to be able to displace along the head axis direction together with the diaphragm; a plurality of carrier torque transfer mechanisms provided along the circumference direction between the head body and the carrier for communicating the torque of the head body to the carrier; a plurality of first sensors provided at each torque transfer mechanism for observing the force acting on the wafer along the direction of rotation; and an processor connected to individual first sensors for calculating the force acting on the wafer based on the output from these first sensor.

According to the wafer polishing apparatus in the present invention, providing a carrier torque transfer mechanism on the top face of the carrier allows the torque acting on the head body to be accurately transferred even in the construction providing a diaphragm as an elastic member, besides allowing the diaphragm to be free from excess force along the direction of rotation, thus preventing the diaphragm from being deteriorated. Also, providing a first sensor on the carrier torque transfer mechanism allows the force acting on the wafer may be directly observed with the first sensor via the carrier. Therefore, the torque may be accurately detected even when the portions not holding the wafer such as the retainer ring comes in contact with the polishing pad. The processor calculates the force acting on the wafer based on the output from a plurality of first sensors.

The present invention also provides a method for manufacturing the wafer provided with a platen on the surface of which a polishing pad is adhered, and a wafer holding head for allowing one face of the wafer to contact the polishing pad by holding the wafer to be polished, comprising a polishing step for polishing the wafer with the polishing pad by allowing the wafer holding head and the platen to individually rotate, the wafer holding head comprising: a head body comprising a top plate and a cylindrical circumference wall provided downward the outer circumference of the top plate; a diaphragm substantially vertically expanded to a head axis in the head body; a pressure adjusting mechanism for adjusting the pressure of a fluid filled in a fluid chamber formed between the diaphragm and the head body; a carrier, which is fixed to the diaphragm and provided so as to be able to displace along the head axis direction together with the diaphragm, for holding one face of the wafer to be polished; a retainer ring which is disposed in concentric relation between the inner wall of the peripheral wall and the outer circumference of the carrier, fixed to the diaphragm, disposed so as to be able to displace along the head axis direction together with the diaphragm, and comes in contact with the polishing pad during polishing; a plurality of carrier torque transfer mechanisms provided along the circumference direction between the head body and the carrier for communicating the torque of the head body to the carrier; a plurality of first sensors provided at each torque transfer mechanism for observing the force acting on the wafer along the direction of rotation; and a processor connected to individual first sensors for calculating the force acting on the wafer based on the output from these first sensor, wherein the wafer held on the wafer holding head is allowed to rotate while allowing the wafer to contact the polishing pad, wherein the force acting on the wafer is calculated with the processor based on the output from each first sensor, and wherein the wafer is polished while judging the polishing state of the wafer based on the output from the processor.

According to the method for manufacturing the wafer in the present invention, the force acting on the wafer is directly observed with the first sensor provided on the top face of the carrier, and the polishing state of the wafer is judged based on the output from the first sensor. Accordingly, possibilities of generating the wafers in excess polishing or insufficient polishing is diminished to realize steady polishing of the wafer.

A different object of the present invention is to provide a wafer polishing apparatus and a method for manufacturing the wafer that can easily recognize the deteriorated state of the polishing pad, besides constantly detect the polishing state and completed polishing state of the wafer.

For attaining the above problem, the present invention provides a wafer polishing apparatus provided with a platen on the surface of which a polishing pad is adhered, and a wafer holding head for allowing one face of the wafer to contact the polishing pad by holding the wafer to be polished, the wafer being polished with the polishing pad by allowing the wafer holding head and the platen to individually rotate, the wafer holding head comprising: a head body comprising a top plate and a cylindrical circumference wall provided downward the outer circumference of the top plate; a diaphragm substantially vertically expanded to a head axis in the head body; a pressure adjusting mechanism for adjusting the pressure of a fluid filled in a fluid chamber formed between the diaphragm and the head body; a carrier, which is fixed to the diaphragm and provided so as to be able to displace along the head axis direction together with the diaphragm, for holding one face of the wafer to be polished; a retainer ring which is disposed in concentric relation between the inner wall of the peripheral wall and the outer circumference of the carrier, fixed to the diaphragm, disposed so as to be able to displace along the head axis direction together with the diaphragm, and comes in contact with the polishing pad during polishing; a plurality of carrier torque transfer mechanisms provided along the circumference direction between the head body and the carrier for communicating the torque of the head body to the carrier; a plurality of second sensors provided at each torque transfer mechanism for observing the force acting on the retainer ring along the direction of rotation; and a processor connected to individual second sensors for calculating the force acting on the retainer ring based on the output from these second sensors.

According to the wafer polishing apparatus in the present invention, a sensor is provided in the ring torque transfer mechanism provided on the upper face of the retainer ring to directly detect the force acting on the retainer ring being in contact with the polishing pad, thereby allowing deterioration of the pad to be securely detected, besides improving work efficiency by detecting the surface state of the polishing pad while polishing the wafer. The diaphragm is also prevented from being deteriorated in the construction provided with an elastic diaphragm, since the torque acting on the head body is accurately transferred to the head body via the ring torque transfer mechanism thereby to allow the diaphragm to be free from excess force along the direction of rotation.

The present invention also provides a method for manufacturing a wafer provided with a platen on the surface of which a polishing pad is adhered, and a wafer holding head for allowing one face of the wafer to contact the polishing pad by holding the wafer to be polished, comprising a polishing step for polishing the wafer with the polishing pad by allowing the wafer holding head and the platen to individually rotate, the wafer holding head comprising: a head body comprising a top plate and a cylindrical circumference wall provided downward the outer circumference of the top plate; a diaphragm substantially vertically expanded to a head axis in the head body; a pressure adjusting mechanism for controlling the pressure of a fluid filled in a fluid chamber formed between the diaphragm and the head body; a carrier, which is fixed to the diaphragm and provided so as to be able to displace along the head axis direction together with the diaphragm, for holding one face of the wafer to be polished; a retainer ring which is disposed in concentric relation between the inner wall of the peripheral wall and the outer circumference of the carrier, fixed to the diaphragm, disposed so as to be able to displace along the head axis direction together with the diaphragm, and comes in contact with the polishing pad during polishing; a plurality of carrier torque transfer mechanisms provided along the circumference direction between the head body and the carrier for communicating the torque of the head body to the carrier; a plurality of ring torque transfer mechanism provided between the head body and the retainer ring along the circumference direction for communicating the torque acting on the head body to the retainer ring; a plurality of first sensors provided at each torque transfer mechanism for observing the force acting on the carrier along the direction of rotation; and a plurality of second sensors provided at each ring torque transfer mechanism for observing the force acting on the retainer ring along the direction of rotation, wherein detected signals of the first sensor are corrected based on the output signal of the second sensor, and wherein the wafer is polished while detecting the force acting on the wafer based on the corrected values.

According to the method for manufacturing the wafer in the present invention, the rate of change of polishing resistance ascribed to deterioration of the polishing pad is detected by sensing the force acting on the retainer ring, as well as the force acting on the wafer held on the carrier. The polishing state is accurately recognized and the polishing end point is detected by correcting the force acting on the wafer based on the rate of change of polishing resistance ascribed to deterioration of the polishing pad.

A further different object of the present invention is to provides a wafer holding head being easy for cleaning the head. It is also an object to provide a wafer holding head that is able to improve machining accuracy of the wafer.

For attaining the above objects, the present invention provides a wafer holding head to be used in a polishing apparatus, by which a wafer is polished by allowing a platen and the wafer to relatively travel while allowing one face of the wafer to be polished to contact the platen on the surface of which a polishing pad is adhered, for allowing the wafer to contact the polishing pad by holding the wafer, comprising: a head body comprising a top plate and a cylindrical circumference wall provided downward the outer circumference of the top plate; a diaphragm substantially vertically expanded to the head axis in the head body; a fluid feed mechanism for supplying a fluid in a fluid chamber formed between the diaphragm and the head body for adjusting the pressure in the fluid chamber; and a carrier, which is fixed to the diaphragm and provided so as to be able to displace along the head axis direction together with the diaphragm, for folding one face of the wafer, wherein the fluid feed mechanism supplies both a gas and a cleaning liquid as the fluid; wherein the head body has a cleaning solution tube for guiding the cleaning liquid from the liquid chamber to the tip of the head, and wherein a valve for operably open and close with a controller is provided in the cleaning solution tube.

According to the wafer holding head in the present invention, the cleaning liquid supplied to the fluid chamber with the fluid feed mechanism is guided to the tip of the head through the cleaning liquid tube, and is used for cleaning the wafer holding head. Consequently, the work time for attaching and detaching the water supply hose to the head body may be saved, the cleaning work of the wafer holding head is promptly achieved, and decrease of the work efficiency of the cleaning mechanism due to the cleaning work may be avoided, thereby making it possible to clean the wafer holding head at any suitable time, irrespective of the time when polishing of the wafer has been completed.

Since a gas and a cleaning liquid is used together as the fluid fed to the fluid feed chamber, the advantageous property of the gas that readily changes its volume in response to external pressure allows flexible displacement of the diaphragm while maintaining good trailing property against fluctuation of the contact pressure of the polishing pad with the wafer. In addition, the heat generated in the wafer holding head is absorbed by the cleaning liquid having considerably large heat capacity as compared with the gas, making it possible to increase the heat capacity of the wafer holding head. Since temperature increase of the wafer holding head caused by the heat of friction by polishing is suppressed, and the chemical reaction between the slurry and the wafer is moderated, machining accuracy of the wafer is improved in a nearly ideal condition for polishing the wafer. Machining accuracy of the wafer and other members further improved by suppressing heat deformation.

BRIEF DESCRIPTION OF THE DRAWINGS

FIG. 13-A1 shows cross sections indicating the layer construction of the wafer.

FIG. 13-B1 shows cross sections indicating the layer construction of the wafer.

FIG. 13-A2 shows a graph describing the result of output of the spindle sensor when the wafer is polished.

FIG. 13-B2 shows a graph describing the result of output of the spindle sensor when the wafer is polished.

FIG. 31 shows a front cross section of one example of the wafer polishing apparatus in the related art.

DESCRIPTION OF THE PREFERRED EMBODIMENT

Figure 1:
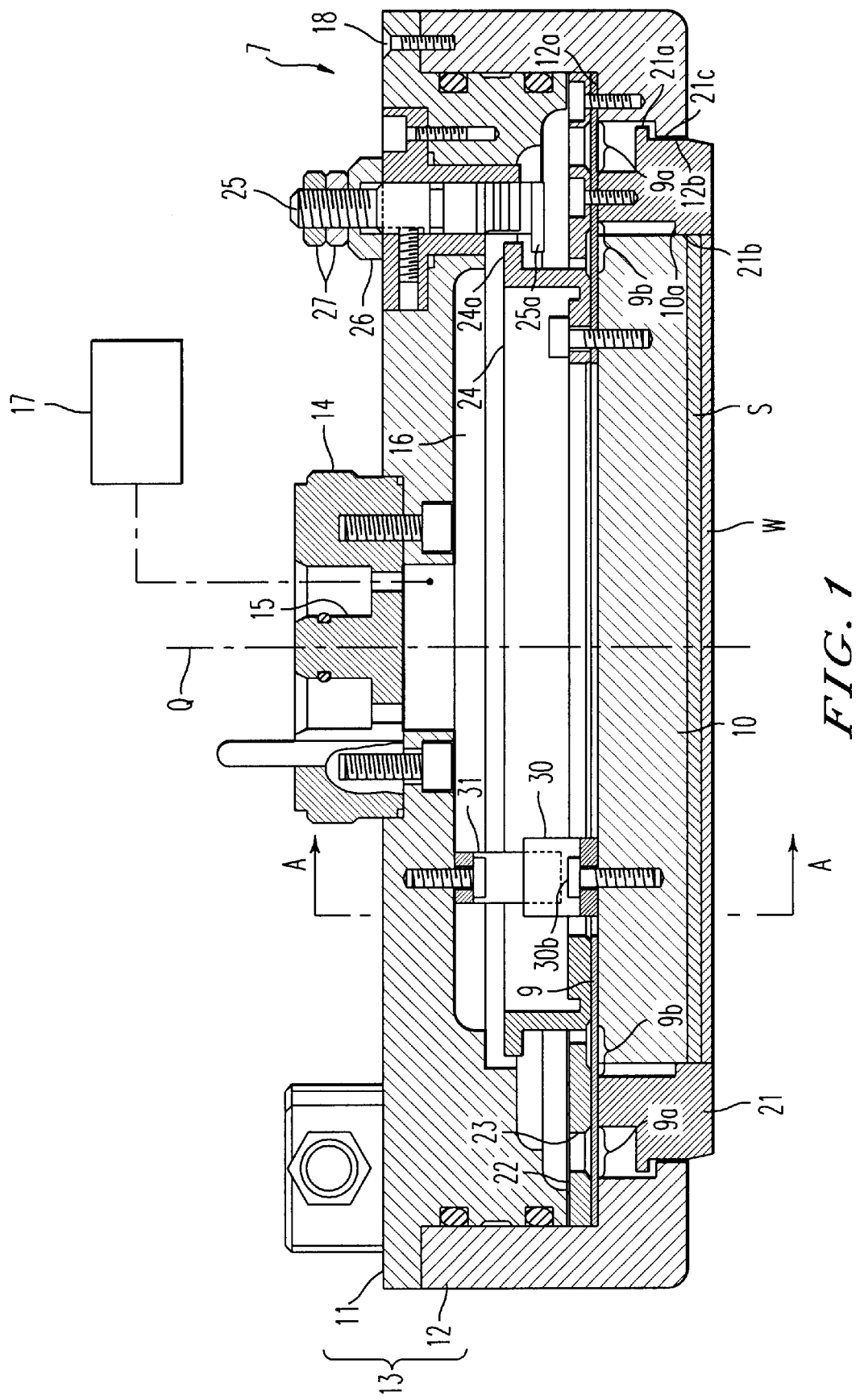
FIG. 1 shows a cross section of the head body of the wafer polishing apparatus according to the first embodiment of the present invention.

The wafer polishing apparatus and the method for manufacturing the wafer according to the present invention will be described hereinafter with reference to the drawings.

FIGS. 1 to 4 show the first embodiment of the wafer polishing apparatus according to the present invention. The overall construction will be described at first with reference to FIG. 3. The reference numeral 1 in the drawing denotes a base, and a ring-shaped platen 2 is horizontally placed at the center of the base 1. The platen 2 is allowed to rotate around the axis line P with a platen driving mechanism provided in the base 1, and a polishing pad 3 is adhered on the entire surface of the platen.

Figure 4:
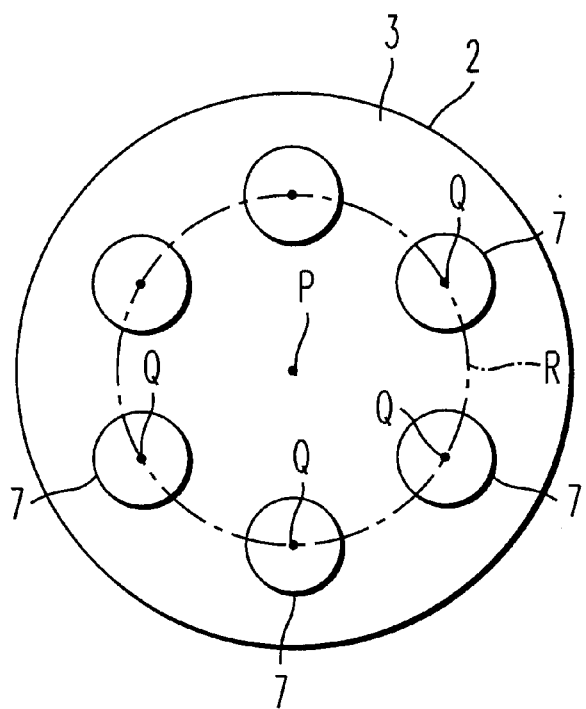
FIG. 4 shows a plane view showing the disposition of the wafer holding head and the platen in the apparatus shown in FIG. 3.

A plurality of guide posts 4 are disposed on the upper face of the base 1, and an upper mounting plate 5 is provided so as to be able to ascend and descend along the guide posts 4 while horizontally maintaining the plate face. The upper mounting plate 5 ascends for mounting and dismounting a wafer W, and the plate descends for the polishing operation. A disk-shaped carousel (a head driving mechanism) 6 is disposed on the bottom face of the upper mounting plate 5, and a driving mechanism is coupled with the carousel 6 to allow the carousel to rotate around the axis line P. The rotation axis may be shifted from the axis line P to be non-coaxial with the platen 2, which allows the polishing pad 3 to be more extensively used. In total of six units of the wafer holding heads 7 are provided on the carousel 6 in a opposed relation to the platen 2. Each wafer holding heads 7 utilizes the axis line Q as a center of rotation, and these axis lines Q are disposed at every angles of 60 degree on the circle R centered at the axis line P. The relative disposition of the polishing pads 3 and the wafer holding heads 7 is shown in FIG. 4. Each wafer holding head 7 rotates around the axis line P by rotation of the carousel 6, and revolves around the axis line Q by a gear mechanism equipped inside of the carousel 6. While the number of the wafer holding heads 7 is six units in this embodiment, it is not limited thereto.

The wafer holding head 7 according to the present embodiment will be described with reference to FIG. 1. The wafer holding head 7 comprises a hollow head 13 vertically disposed to the axis line Q and having a lower end opening, a diaphragm 9 expanded inside of the head 13, a carrier 10 fixed to the lower face of the diaphragm 9, and a retainer ring 21 disposed outside of the carrier 10 in concentric relation to the carousel.

The head body 13 is composed of a disk-shaped top plate 11, and a cylindrical circumference wall 12 coupled with the circumference of the top plate 11, which is coupled with a spindle of the carousel 6 via a shaft 14. The circumference wall 12 has a shelf-like diaphragm mounting member 12a, which radially protrude inward over the entire circumference, in the vicinity of its lower end. Stoppers 12b, likewise radially protruding inward, are also provided below the diaphragm mounting member. The ring-shaped periphery of the diaphragm 9 is mounted on the diaphragm mounting member 12a, and the diaphragm is fixed with a fixing ring 22. The diaphragm 9 is made of an elastic material such as various kinds of rubbers or a thin metal plate.

Although the diaphragm 9 in this embodiment is ring-shaped, the carrier 10 is mounted on the lower face of the diaphragm to block the center of the diaphragm, forming a fluid chamber 16 together with the top plate 11 and the circumference wall 12. A flow path 15 is formed, on the other hand, in the shaft 14, and the flow path is coupled with a pressure adjusting mechanism 17. The pressing force of the carrier 10 to the polishing pad 3 is controlled by changing the fluid pressure in the fluid chamber 16 via the diaphragm 9. While air is usually sufficient for use, other gases may be used, if necessary.

A retainer ring 21 is disposed with a slight gap from the inside of the inner circumference face of the stopper 12b at the lower end of the circumference wall 12. The retainer ring 21 assumes a ring shape, and is fixed to the diaphragm 9 using a fixing ring 23. This configuration allows the retainer ring 21 to be able to displace relative to the head body 13 along the axis line Q. The carrier 10 is disposed with a slight gap at the inside of the inner circumference face 21b at the lower end of the retainer ring 21. A radially protruding flange 21a is formed at the periphery of the retainer ring. When the wafer holding head 7 is pulled up together with the carousel 6 from the platen 2, the flange 21a is supported with the stopper 12b formed at the lower end of the circumference wall 12.

The carrier 10 formed into a disk shape having a given thickness using a highly rigid material such as a ceramic. The carrier 10, which is radially disposed inward of the retainer ring 21, is fixed on the diaphragm 9 with plural bolts using a carrier fixing ring 24. This configuration allows the carrier 10 to be able to displace along the axis line direction Q independently from the retainer ring 21. A flange 24a spread outward is formed at the upper end of the carrier fixing ring 24, and this flange 24a is supported with a stopper 25a of a stopper bolt 25 when the head is ascending to receive the weight of the carrier 10. The length of the stopper bolt is adjustable using a spacer 26 and double nuts 27.

A guide member 30 (a guiding part) is attached on the upper face of the carrier 10 with bolts 30b in this embodiment. The other guide member 31 (a guide part) that pairs the former guide member 30 is also attached to the top plate 11 of the head body 13 using bolts 31b (the construction is not necessarily limited thereto, but the guide member 31 may be mounted on the upper face of the carrier 10, and the guide member 30 may be mounted on the top plate 11 of the head body 13). The detailed cross section of these paired guide members 30 and 31 is shown in FIG. 2. Two U-shaped planes in opposed relation with each other serve as guide faces 30a in the guide member 30. In the guide member 31, on the other hand, two flat faces serve as guide faces 31a. The distance D between the guide faces 30a of the guide member 30 in opposed relation with each other is adjusted to be slightly larger than the plate thickness Th of the guide member 31. Accordingly, the paired guide members 30 and 31 engage with each other with a slight gap distance. Although displacement of the carrier 10 along the axis line Q is not restricted by this configuration, rotation around the axis line Q (displacement along the direction of rotation of the head) is restricted. Since the guide members 30 and 31 are slidable with each other, a hard material such as a metal is suitable for the material, and it is desirable to apply a polishing finish, if required, to the guide faces 30a and 31a for reducing frictional resistance. A lubricant may be additionally coated on the guide faces 30a and 31a.

Figure 2A:
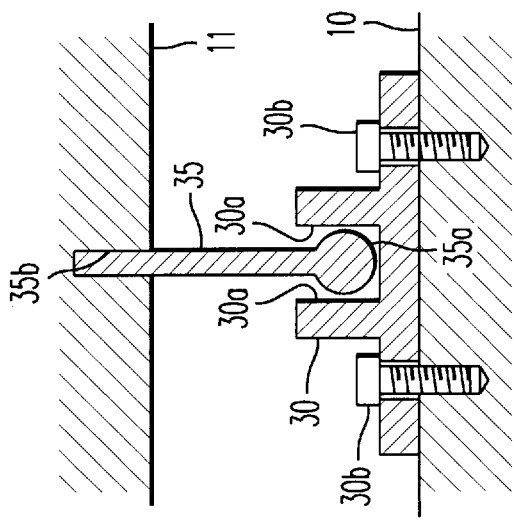
FIG. 2A shows a cross section viewed along the line A—A in FIG. 1, showing a detailed construction of the guide member in the first embodiment.
Figure 2B:
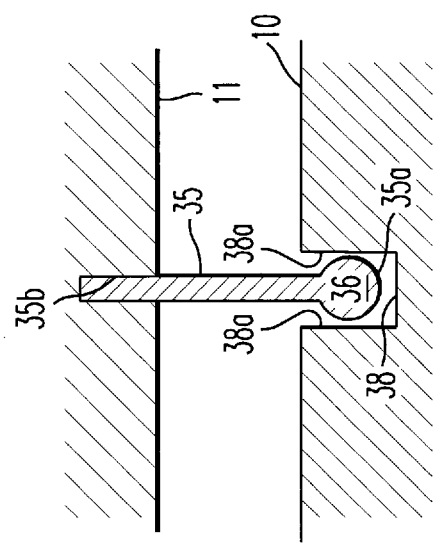
FIG. 2B shows a cross section viewed along the line A—A in FIG. 1, showing a detailed construction of the guide member in the first embodiment.

A guide member 35 as shown in, for example, FIG. 2B may be used in place of the guide member 31. The guide member 35 is a rod-shaped member having a spherical part 36 at the tip, and serves as a guide face 35a by allowing the surface of the spherical part 36 to contact the guide face 30a of the guide member 30. The guide members 30 is prevented from contacting the guide member 35 at one side even when the axis line of the carrier 10 has shifted from the axis line of the head body 13, thereby hardly disturbing displacement of the carrier 10 along the axis line Q, by forming the guide face 35a to be spherical. The guide member 35 is mounted by inserting its bridge support into the insertion hole 35b provided on the member, either the carrier 10 or the head body 13, that is destined to provide the guide member 31.

Figure 2C:
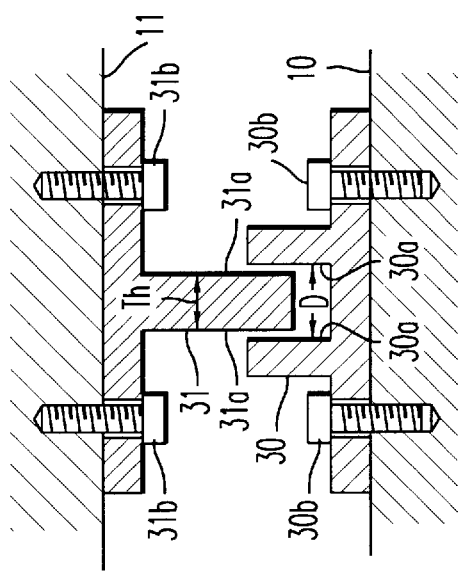
FIG. 2C shows a cross section viewed along the line A—A in FIG. 1, showing a detailed construction of the guide member in the first embodiment.

As shown in FIG. 2C, a groove that expands along the direction parallel to the plane passing through the axis line Q may be formed to serve as a guide member 37, and the inner face of the groove along the direction of rotation of the head may serve as a guide face 37a to engage with the guide member 31, instead of providing the guide member 30 on the member, either the carrier 10 or the head body 13, that is destined to provide the guide member 30.

Figure 2D:
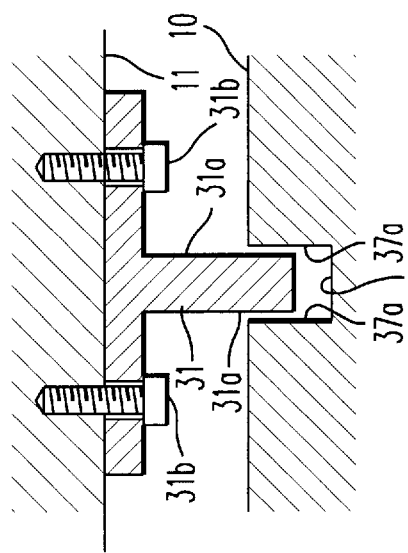
FIG. 2D shows a cross section viewed along the line A—A in FIG. 1, showing a detailed construction of the guide member in the first embodiment.
Figure 3:
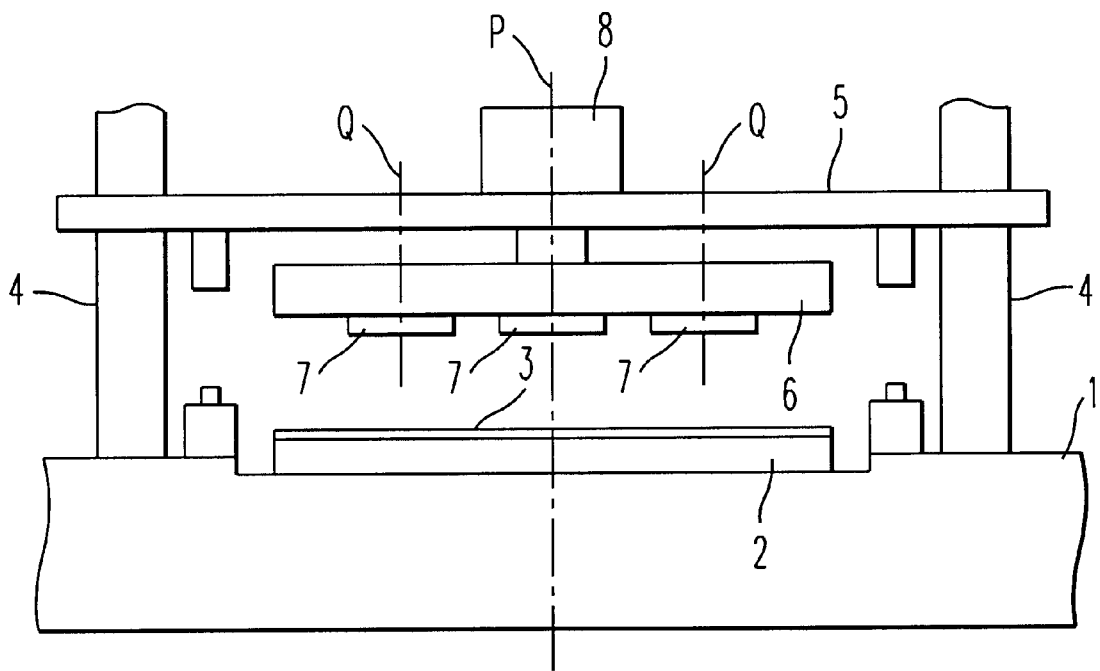
FIG. 3 shows a front view of the main part of the wafer polishing apparatus according to the first embodiment of the present invention.

Also, as shown in FIG. 2D, a round hole may be formed to serve as a guide member 38, and the inner face of the guide member 38 may serve as a guide face 38a that engages the guide face 35a of the guide member 35 by using the guide member 35 in place of the guide member 31.

For mounting the guide member 30 on the carrier 10, two bolts are inserted through the guide member 30, and are screwed into the carrier 10. The guide member 31 is also mounted on the top plate 11 of the head body 13 by the same manner as described above by screwing two bolts 31b. Meanwhile, for exhibiting guide function as a original purpose of the guide members 30 and 31, it is important that orientation of the guide faces 30a and 31a are aligned after mounting. When the guide members 30 and 31 are individually fixed with two bolts, a rough aligning is possible. However, more precise alignment is made possible, if required, when knock pins are used between the guide member 30 and the carrier 10, and between the guide member 31 and the top plate 11, respectively.

Figure 5:
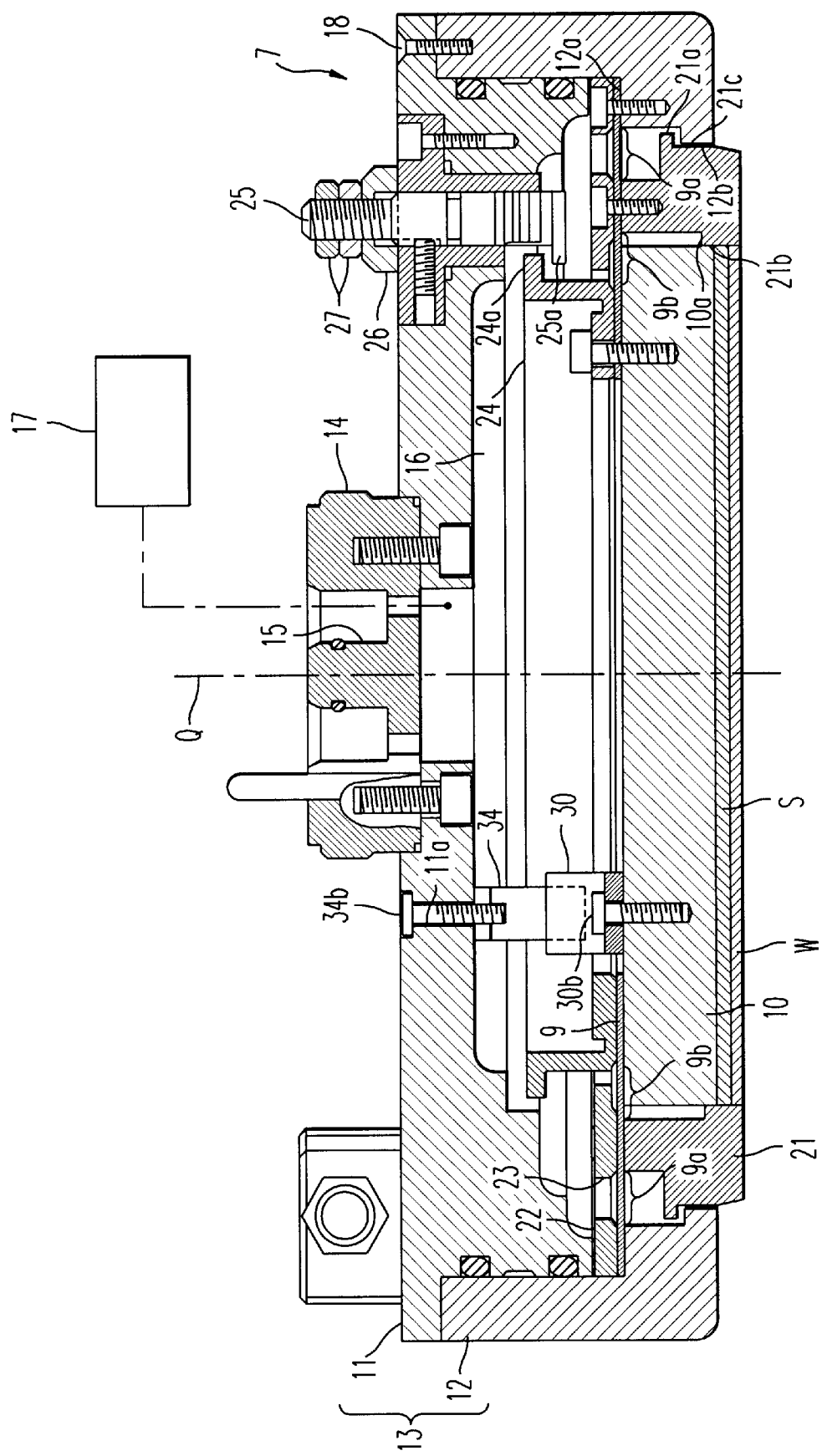
FIG. 5 shows a cross section showing the head body concerning mounting of the guide member to the top plate in the first embodiment.

FIG. 5 shows the mounting configuration when the upper guide member is composed of a guide member 34 having an internal thread. Two bolt insertion holes 11a are provided through the top plate 11 in this configuration, and the guide member 34 is fixed by screwing two bolts from upward of the top plate 11. For maintaining an air-tight structure of the fluid chamber 16, a required air-tight treatment is applied in the bolt insertion holes 11a and around the bolts 34b.

Assembling work of the wafer holding head 7 provided with such guide members 30 and 31 will be then described hereinafter. At first, the guide members 30 is mounted on the upper face of the carrier 10 with two bolts 30b at the side of the circumference wall 12 as described above. The retainer ring 21 is inserted from the upward of the retainer ring 21, and the flange 21a is placed on the stopper 12b, followed by mounting the diaphragm 9 on the diaphragm attachment parts 12a using the fixing ring 22. Subsequently, the retainer ring 21 is lifted to mount on the diaphragm 9 using the fixing ring 23. Then, the carrier 10, on which the guide member 30 has been mounted, is inserted into the retainer ring 21 from below and, after allowing it to contact the diaphragm 9, it is fixed with the carrier fixing ring 24. The guide member 31 is mounted on the bottom face of the top plate 11 with two bolts 31b at the top plate 11 side, followed by mounting the shaft 14 and stopper bolt 25. After assembling the circumference wall 12 side and the top plate 11 side as described above, the circumference wall 12 is fitted from below the top plate 11. The fitting work is carried out by taking care of engaging between the guide members 30 and 31. After completely fitting both guide members, the head is fixed with screws 18 to complete the assembling work.

Polishing works, the behavior around each wafer holding head, and the function of the guide members will be then described hereinafter. The wafer W is adhered on the bottom face of the carrier 10 via an insert S before the polishing work. The insert S is made of a water absorbing material, and absorbs the wafer W by surface tension upon absorption of moisture. Examples of the materials of the insert S include urethane foam with a preferable thickness of 0.6 mm to 0.8 mm. However, the insert S is not necessarily used in the present invention but, for example, the wafer W may be adhered by coating a wax on the bottom face of the carrier 10, or other adhering methods may be used.

Subsequently, the upper mounting plate 5 descends to allow the face of the wafer W to be polished to contact the polishing pad 3. The pressure in the fluid chamber 16 is controlled with the pressure adjusting mechanism 17 to adjust the pressing force of the wafer W to be a prescribed value. Polishing is continued thereafter by driving the carousel 6 and the platen 2 while feeding a polishing slurry on the surface of the polishing pad 3.

During the polishing work, the diaphragm 9 supports the carrier 10 and the retainer ring 21 in a floating manner, serving to maintain the pressing force of the wafer W to the polishing pad 3 to be always appropriate. A frictional force is always applied on the face to be polished, generating a shear stress on the flexible parts 9a and 9b of the diaphragm 9 due to horizontal force, caused by the frictional force, applied to the carrier 10 and the retainer ring 21. The components of the shear stress is largely categorized into two sorts, one is caused by the frictional torque accompanied by rotation of the wafer holding head 7 around the axis line Q, and the other is caused by the frictional force accompanied by rotation of the wafer holding head 7 around the axis line P and revolution of the platen 2 around the axis line P.

As hitherto described, the carrier 10 and the retainer ring 21, and the retainer ring 21 and the stopper 12b of the head body 13, respectively, are fitted with each other with a slight gap. Since the relative displacement between the carrier 10 and the retainer ring 21, or between the retainer ring 21 and the circumference wall 12 is minute, the latter of the foregoing two shear stresses, or the shear stress generated by the frictional force on the flexible parts 9a and 9b, turns out to be very small.

Problematic is the latter shear stress caused by the frictional torque around the axis line Q. Rotation of the carrier 10 and the retainer ring 21 around the axis line Q was not restricted in the conventional structure of the head. An excess shear force generates at the flexible parts 9a and 9b since the diaphragm received all the torque force generated by rotation around the axis line Q. However, because applied torque force generated by rotation around the axis line Q to the carrier 10 is received by the guide members 30 and 31 that engage with each other, the shear stress to the flexible parts 9a and 9b can be largely reduced. While the guide members are paired in FIG. 1, the torque is not only received by the guide members 30 and 31 in the strict senses, but is received by the side walls of the carrier 10, the retainer ring 21 and the stopper 12b.

As hitherto described, the diaphragm 9 is prevented from being damaged by the shear force during polishing in the polishing apparatus of the present embodiment, enabling to shorten the time required for exchange of the diaphragm and to reduce the cost of the diaphragm itself. The limiting pressure for pressing the wafer and the limiting polishing speed, which are determined for protecting the conventional diaphragm, can be increased to enable uniformity of the polished face and polishing efficiency to be improved. According to the method for manufacturing the wafer in the present embodiment, the wafer is polished under a wafer pressing condition or at a polishing speed, which have not been used for preventing the diaphragm from being damaged, in the polishing step in the process for manufacturing the wafer. Accordingly, polishing efficiency as well as productivity of the wafer are improved, besides improving uniformity of the polished surface of the wafer.

The guide members are not limited to be one pair as shown in FIG. 1, but a plurality of pairs may be provided. For example, when two pairs of the guide members are provided, the torque may be received merely by the guide members, which is advantageous for reducing the sliding friction along the direction of the head axis.

Figure 6:
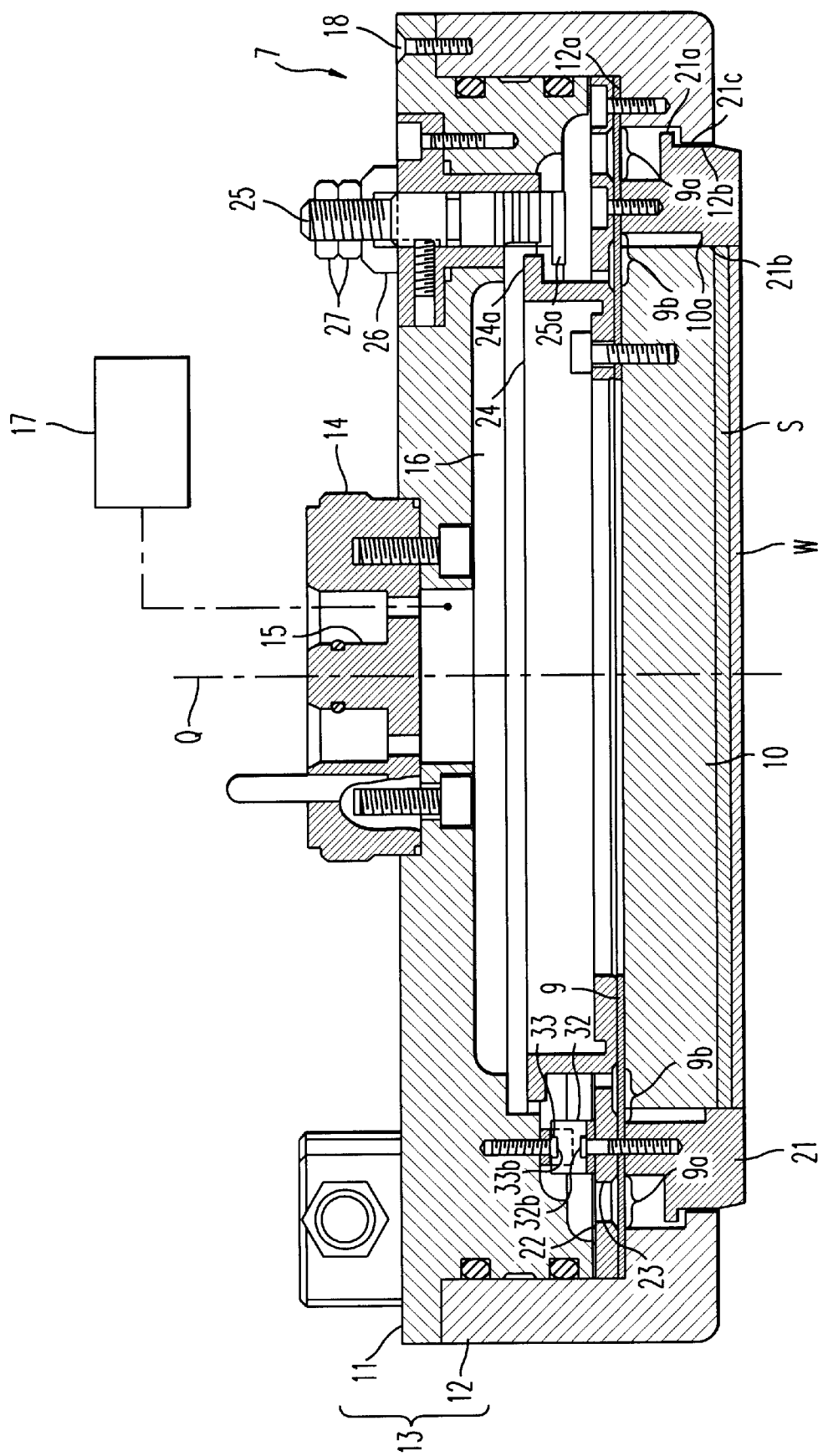
FIG. 6 shows a cross section of the head body showing an another example concerning the mounting position of the guide member in the first embodiment.

FIG. 6 shows an another embodiment concerning the method of mounting of the guide member. One guide member 32 is mounted on the retainer ring 21, and the other guide member 33, which is paired the former guide member in a freely slidable manner, is mounted on the top plate 11. The shear force to the flexible part 9a of the diaphragm 9 is not reduced in this mounting method, but the method may be selected when the guide member can not be mounted because the space above of the carrier 21 is limited.

Or, the guide members may be provided on both the carrier 10 and the retainer ring 21 as a combined embodiment of those shown in FIG. 1 and FIG. 6. Such construction allows, for example, the shear force, generated at the flexible part 9b due to applied torque to the retainer ring 21 as shown in the embodiment in FIG. 1. to be reduced.

[Second Embodiment]

Figure 7:
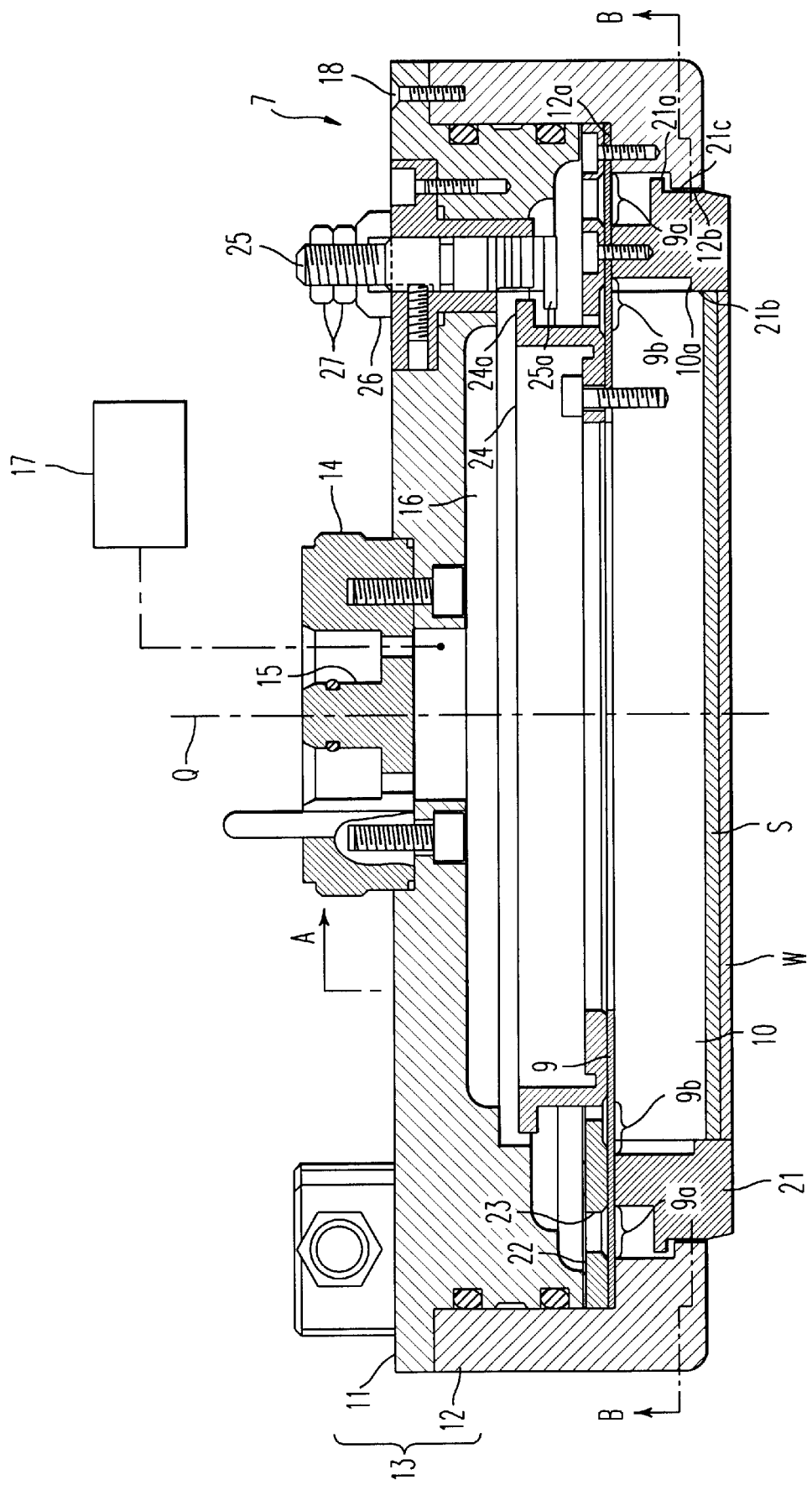
FIG. 7 shows a cross section of the wafer holding head in the example (the second embodiment) provided with serration on the carrier, the retainer ring and the head body.
Figure 8:
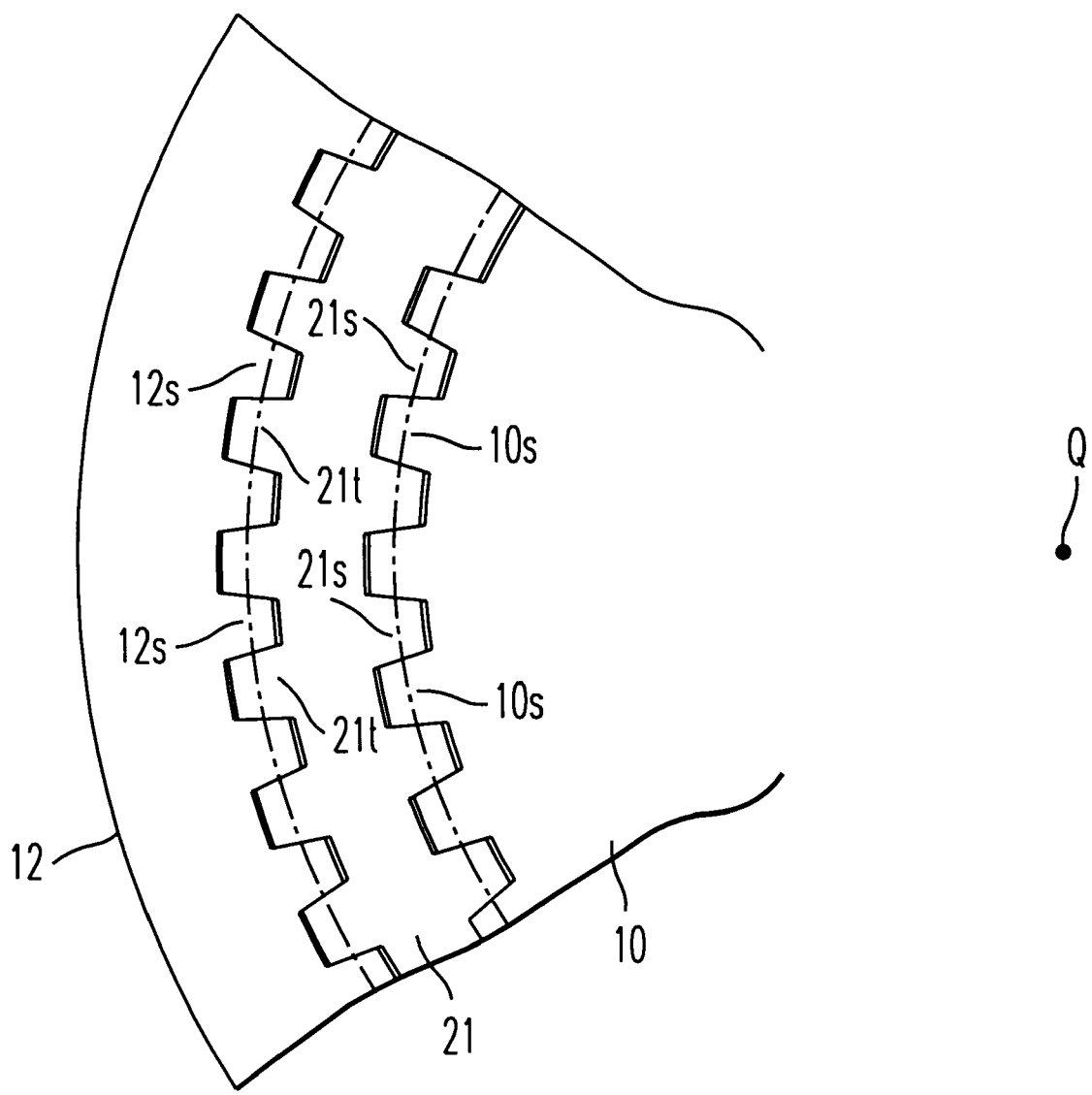
FIG. 8 shows a partially enlarged drawing viewed along the line B—B in FIG. 7, showing serration provided on the carrier, the retainer ring and the head body.

In the second embodiment of the present invention as shown in FIG. 7 and FIG. 8, serrations 10s are provided on the entire outer circumference of the carrier 10, and serrations 21s engaging with the serrations 10s is provided on the entire inner circumference of the retainer ring 21, while serrations 21t are additionally provided on the entire outer circumference of the retainer ring 21, and serrations 12s engaging with the serrations 21t are provided on the entire inner circumference at the lower end of the circumference wall 12 of the head body 13, in the wafer holding head 7 according to the first embodiment. FIG. 8 shows a partially enlarged cross section of the serrations viewed along the line B—B in FIG. 7. These serrations may not be disposed over the entire circumference, but may be partially disposed on the circumference. In both cases, the torque applied to the carrier 10 is transferred to the circumference wall 12 to protect the flexible parts 9a and 9b of the diaphragm 9.

[Third Embodiment]

Figure 9:
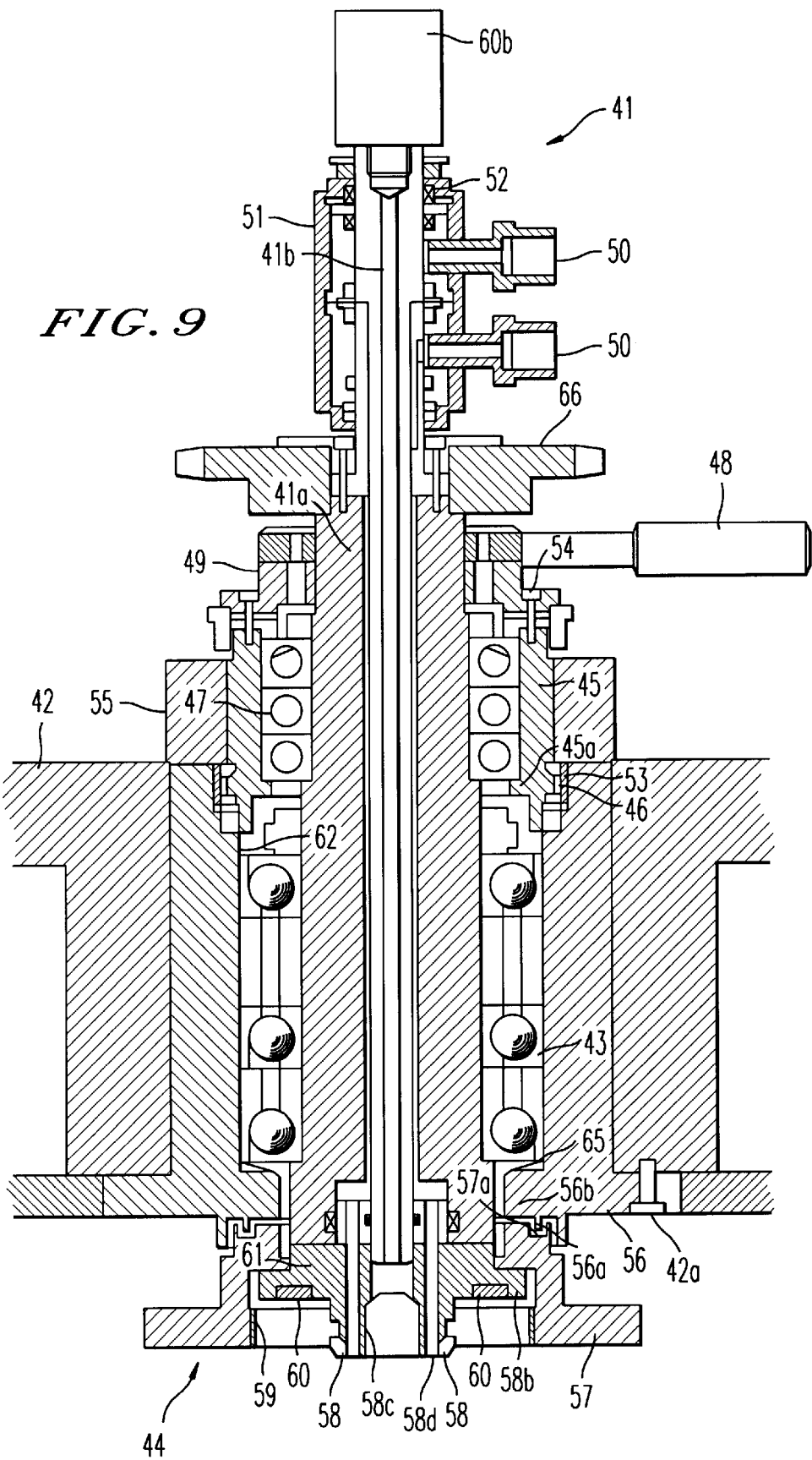
FIG. 9 shows a cross section of the spindle in the drawing showing the wafer polishing apparatus according to the third embodiment of the present invention.

The wafer polishing apparatus according to one embodiment of the present invention will be described hereinafter with reference to the drawings. FIG. 9 shows a cross section of a spindle contained in the drawing showing the wafer polishing apparatus according to the present invention.

Figure 31:
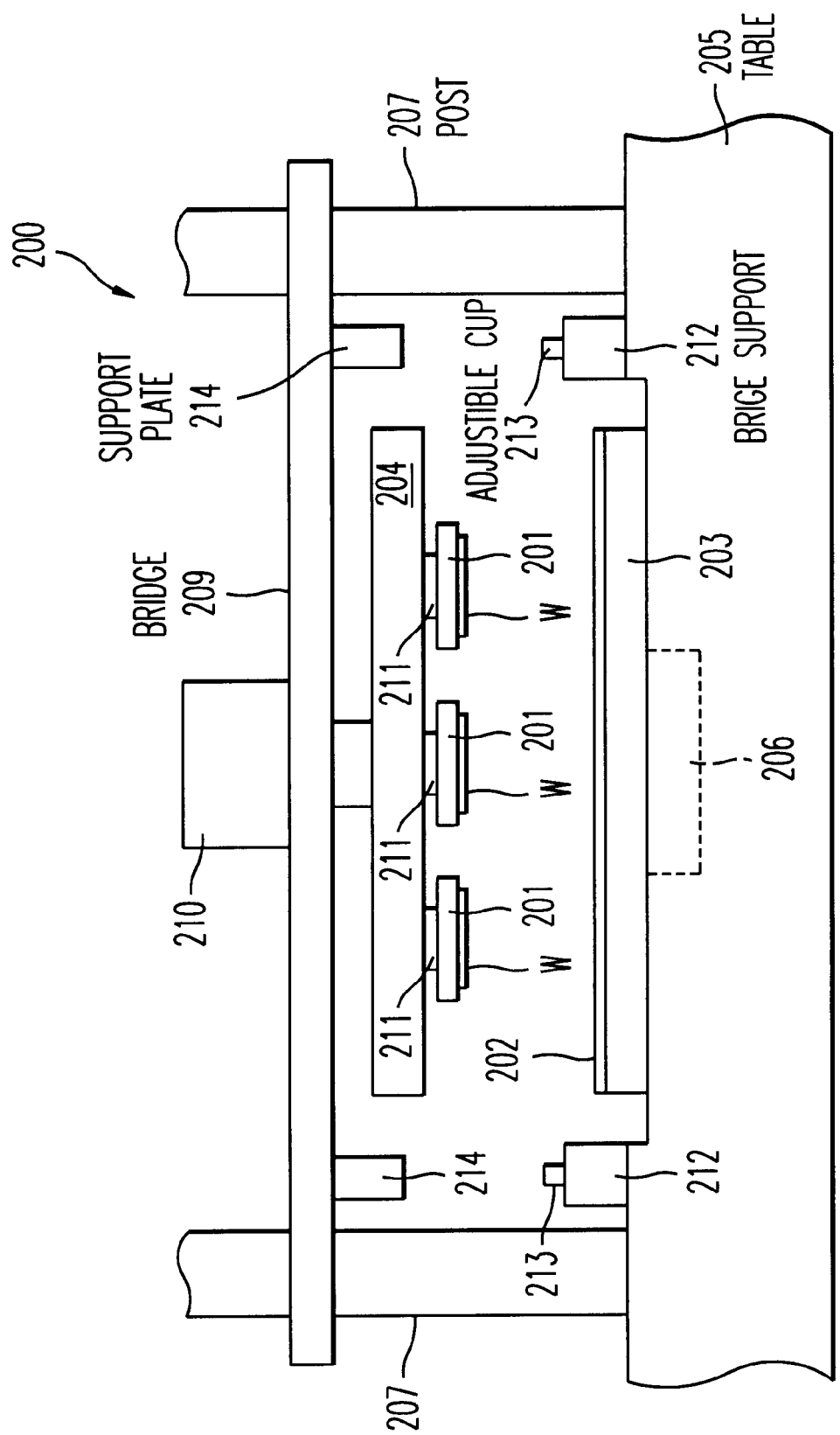
FIG. 31 shows the overall feature of the wafer polishing apparatus in the related art.
Figure 32:
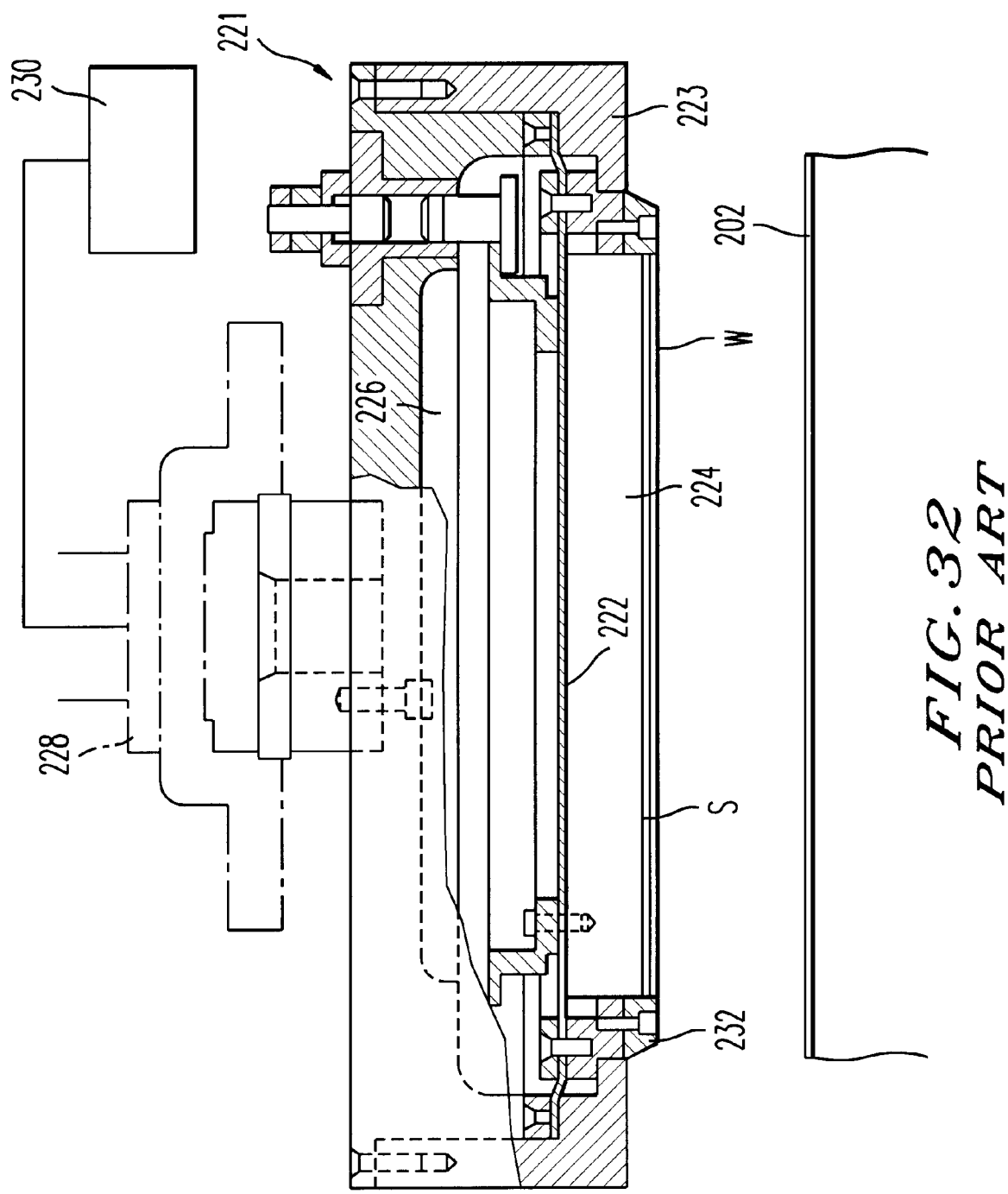
FIG. 32 shows an illustrative enlarged perspective view of the main part of the wafer polishing apparatus in the related art.
Figure 33:
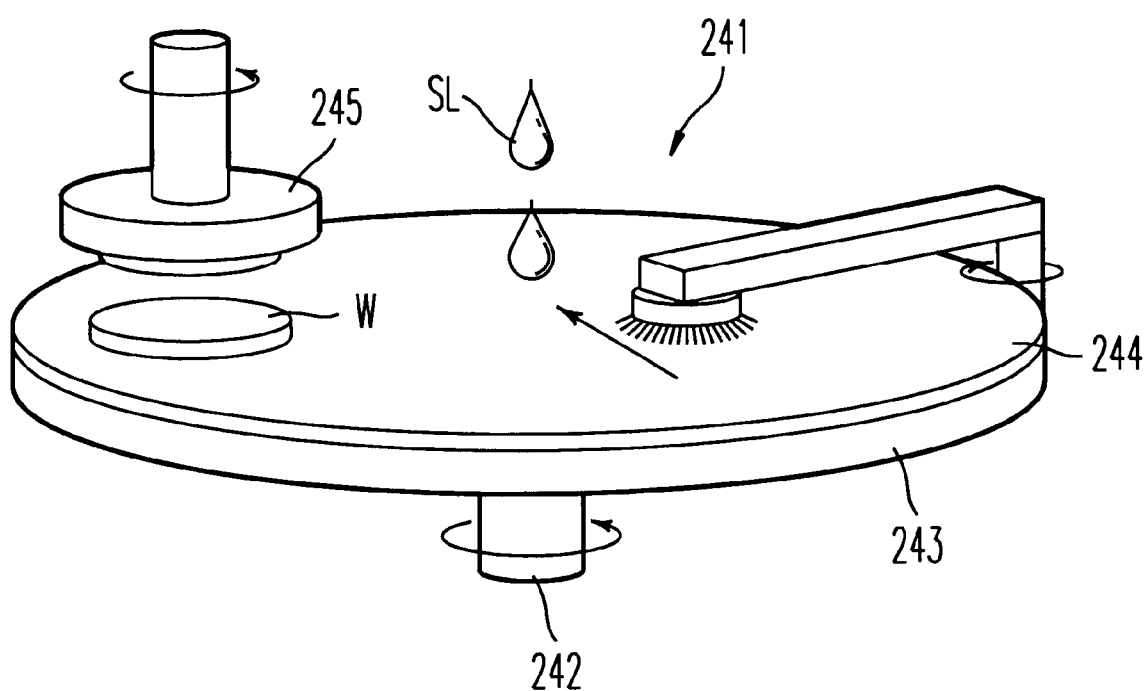
FIG. 33 shows a front cross section on an another example of the wafer polishing apparatus in the related art.
Figure 34:
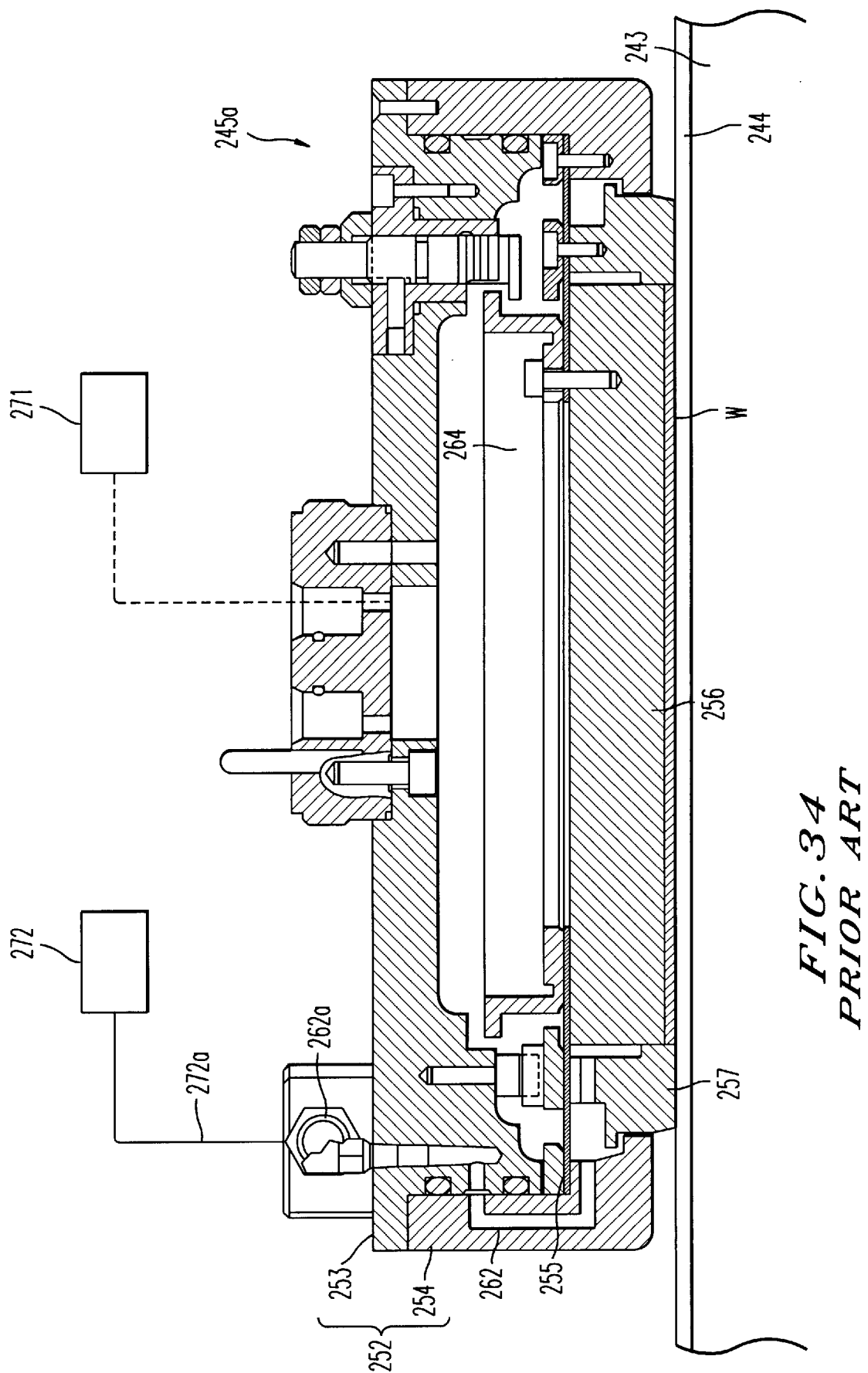
FIG. 34 shows a front cross section showing an another example of the conventional wafer holding head.

The spindle 41 is provided, for example, at the members where the carousel and the wafer holding head are coupled as shown in FIG. 31.

In FIG. 9, the spindle 41 is provided in an engaging member 62 that is a penetration hole formed on a spindle housing 56 provided in the carousel 42. The spindle 41 is provided with a main shaft 41a formed into an approximately cylindrical tube, a spindle side coupling member 44 disposed at below the carousel 42, a handle supporting member 49 disposed at above the carousel 42, a positioning handle 48 provided so as to be elongated along the horizontal direction from the handle supporting member 49, and a fluid feed port 50 communicating a tube 41b of the main shaft 41a provided at the upper end of the spindle. The first bearing 43 is provided in the engaging member 62 to support the main shaft 41a in a freely rotatable manner with the first bearing 43. An upper flange 55 is provided on the top face of the carousel 42. The spindle 41 and the carousel 42 are coupled with each other with fitting screws 42a.

The first bearing 43 is fitted to the inside of the cylindrical engaging member 62 in the spindle housing 56. The first bearing 43 is supported in the engaging member 62 in a freely rotatable manner, and the outer circumference of the first bearing 43 is not fixed to the inner circumference of the engaging member 62. The first bearing 43 is also provided so that its position does not change relative to the direction of the axis line of the main shaft 41a.

Double rings of circular projections 56a are formed downward along the vertical direction on the bottom face of the spindle housing 56. A radially protruding circular support plate 56b is also formed at the lower part of the inner circumference of the first bearing 43, and the support plate restricts the downward shift of the first bearing that is supported to be freely slidable. It is also possible to provide a circular leaf spring 65 on the top face of the support plate 56b, and impact force applied when the bottom of the first bearing 43 comes in contact with the stopper 56b is relaxed by this leaf spring 65.

A bearing supporting member 45 is provided in the cylindrical upper flange 55. This bearing supporting member 45 is formed into a cylindrical shape, while a positioning external thread 46 is formed at the lower part on the outer circumference. The positioning external thread 46 can be screwed into a positioning internal thread 53 formed at the upper part on the inner circumference of the spindle housing 56. The width of the positioning internal thread 53 along the axis line direction is formed to be wider than the width of the positioning external thread 46 along the axis line direction. Since the outer circumference face of the bearing supporting member 45 comes in contact with the inner circumference face of the upper part of the flange 55, the bearing supporting member 45 is rotatable in the upper part of the flange 55.

A second bearing 47 is provided in the cylindrical bearing supporting member 45, and the main shaft 41a is supported with the second bearing 47 and the first bearing 43 in a freely rotatable manner. A step 45a, which is provided so as to support the second bearing 47 from below the bearing, is formed at the lower part of the bearing supporting member 45, so that the outer circumference of the second bearing 47 is fixed to the inner circumference of the bearing supporting member 45. The second bearing 47 comprises an angular ball bearing, which restrict the axis direction (thrust direction) shift of the main shaft 41a. Consequently, the relative position of the main shaft 41a and the second bearing 47 does not change.

A handle supporting member 49 is provided at the upper part of the bearing supporting member 45. This handle supporting member 49 is fixed to the bearing supporting member 45 with bolts 54, while coupling the positioning handle 48 provided by being expanded along the horizontal direction. The main shaft 41a is freely rotatable in the cylindrical handle supporting member 49. The main shaft 41a is allowed to displace along the axis line direction by allowing the handle supporting member 49 to rotate together with the bearing supporting member 45.

In other words, the bearing supporting member 45, the handle supporting member 49 and the second bearing 47 are fixed, while the first bearing 43 is slidable relative to the spindle housing 56. The shift of the main shaft 41a along the thrust direction is restricted by the second bearing 47, and the first bearing 43, the second bearing 47 and the main shaft 41a are provided not to change their relative positions among them.

The position adjusting external thread 46 rotates along the positioning internal thread 53 by rotating the bearing supporting member 45, thereby the bearing supporting member 45 displaces along the axis line direction relative to the spindle housing 56. Accordingly, the main shaft 41a does not change the relative position from the bearing supporting member 45, but is allowed to relatively displace along the axis direction against the spindle housing 56 fixed to the carousel 42.

A scale disk 66 is provided at the upper part of the handle supporting member 49, and the rotation angle of the handle supporting member 49 can be confirmed using the scale disk 66.

A fluid feed port 50 is provided above the spindle 41 so as to communicate the inside of the tube 41b of the main shaft 41a. The fluid such as air from the fluid feed port 50 is sent to the opening side at the lower end of the tube through the tube 41b. A housing 51 is provided around the main shaft 41a in the vicinity of the fluid feed port 50, in order to prevent the fluid other than that fed from the fluid feed port 50 from invading into the tube 41b. The third bearing 52 is provided in the housing so as not to inhibit rotation of the main shaft 41a.

A spindle coupling member 44 for coupling with the wafer holding head is formed at the lower part of the spindle 41 protruding below the carousel 42. The spindle coupling member 44 is provided with an outer cylinder 57 coupled to the main shaft 41a, and a cylindrical positioning member 58 provided in the outer cylinder 57. The position of the wafer holding head coupled to the spindle side coupling member is adjustable by changing the thickness of the spacer 61 integrated with the positioning member 58.

The positioning member 58 is provided with a projection 58a formed into a cylindrical shape and protruding downward, a brim 58b formed so as to link with the projection 58a, and a recess 58c as a space in the projection 58a. A feed tube 58d formed along the vertical direction communicating the tube 41b is provided so as to penetrate to the lower end face of the projection 58a.

A head mounting internal thread 59 is formed on the inner circumference face of the outer cylinder 57 at the height opposed to the outer circumference of the projection 58a. A ring-shaped recess 57a formed to follow a ring-shaped hillock 56a is also formed on the upper face outside of the outer cylinder 57. These members comprise a labyrinth ring. Forming a gap with a complicated shape by the ring-shaped recess 57a and the ring-shaped hillock 56a allows viscous friction resistance and surface tension to act on the gap, preventing liquids such as a slurry and foreign substances from invading into the first bearing side 43.

Figure 11:
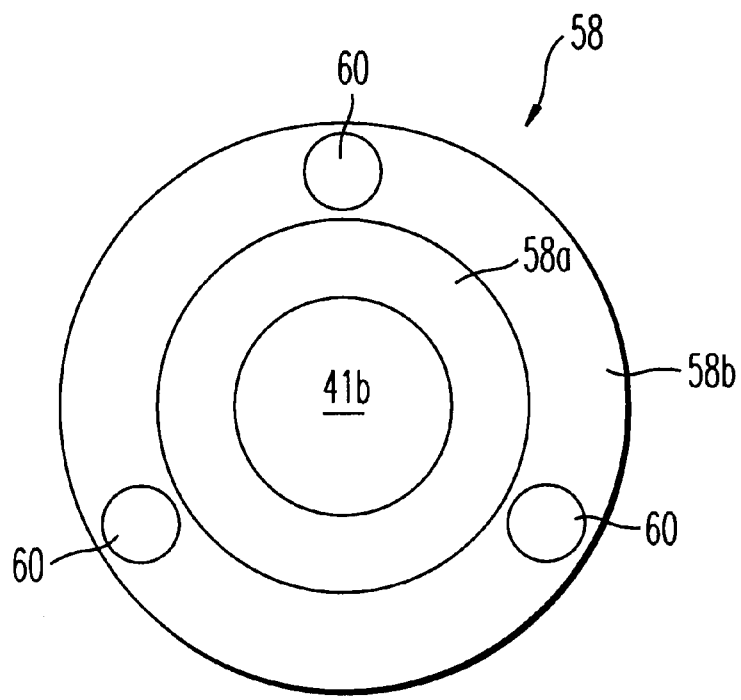
FIG. 11 illustrates the disposition of the pressure sensor provided on the spindle in the third embodiment.

A pressure sensor 60 comprising a piezoelectric element is provided at the brim 58b. A plurality of these pressure sensors 60 are disposed with an equal distance along the direction of circumference of the brim 58b so as to be buried in the brim as shown in FIG. 11. Lead wires are connected to respective pressure sensors 60, and are connected to an amplifier 60b provided at the upper end of the spindle 41 through the tube 41b. The output signal from each pressure sensor 60 is sent to the amplifier 60b through the lead wire, and is transferred to the auxiliary processor.

The wafer holding head attached to the spindle 41 will be described below with reference to FIG. 10.

Figure 10:
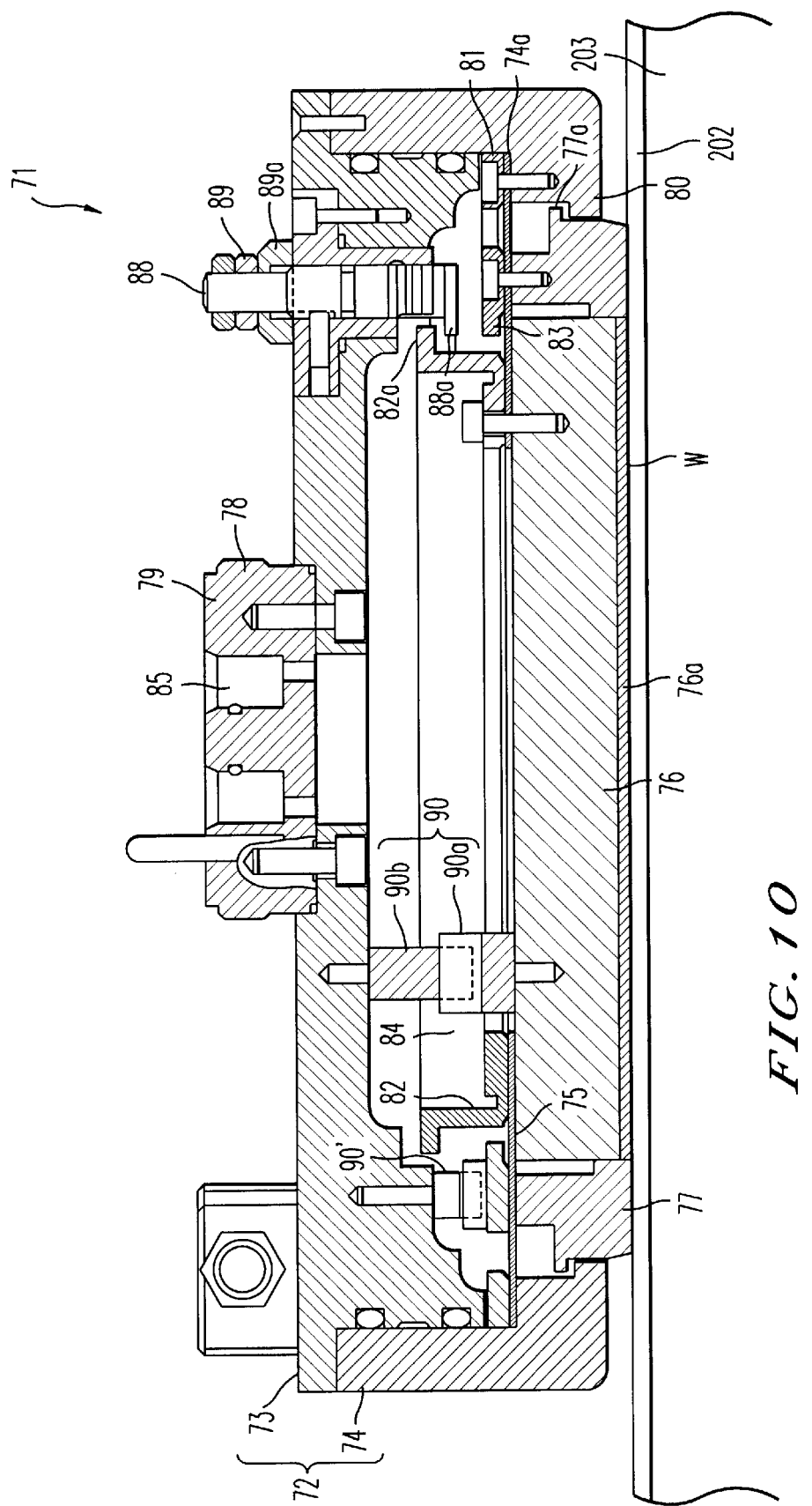
FIG. 10 shows a cross section of the wafer holding head in the drawing showing the wafer polishing apparatus according to the third embodiment of the present invention.

In FIG. 10, the wafer holding head 71 is provided with a head body 72 comprising the top plate 73 and a cylindrical circumference wall 74, a diaphragm 75 expanded in the head body 72, a ring-shaped carrier 76 fixed on the lower face of the diaphragm 75, and a ring-shaped retainer rings 77 provided in concentric relation on the inner wall of the circumference wall 74 and on the outer circumference face of the carrier 76. The carrier 76 and the retainer rings 77 have floating structures that is able to displace along the axis direction by elastic deformation of the diaphragm 75.

The head body 72 is composed of a disk-shaped top plate 73, and a cylindrical circumference wall 74 fixed at below the outer circumference of the top plate 73, and the bottom end of the head body 72 is formed into a open hollow cylinder. The top plate 73 is fixed in coaxial relation to a shaft 79 as a head side coupling member for coupling to the spindle 41. A flow path 85 that communicate with the tube 41b of the spindle 41 is formed along the vertical direction. A head mounting external thread 78 is formed on the outer circumference of the shaft 79. A step 74a and a ring-shaped support plate 80, which radially protrudes inward, are also formed over the entire circumference at the lower part of the circumference wall 74.

The diaphragm 75 comprising an elastic material such as a fiber reinforced rubber is formed into a ring shape or a disk shape, and is fixed on the step 74a formed at the inner wall of the circumference wall 74 using a diaphragm fixing ring 81.

A fluid chamber 84 is formed at above the diaphragm 75, and communicates with the flow path 85 formed in the shaft 79. The pressure in the fluid chamber 84 is controlled by feeding a fluid such as air through in the fluid chamber 84 from the tube 41b through the flow path 85.

The carrier 76 comprising a highly rigid material such as a ceramic is formed into a disk shape with a constant thickness, and is fixed with a carrier fixing ring 82 provided on the upper face of the diaphragm 75. A ring-shaped step 82a is formed at the upper part of the carrier fixing ring 82, and this step is engaged with a step 88a formed at the lower end of the stopper bolt 88 fixed with nuts 89, which are vertically inserted through the top plate 73, and spacer 89a. The diaphragm 75 is prevented from suffering an excess force by allowing the step 82a to engage with the step 88a, even when the wafer holding head 71 ascend by, for example, an ascending and descending mechanism (not shown) to bent diaphragm 75 downward by the weight of the carrier 76.

The retainer rings 77 are formed in a ring shape between the inner wall of the circumference wall 74 and the outer circumference face of the carrier 76, and are disposed in a concentric relation to the circumference wall 74 and the carrier 76 with a slight gap from the inner wall of the circumference wall 74 and from the outer circumference face of the carrier 76. The upper end and lower end of the retainer ring 77 are horizontally formed, and is fixed with the retainer ring fixing ring 83 provided on the upper face of the diaphragm 75. The step 77a is formed on the outer circumference face of the retainer ring 77. The step prevents the diaphragm 75 from receiving a local force by suppressing excess downward displacement of the retainer ring 77 by allowing the step 77a to engage with the stop ring 80, when the wafer holding head ascends with the ascending-descending mechanism.

Figure 12:
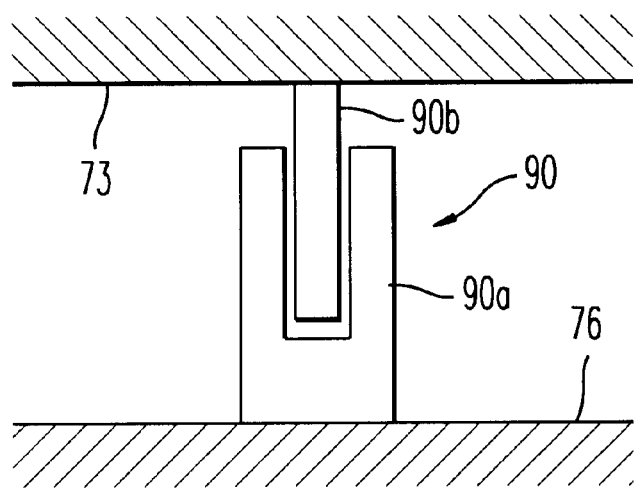
FIG. 12 illustrates the torque communication part in the third embodiment.

A plurality of torque transfer mechanisms 90 are expanded on the upper face of the carrier 76 via the diaphragm 75. The torque transfer mechanisms 90 is composed of a first member 90a fixed on the upper face of the carrier 76 and having a U-shaped cross section, and a rectangular column shaped second member 90b fixed to the top plate 73 above the first member 90a as shown in FIGS. 10 and 12. The first member 90a is disposed with its planar part toward the circumference direction, while the tip of the second member 90b is positioned in the U-shape of the first member 90a. The torque transfer mechanisms 90 constantly transfer the rotational force of the spindle 41 to the carrier 76, bedsides decreasing the force applied to the diaphragm 75 along the twist direction to prevent the diaphragm from being damaged.

The torque transfer mechanisms 90 are provided at least two sites along the circumference direction. The inside of the U-shaped first member 90a and the tip of the second member 90b are disposed with a distance apart, so as not to disturb displacement of the carrier 76 along the axis line direction. The configuration of the torque transfer mechanism 90 is not limited to that described above, but the first member 90a may be formed into a pin shape, and the second member 90b may be formed into a cylindrical shape.

The spindle 41 and the wafer holding head 71 having the construction as described above are coupled with each other by screwing the head mounting internal thread formed on the former into the head mounting external thread formed on the other.

The wafer holding head 71 is disposed at below the spindle side coupling member 44, while allowing the shaft 79 as a head side coupling member to come close to the spindle side coupling member 44 by positioning the projection 58a and the flow path 85 so as to fit them with each other. Centering of the spindle 41 and the wafer holding head 71 is made easy by providing a centering positioning member 58 at the spindle side coupling member 44.

The head mounting internal thread 59 is screwed to the head mounting external thread 78 during positioning. The threads are screwed until the upper end face of the shaft 79 of the wafer holding head 71 comes in contact with the brim 58b of the positioning member 58 provided in the spindle side coupling member 44. The upper end face of the shaft 79 is enabled to contact the pressure sensor 60 by providing the pressure sensor 60 on the brim 58b with which the upper end face of the shaft 79 comes in contact.

Coupling between the wafer holding head 71 and the spindle 41 is completed by screwing the head mounting external thread 78 to the head mounting internal thread 59 until the upper end face of the shaft 79 slightly presses the brim 58b providing the pressure sensor 60.

When the wafer W is polished using the wafer holding head 71 coupled with the spindle 41 as described above, the wafer W is at first adhered on a wafer adhering sheet 76a provided on the bottom face of the carrier 76. Then, while holding the periphery of the wafer W with the retainer ring 77, the surface of the wafer is pressed onto the polishing pad 202 adhered on the surface of the platen 203. Any materials that have been conventionally used for polishing the wafer may be used for the polishing pad 202, examples of them including a velour type pad prepared by impregnating a nonwoven fabric comprising polyester with a soft resin such as polyurethane, a suede type pad prepared by forming a resin foam layer comprising polyurethane foam on a substrate such as a polyester nonwoven fabric, or a resin foam sheet comprising independently foamed polyurethane.

Subsequently, a fluid such as air is supplied to the fluid feed port 50 from a fluid feed mechanism (not shown). The supplied fluid passes through the tube 41b, and flows into the fluid chamber 84 through the flow path 85. The pressure of the fluid in the fluid chamber 84 is adjusted to control the pressing pressure of the carrier 76 and the retainer ring 77 onto the polishing pad 202. The carrier 76 and the retainer ring 77 have floating constructions supported by the diaphragm 75 so as to be able to independently ascend and descend, and the pressing pressure to the polishing pad 202 is adjustable by the pressure in the fluid chamber 84.

The platen 203 is allowed to rotate and the wafer holding head 71 is allowed to revolve, while adjusting the pressing pressure of the carrier 76 and the retainer ring 77 onto the polishing pad 202. The wafer W is polished by supplying an slurry on the surface of the polishing pad 202 and on the polishing face of the wafer W from an slurry feed mechanism.

The polishing resistance acting on the wafer W along the vertical direction and along the circumference direction is detected with the pressure sensor 60 making contact with the upper end face of the shaft 79.

The pressure sensor 60 comprises a piezoelectric element that is able to detect both the shear stress acting along the horizontal direction and the stress acting along the vertical direction. Both of the rotational force (torque) and the force along the radius direction (right angle direction) is detectable among the forces along the horizontal direction. In other words, the piezoelectric element takes advantage of a piezoelectric effect that generate electric signals at its output terminal by applying an external stress on the piezoelectric element. The piezoelectric element is mainly composed of electrodes provided at both ends of the element, and a piezoelectric laminated ceramic that is provided by being sandwiched with these electrodes. When the element is pressed from its initial state, it generates a positive voltage while, when it is expanded, it generated a negative voltage. The pressure sensor 60 comprising the piezoelectric element is made to be previously a little pressed by press-holding the spindle 41 and the wafer holding head 71, or the element is in an initial state as if a bias voltage has been applied prior to polishing of the wafer W.

The pressure sensor 60 is in a compressed state during polishing of the wafer W, because a force along the vertical direction is applied to the pressure sensor 60 by allowing the wafer W on the wafer holding head 71 to contact the polishing pad 202. The pressure sensor 60 outputs, for example, a positive voltage, and the output signal is transferred to the amplifier 60b through a lead wire, where the signal is transmitted to a monitor via a processor that converts the signal from the auxiliary pressure sensor 60 into a force.

When the wafer W is polished with the polishing pad 202, a frictional force generates between the wafer W and the polishing pad 202. A force is applied to the wafer holding head 71 along the direction of rotation, thereby the pressure sensor 60 suffers a shear force. A negative voltage is generated because the pressure sensor 60 comprising the piezoelectric element is deformed as if it is expanded.

The force along the vertical direction and the force along the horizontal direction (along the circumference direction of rotation and along the radius direction) acting on the wafer W can be detected by using a piezoelectric element as the pressure sensor 60 as described above.

When the wafer W has attained a desired polishing state, the signal detected with the pressure sensor 60 changes from the foregoing values indicating a constant level thereafter. Polishing of the wafer W is completed when the detected value has stabilized by assuming that a desired polishing state has been attained.

The cases when two kinds of wafers W1 and W2 having the constructions as shown in FIG. 13-A1 and FIG. 13-B1 are polished will be described hereinafter. The wafer W1 shown in FIG. 13-A1 should be polished so that Cu is buried into a groove in a $SiO_2$ layer. The end point of polishing refers to a state when the barrier metal layer has been exposed on the surface by polishing the Cu layer, along with fattening the barrier metal layer and Cu layer in the groove. The wafer W2 shown in FIG. 13-B1 should be polished, for example, so as to fatten the oxide layer, wherein the polishing end point refers to a state when the oxide film has been planarized. FIG. 13-A2 and FIG. 13-B2 denote the output levels from the processor based on the signal from the pressure sensor 60.

In the wafer W1, the frictional force increases when the Cu layer to be polished is gradually planarized to increase the contact area between the wafer and the polishing pad 202. Therefore, the output signal gradually rises as shown in FIG. 13-A2. When the Cu layer is further polished to expose the barrier metal layer on the surface, the output signal rapidly decreases since the barrier metal layer has a lower coefficient of friction than that of the Cu layer. Rapid decrease of the output signal shows the polishing end point when polishing has been completed.

The oxide film is planarized at the polishing end point in the wafer W2. Accordingly, polishing is completed when the oxide film is planarized constantly showing the maximum output signal for a long period of time. In other words, polishing is terminated when the maximum output signal has been stabilized for a long period of time by further polishing the surface after the time HI when the oxide film has been planarized as shown in FIGS. 13-B1 and 13-B2.

The force acting on respective wafer holding heads 71 can be observed even when the apparatus has a plurality of the wafer holding heads 71, by providing the pressure sensors at the coupling member between the spindle 41 and the wafer holding heads 71 for detecting the polishing end point of each wafer W. Consequently, the polishing end point can be securely detected at individual wafer holding heads 71, without forming any wafers in excess polishing or in insufficient polishing. Providing the pressure sensor 60 at the spindle 41 side can eliminate the need of providing the pressure sensors 60 at individual wafer holding heads 71, thus enabling the number of the sensors to be suppressed.

Decrease of rigidity of the apparatus can be suppressed to its maximum by using the piezoelectric element as the pressure sensor 60. Since the force acting on the wafer W is detected from the shear force acting on the piezoelectric element, a slight change in the polishing resistance can be securely observed.

The shear forces along the circumference direction and along the radius direction can be securely detected with any of the pressure sensors 60, by providing a plurality of the pressure sensors 60 along the circumference direction on the brim 18b that is a contact portion between the upper end face of the shaft 79 and the spindle side coupling member 4.

It is possible to dispose these pressure sensors 60 on the contact face between the lower end face of the main shaft 41a and the spacer 61 provided above the positioning member 58. A plurality of the pressure sensors 60 may be provided along the circumference direction on the upper end face of the spacer 61, or it may be provided on the lower end face of the main shaft 41a.

The wafer holding head 71 comprises a positioning external thread 46 at the outside of the bearing supporting member 45, a positioning internal thread 46 screwed with the positioning external thread 46 and formed in the spindle housing 56 provided on the carousel 42, and a handle supporting member 49 fixed to the bearing supporting member 45 to allow the bearing supporting member 45 to rotate with the positioning handle 48. Consequently, the spindle 41 is allowed to ascend and descend by allowing the bearing supporting member 45 to rotate together with the handle supporting member 49. Therefore, fine adjustment of the position of the wafer holding head 71 is made easy besides allowing the pressing force between the wafer W and the polishing pad 202 to be finely adjusted. All the wafers W are securely polished by adjusting the individual head in the construction providing a plurality of the wafer holding heads 71.

While the height is manually adjustable using the positioning handle 48, it is needless to say that the height can be automatically adjusted using various kinds of actuators such as a servomotor.

An excess force along the twist direction acting on the diaphragm 75 is reduced when the wafer holding head 71 having a floating structure rotates, by providing the torque transfer mechanism 90, thereby allowing the diaphragm from being damaged while maintaining the floating effect.

It is also possible to provide the torque transfer mechanism 90 at above the retainer ring 77 as shown in the second torque transfer mechanism 90' in FIG. 10, not only providing the torque transfer mechanism 90 on the upper face of the carrier 76. The rotational force of the spindle 41 can be transferred to the carrier 76 and the retainer ring 77 while further decreasing the force along the twist direction acting on the diaphragm 75, by providing the torque transfer mechanism 90' on the upper face of the retainer ring 77.

It is possible to form the diaphragm 75 using a metal film having elasticity such as an iron film not to compromise the floating effect, instead of using a rubber. The diaphragm is strengthened by using the metal film, enabling damages of the diaphragm 75 to be prevented even when the wafer holding head 71 rotates at a high speed.

[Fourth Embodiment]

Figure 14:
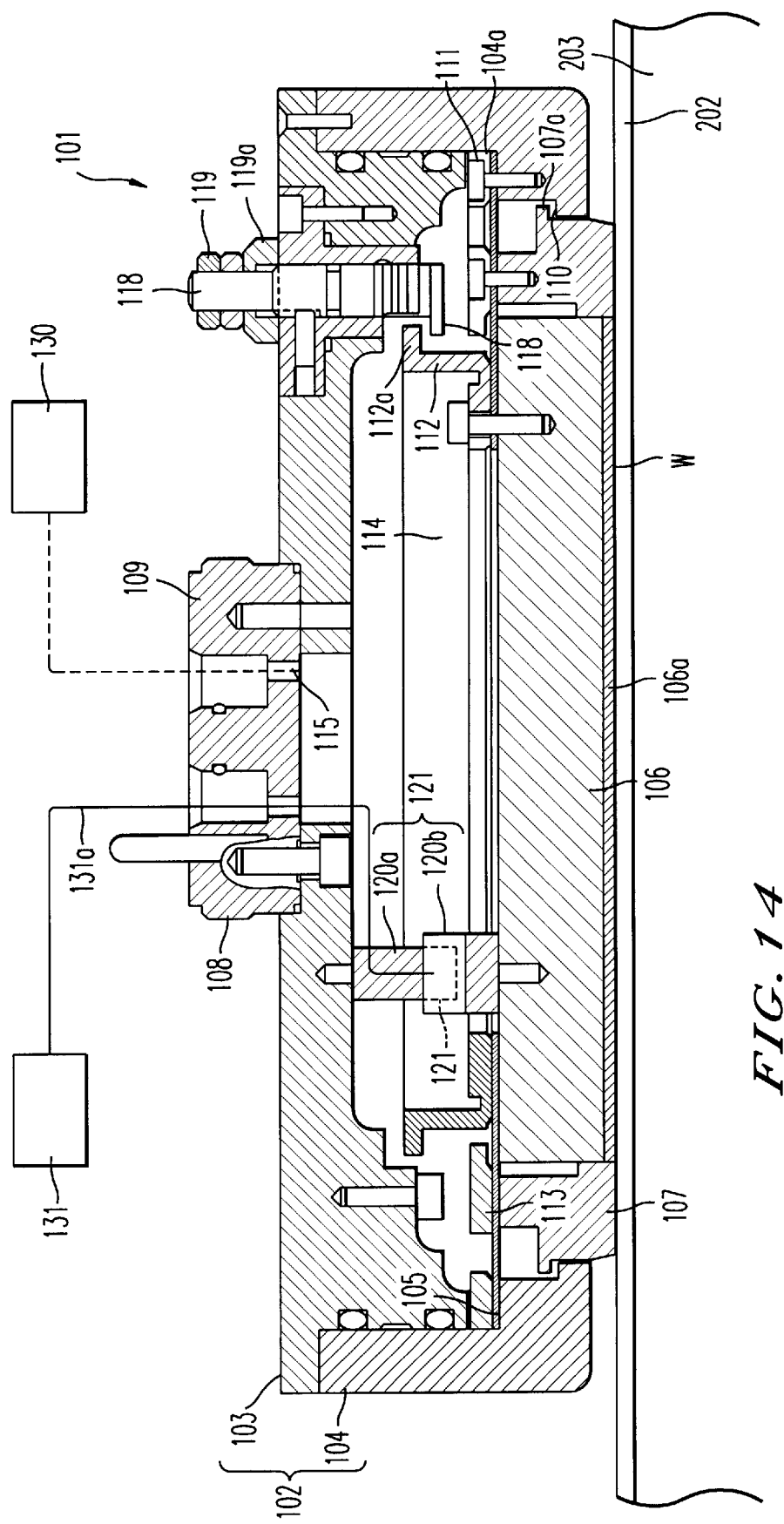
FIG. 14 shows a cross section of the wafer holding head in the drawing showing the wafer polishing apparatus according to the fourth embodiment of the present invention.

The method for manufacturing the wafer polishing apparatus, and the method for manufacturing the wafer will be described hereinafter with reference to the drawings. FIG. 14 shows one example of the wafer polishing apparatus according to the present invention illustrating a cross section of the wafer holding head 101.

The wafer holding head 101 is provided, for example, on the carousel 204 shown in FIG. 31.

In FIG. 14, the wafer holding head 101 is provided with a head body 102 comprising a top plate 103 and a cylindrical circumference wall 104, a diaphragm 105 comprising an elastic member expanded in the head body 102, a carrier 106 fixed on the bottom face of the diaphragm 105, and ring-shaped retainer rings 107 provided in concentric relation on the inner wall of the circumference wall 104 and on the circumference face of the carrier 106. These carrier 106 and the retainer rings 107 have a floating structure being able to displace by elastic deformation of the diaphragm 105.

The head body 102 is composed of the disk-shaped top plate 103 and the cylindrical circumference wall 104 fixed at below the outer circumference of the top plate 103, and the lower end of the head body 102 is open forming a hollow cylinder. The top plate 103 is fixed in a coaxial relation to the shaft 109 that serves as a coupling member for coupling to the carousel, and a flow path 115 is formed in the vertical direction in the shaft 109. An external thread 108 is formed on the shaft 109 as a mean for coupling with the carousel (the shaft may be coupled with the spindle 211 by other means). A step 104a and a ring-shaped stopper 110 radially protruding inward are formed around the entire circumference of the circumference wall 104.

The diaphragm 105 comprising an elastic material such as a fiber reinforced rubber is formed into a ring-shape or a disk shape, and is fixed to the step 104a formed on the inner wall of the circumference wall 104 with a diaphragm fixing ring 111.

A fluid chamber 114 is formed above the diaphragm 105, and communicates the flow path 115 formed in the shaft 109. The pressure in the fluid chamber 114 is controlled by supplying a fluid such as air from a pressure adjusting mechanism 130 through a flow path 115.

The carrier 106 comprising a highly rigid material such as a ceramic is formed into an approximately disk shape with a constant thickness, and is fixed with a carrier fixing ring 112 provided on the surface of the diaphragm 105. A ring-shaped step 112a is formed above the carrier fixing ring 112, and engages with a step 118a formed at the lower end of stopper volts 118 fixed with nuts 119 and a spacer 119a vertically penetrating through the top plate 103. The diaphragm 105 becomes free from an excess force by allowing the step 112a to engage with the step 118a, even when the wafer holding head 101 ascends with an ascending-descending mechanism (not shown) to bend the diaphragm 105 by the weight of the carrier 106.

The ring-shaped retainer rings 107 are formed between the inner wall of the circumference wall 104 and the circumference face of the carrier 106, and are disposed in a concentric relation to the circumference wall 104 and the circumference face of the carrier 106 with a slight gap from the circumference wall 104 and the circumference face of the carrier 106. The upper end face and the lower end face of the retainer ring 107 are formed to be horizontal, and the retainer ring is fixed with a retainer ring fixing ring 113 provided on the upper face of the diaphragm 105. A step 107a is formed on the circumference wall of the retainer ring 107, which suppresses the diaphragm 105 from suffering a local force by suppressing excess downward displacement of the retainer ring 107 by allowing the step 107a to engage with the stopper 110, when the wafer holding head 101 ascends with the ascending-descending mechanism.

Figure 15:
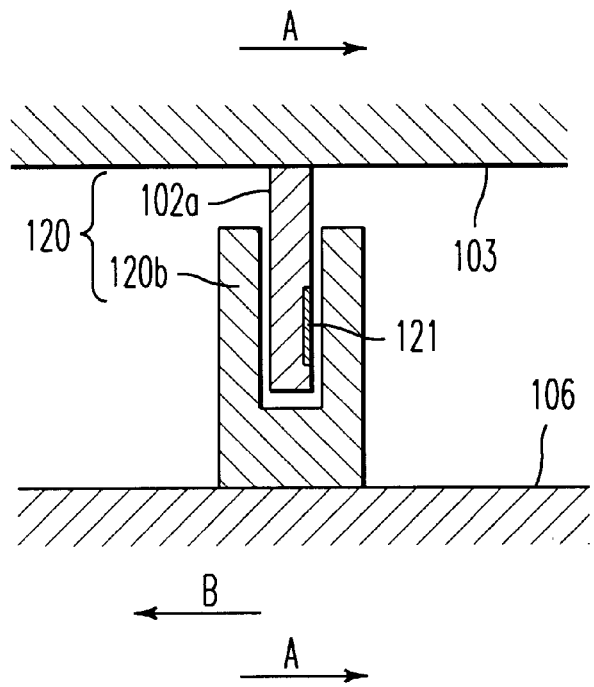
FIG. 15 shows a cross section illustrating the carrier torque transfer mechanism and first sensor according to the fourth embodiment.

A plurality of torque transfer mechanisms 120 are provided on the upper face of the carrier 106. The torque transfer mechanism 120 comprises a plate-shaped first member 120a, formed so as to expand to the downward along the circumference direction from the bottom face of the top plate 103, and a second member 120b, provided on the upper face of the carrier 106 in opposed relation to the first member 120a, having a U-shaped cross section as shown in FIGS. 14 and 15. The first member 120a and the second member 120b are disposed with its planer face toward the circumference direction, and the tip of the first member 120a is positioned in the U-shape of the second member 120b. The second member 120b of the torque 120 may be coupled with the carrier 106 via the diaphragm 105.

The tip of the first member 120a is disposed with a distance apart from the inside of the U-shaped second member 120b, not to disturb displacement of the carrier 106 along the axis line direction. In other words, the second member 120b is provided so as to be able to fluctuate along the axis line direction relative to the first member 120a together with the carrier 106.

The torque transfer mechanism 120 is provided in order to transfer the torque of the head body 102 to the carrier 106, when the head body 102 is allowed to rotate during polishing of the wafer W. That is, when the head body 102 rotates along the direction indicated by an arrow A in FIG. 15 during polishing of the wafer W, the carrier 106 supported by the diaphragm 105 rotates along the direction indicated by an arrow A while being twisted along the direction indicated by an arrow B due to a frictional force between the wafer W held by the head and the polishing pad 202. However, the wafer is polished by transferring the torque acting on the head 102 to the carrier 106 while reducing the force along the twist direction acting on the diaphragm 105, by allowing one side of the first member 120a to contact the inside of the U-shape of the second member 120b. The first member 120a is slidable relative to the second member 120b along the axis direction, so that the floating effect of the carrier is not inhibited.

A sensor 121 is provided at one side face of the first member 120a. The sensor 121 is provided to be parallel to the plane of the second member 120b directed toward the direction of rotation, as well as at the side where the sensor is pressed into the second member 120b when the wafer holding head 101 rotates.

The surface of the sensor 121 is placed with a slight distance to the inside of the second member 120b when the wafer holding head 101 does not rotate, so that the torque transfer mechanism 120 does not interfere fluctuation of the carrier 106 along the axis direction. The sensor 121 is provided at the side where one side face of the first member 120a provided with the sensor 121 and inner face of the second member 120b is pressed when the wafer holding head 101 rotates.

A pressure sensor such as a piezoelectric element and a distortion gauge is used in the sensor 121 to be able to detect the pressing force between the first member 120a and the second member 120b caused by rotation of the wafer holding head 101. In other words, the force along the direction of rotation acting on the wafer W is directly detected by the sensor 121 via the carrier 106 when the wafer W is polished.

The surface of the sensor 121 may slightly contact the inside of the second member 120b so as not to disturb fluctuation of the carrier along the axis line direction, when the wafer holding head 101 does not rotates. Or, the sensor 121 may be provided at the portion where it is pressed when wafer holding head 101 rotates, for example, on the plane at the second member 120b side. In addition, the first member 120a may be formed with a U-shaped cross section while forming the second member 120b into a plate, or both of the first member 120a and the second member 120b may be formed into a plate shape.

Figure 16:
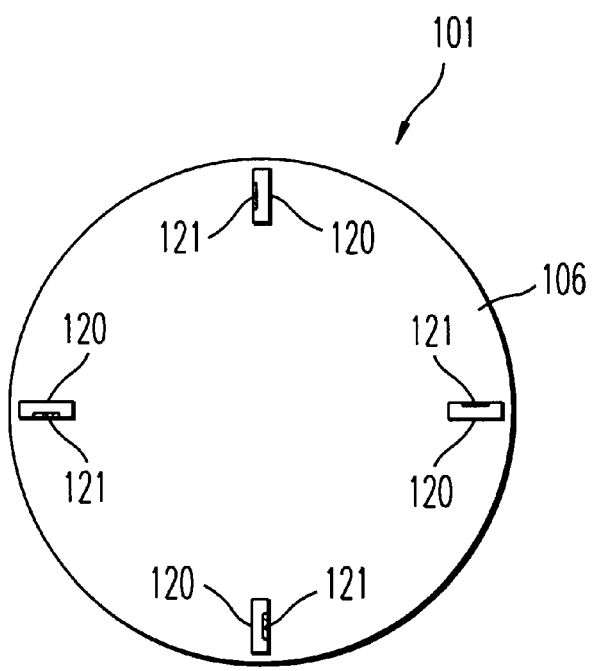
FIG. 16 illustrates the disposition of the carrier torque transfer mechanism and first sensor according to the fourth embodiment.

A plurality of the torque transfer mechanism 120 provided with the sensor 121 are provided along the circumference direction on the upper face of the carrier 106 of the wafer holding head 101 as shown in FIG. 16. For example, four mechanisms are radially provided with the same distance with each other from the center of rotation.

Respective sensors 121 are connected to a processor 131 with a harness 131a inserted through the shaft 109 coupled with the spindle. The harness for connecting the sensor 121 to the driving mechanism (not shown) for driving the sensor 121 is also inserted through the shaft 109. Output signals from these sensors 121 are transferred to the processor 131 through the harnesses individually connected to each sensor, and the processor 131 outputs the force acting on each wafer W by receiving the output signal from the individual sensor 121.

The wafer holding head 101 having the construction as described above is coupled, for example, by screwing the external thread 108 into the carousel. Other coupling methods other than screw coupling using the external thread 108 may be used for coupling to the carousel.

When the wafer W is polished using the wafer holding head 101, the wafer W is at first pressed to a wafer adhering sheet 106a provided on the lower face of the carrier 106. The surface of the wafer W contact the polishing pad 202 adhered on the upper face of the platen 203, while the periphery of the wafer W is locked with the retainer ring 107. Any materials that have been used for polishing the wafer may be used for the polishing pad 202, examples of them including a velour type pad prepared by impregnating a nonwoven fabric comprising polyester with a soft resin such as polyurethane, a suede type pad prepared by forming a resin foam layer comprising polyurethane foam on a substrate such as a polyester nonwoven fabric, or a resin foam sheet comprising independently foamed polyurethane.

Subsequently, a fluid such as air is supplied from the pressure adjusting mechanism 130 through the flow path 115 into the fluid chamber 114. The flow-in fluid flows adjusts the pressure in the fluid chamber 114, and controls the pressing pressure of the carrier 106 and the retainer ring 107 to the polishing pad 202. The carrier 106 and the retainer ring 107 assume floating structures, by which the carrier and the retainer ring are able to independently shift along the upper and lower directions with each other, supported with the diaphragm 105, and the pressing pressure to the polishing pad 202 is adjustable by the pressure in the fluid chamber 114.

The wafer is polished by adjusting the pressing pressure of the carrier 106 and the retainer ring 107 to the polishing pad 202, while allowing the platen 203 to rotate and the wafer holding head 101 to undergo a planetary motion, by simultaneously feeding an slurry onto the surface of the polishing pad 202 and to the polishing face of the wafer W from an slurry feed mechanism (not shown).

The carrier 106 holding the wafer W is twisted relative to the head body 102 by the force acting between the wafer W to be polished and the polishing pad 202. The sensor 121 provided on the torque transfer mechanism 120 on the upper face of the carrier 106 is pressed onto the plane in the second member 120b, thereby emitting a signal corresponding the pressing force. Consequently, the sensor 121 transfers an output signal corresponding to the force acting on the wafer W and the polishing pad 120 to the processor 131.

The processor 131 outputs a force acting on the wafer W based on each output signal from a plurality of the sensors 121. The wafer W receives a rotational force T generated along the direction of rotation of the wafer W caused by rotation on the polishing pad 202, and a polishing force F generated along the direction of rotation of polishing pad 202 caused by rotation on the polishing pad 202. The processor 131 calculates the rotational force T and the polishing force F.

Since the rotational force T is generated by rotation of the wafer W, and the force takes different values at the inner diameter side and at the outer diameter side, respectively. In other words, the force acting on the wafer W differs at the inner diameter side and at the outer diameter side, respectively, since relative speed at the inner diameter side and at the outer diameter side differs when the wafer W is allowed to rotate at a constant rotational speed by the wafer holding head 101. The rotational force T is related to the difference of the polishing speed between the inner diameter side and the outer diameter side, besides acting along the rotational direction of the wafer W.

The polishing force F is generated, on the other hand, by rotation of the polishing pad 202, and acts on the entire polishing face of the wafer W. Or, the polishing force F is generated by a relative motion between the rotating polishing pad 202 and the wafer W. The force is related to the rotational speed of the polishing pad 202, and acts along the direction of rotation of the polishing pad 202 on the polishing face of the wafer W.

Figure 17:
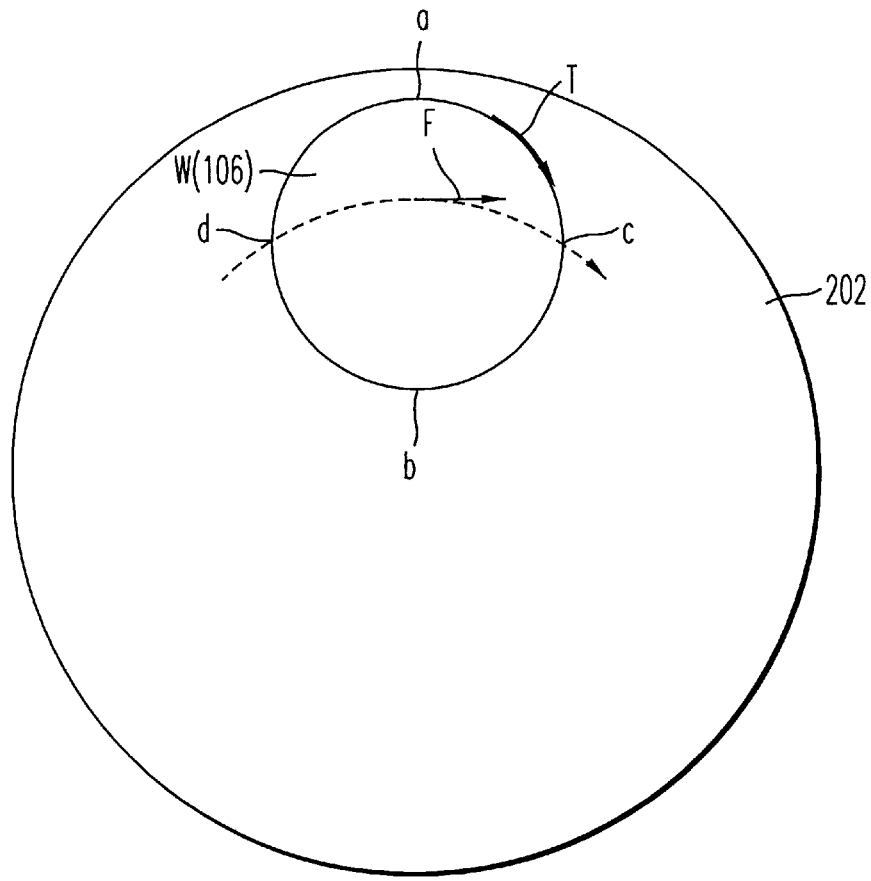
FIG. 17 illustrates the manner for sensing the force acting on the wafer with the carrier torque sensor in the fourth embodiment.

While polishing force F is applied on the entire polishing face of the wafer W, the force detected with the sensor 121 is applied via the carrier 106. Accordingly, the force is considered to be a combined force acting at the center of the wafer W as shown in FIG. 17. Among the outer circumference portions of the wafer W, the wafer W receives a force of F/2 by rotation of the wafer W at the position a where the direction along the tangent of the rotating wafer W coincides with the direction along rotation of the polishing pad 202. Suppose that the rotational force T be applied along the direction of rotation of the wafer W. Since four sensors 121 provided along the circumference direction of the carrier 106 are disposed by directing each sensitive direction toward the direction of rotation of the wafer holding head 101, the force Fa acting on the sensor 121 transferred to the position a is represented by:

$$Fa=F/2+T \quad (1)$$

Likewise, the force Fb acting on the sensor 121 transferred to the position b at the inner circumference side of the polishing pad 202 is represented by:

$$Fb=F/2-T \quad (2)$$

Accordingly, the frictional force F can be determined by the following equation:

$$Fa+Fb=F \quad (3)$$

The sensitive direction of the sensor 121 transferred to the position c, which is situated along the direction of rotation of the polishing pad 202 and is at right angle to the positions a and c, is directed toward the direction of rotation of the wafer holding head 101, so that the sensor only detects the rotational force T generated by rotation of the wafer holding head 101. In other words, since the sensitive direction of the sensor 121 and the direction of rotation of the polishing pad 202 is at right angle with each other, the sensor 121 does not detect the polishing force caused by the relative motion between the wafer holding head 101 and the polishing pad 202. Accordingly, the force Fc acting on the sensor 121 transferred to the position c is represented by:

$$Fc=T \quad (4)$$

Likewise, the force Fd acting on the sensor 121 transferred to the position d is represented by:

$$Fd=T \quad (5)$$

Accordingly, the rotational force T and the polishing force F acting on the wafer W is determined using the equations (3), and (4) or (5).

When the sum of "the number of rotation of the carousel per unit time" and "the number of rotation of the wafer holding head 101 per unit time" is equal to "the number of rotation of the platen 203 per unit time (the number of rotation of the polishing pad 202 per unit time)", no torque is generally applied to the carrier 106.

The output signal observed by one sensor 121 in one rotation of the wafer holding head 101 corresponds to the maximum force Fa, the minimum force Fb, and the forces Fc and Fd observed at the intermediate time. That is, the output signal obtained from one sensor 121 shows a sine wave response. Accordingly, since the rotation time (rotational speed) of the wafer holding head 101 is known, the rotational force T and the polishing force F of the wafer W is detectable with one sensor 121. The rotational force T and the polishing force F can be determined by detecting the signals obtained every moment from one sensor 121 as described above.

The processor 131 allows the polishing force F acting on the wafer W while polishing of the wafer W is going on, by simultaneously receiving the outputs from two sensors 121 and 121 disposed at the positions a and b. Or, calculation of the polishing force F using the equations (1), (2) and (3) is made possible by providing the two sensors 121.

For the purpose above, at least two sensors 121 are provided on the upper face of the carrier 106, besides radially providing the sensors 121 and 121 in opposed relation with each other at an equal distance from the center of rotation of the carrier 106, thereby allowing the polishing force F or the rotational force T to be detectable during polishing of the wafer W.

Simultaneous detection of the polishing force F and the rotational force T is also made possible by disposing a sensor 121 at the position c at right angle to the positions a and b, in addition to the two sensors 121 and 121 disposed at the positions a and b. In other words, the polishing force F can be calculated by the equations (1), (2) and (3), while determining the rotational force T by the equation (4) or (5).

Three sensors 121 are provided on the upper face of the carrier 106 for the purpose above. Further, two of the three sensors are disposed in opposed relation with each other to be an equal distance from the center of rotation of the carrier 106, while the remaining one sensor 121 is disposed at right angle to the two sensors 121, thereby allowing to simultaneously detect the polishing force F and the rotational force T during polishing of the wafer T.

The force acting on the wafer W during polishing of the wafer W is always detectable by providing at least four sensors 121 on the upper face of the carrier 106. When three sensors 121 are provided, there is no sensor 121 at the opposed position (the position c) when, for example, the sensor 121 that has positioned at the position c is transferred to the position a by rotation of the wafer holding head 101. Accordingly, the polishing force F can not be calculated with the processor 131 when three sensors are used.

For the reason above, at least four sensors 121 are provided on the upper face of the carrier 106, two of them being disposed in opposed relation with each other at the positions having an equal distance from the center of rotation along the direction of rotation, while disposing the other two sensors at right angle to the former two sensors 121, thereby allowing the polishing force F and rotational force T to be simultaneously detected while polishing the wafer W.

Providing a plurality of sensors 121, preferably four or more, enables the polishing force F and rotational force T to be simultaneously detected. The polishing force F can be calculated based on respective outputs from the two sensors in opposed relation with each other as shown by the equation (3). This means that, the polishing force F is detectable by radially disposing at least two sensors 121 and 121 in opposed relation with each other at an equal distance relative to the center of rotation of the carrier 106, or by providing an even number of the sensors 121 as a whole.

The wafer W is polished while the polishing force F and the rotational force T are observed. When the wafer has not been sufficiently polished, the force F and the rotational force T as outputs from the processor 131 fluctuate. Therefore, the wafer W is considered to be insufficiently polished and polishing of the wafer W is continued, when the output from the processor 131 is fluctuating.

When the polishing surface of the wafer W has been planarized obtaining a desired polished surface, the polishing force F and the rotational force T as outputs from the processor 131 shows stabilized values. Accordingly, the polishing surface of the wafer W is judged to have attained a desired state when the output from the processor 131 is stabilized showing an approximately constant level. Then, the pressure in the fluid chamber 114 in the wafer holding head 101 is gradually decreased to lower the pressing pressure between the wafer W and the polishing pad 202, thus completing polishing of the wafer W.

The torque acting on the head body 102 is accurately transferred to the carrier 106 to prevent the diaphragm 105 from suffering an excess force along the direction of rotation even in the construction provided with an elastic diaphragm, by providing the torque transfer mechanism 120 on the upper face of the carrier 106. Consequently, the diaphragm is prevented from being deteriorated to enable a stable floating effect to be maintained for a long period of time.

The force acting on the wafer W is directly detected with the sensor 121 via the carrier 106 by providing the sensor 121 on the torque transfer mechanism 120. The conditions on the polishing surface of the wafer W can be correctly judged, because the force acting on the wafer W is observed by the sensor 121 without being affected by the forces acting between the retainer ring 107 and the polishing pad 202, even when the lower face of the retainer ring 107 disposed in concentric relation around the wafer W is in contact with the polishing pad 202.

The force from the plural sensors 121 is calculated by the processor 131, which outputs the force acting on the wafer W during polishing of the wafer W. Consequently, the wafer W is polished while observing the force acting on the wafer W, or while judging whether the polishing surface of the wafer W has attained desired conditions or not. Therefore, possibility of manufacturing the wafers in excess polishing or in insufficient polishing is diminished to realize secure polishing of the wafer W.

The sensor 121 is provided at contact portions between the first member 120a and the second member 120b, thereby the force acting on the wafer W can be securely detected even when the wafer holding head 101 is rotating. Further, since the second member 120b is provided to be able to displace relative to the first member 120a, displacement of the carrier 106 and the retainer ring 107, supported with the diaphragm 105, along the axis line direction is not disturbed to enable the wafer W to be securely polished.

Figure 18:
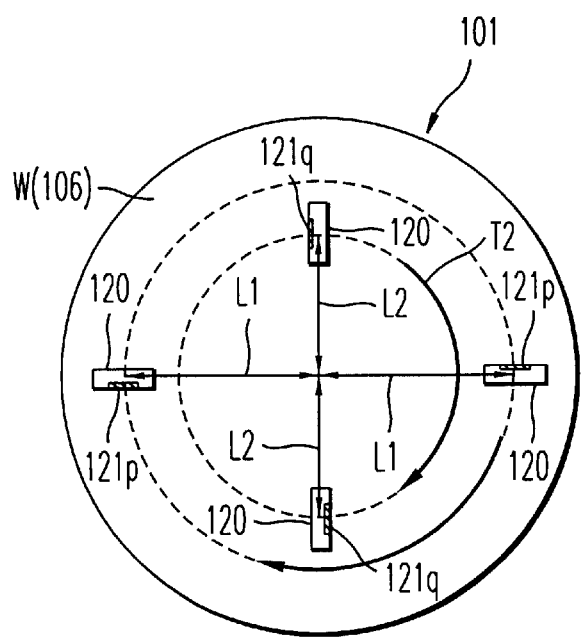
FIG. 18 illustrates the disposition of the carrier torque transfer mechanism and the first sensor in the fourth embodiment.

Although respective plural sensors 121 described above are radially provided at an equal distance from the center of rotation of the carrier 106, they may be disposed so that the distance L1 of a pair of mutually opposed sensors 121p and 121p from the center of rotation of the carrier 106, and the distance L2 of a pair of mutually opposed sensors 121q and 121q from the center of rotation of the carrier 106, may be different with each other as shown in FIG. 18. The sensors 121p and 121p can detect the rotational force T1 at the distance L1, while the sensors 121q and 121q can detect the rotational force T2 at the distance L2. In other words, the rotational forces T1, T2 and so on of the wafer W at various positions can be detected by providing a plural pairs of sensors 121 and 121 in opposed relation with each other.

Figure 19A:
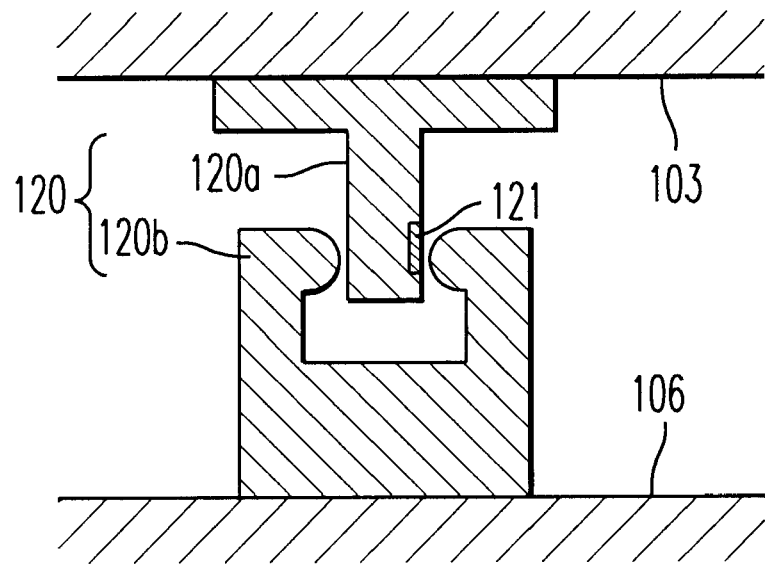
FIG. 19A shows cross sections illustrating the carrier torque transfer mechanism and the first sensor of the wafer polishing apparatus in the fourth embodiment.
Figure 19B:
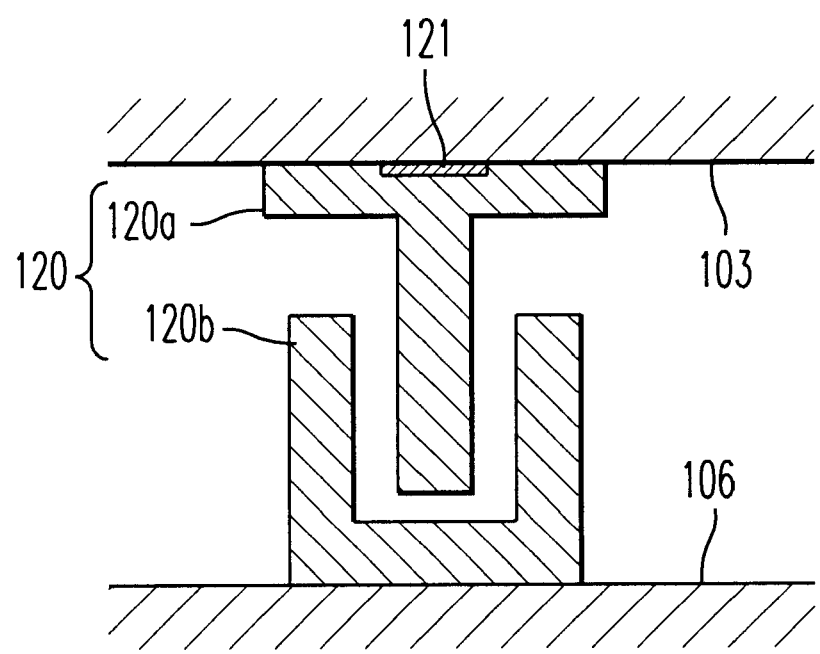
FIG. 19B shows cross sections illustrating the carrier torque transfer mechanism and the first sensor of the wafer polishing apparatus in the fourth embodiment.

As shown in FIG. 19A, either one or both of the contact portions of the first member 120a and the second member 120b may be formed into round rods. Since the contact area can be diminished by forming the first member 120a and the second member 120b into round rods, fluctuation of the carrier 106 along the ascending and descending directions (the floating effect) is stabilized. In addition, it is possible to detect the rotational force acting on the wafer W, or the shear force, by disposing the sensor 121 between the top plate 103 and the first member 120a (or between the carrier 106 and the second member 120b) as shown in FIG. 19B. The shear force is detectable by using a piezoelectric element as the sensor 121. The construction for detecting the shear force using the piezoelectric element allows the forces acting along a plurality of directions to be simultaneously detected using one sensor 121, enabling the number of the sensors 121 to be reduced.

Figure 20:
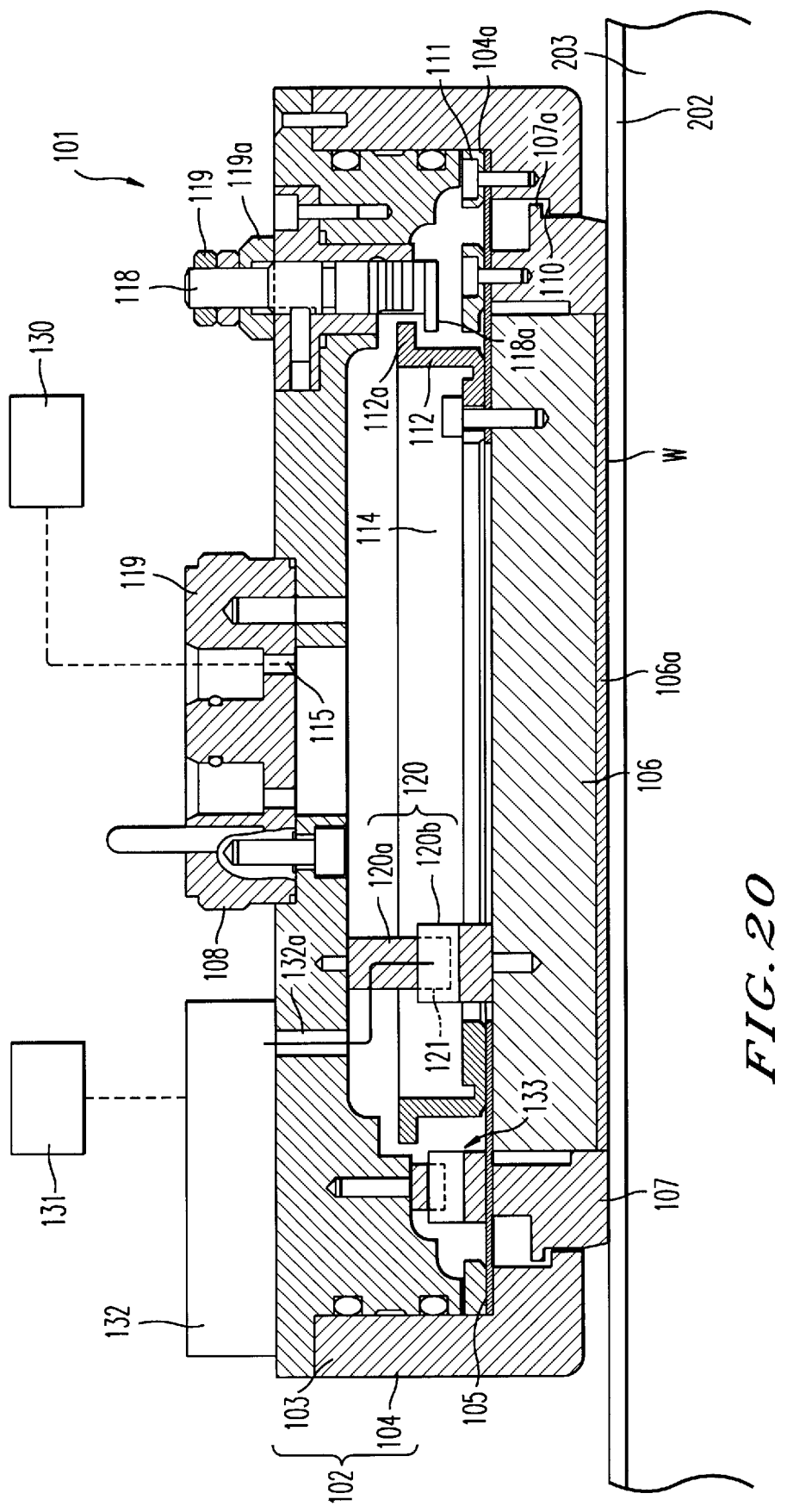
FIG. 20 shows a cross section of the wafer holding head in the drawing showing an another example of the wafer polishing apparatus in the fourth embodiment.

While the sensor 121 is actuated by an actuation circuit of an actuation-amplification circuit unit 132 provided on the upper face of the head body 102 as shown in FIG. 20, the output signal from the sensor 121 may be transferred to the processor 131 via an amplification circuit of the actuation-amplification circuit unit 132. The harness 132a for connecting the sensor 121 to the actuation-amplification circuit unit 132 is provided by penetrating through a part of the top plate 103 of the head body 102.

Since the harness 132a can be shortened by providing the actuation-amplification circuit unit 132 on the head body 102, the sensor 121 is little affected by noises.

While the torque transfer mechanism 120 equipped with the sensor 121 is provided on the upper face of the carrier 106, it is also possible to provide the torque transfer mechanism 133 not equipped with the sensor 121 on the upper face of the retainer ring 107.

When the torque transfer mechanism 133 is provided on the upper surface of he retainer ring 107, the torque acting on the head body 102 is accurately transferred to the diaphragm 105, besides preventing the diaphragm 105 from being affected by the excess force along the direction of rotation. Consequently, the diaphragm 105 is prevented from being deteriorated to enable a stable floating effect to be maintained.

Figure 21A:
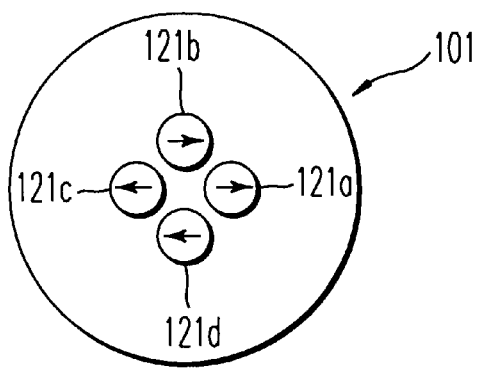
FIG. 21A shows on e example of the wafer polishing apparatus in the fourth embodiment, which illustrates the sensor mounting position and the direction of sensitivity.
Figure 21B:
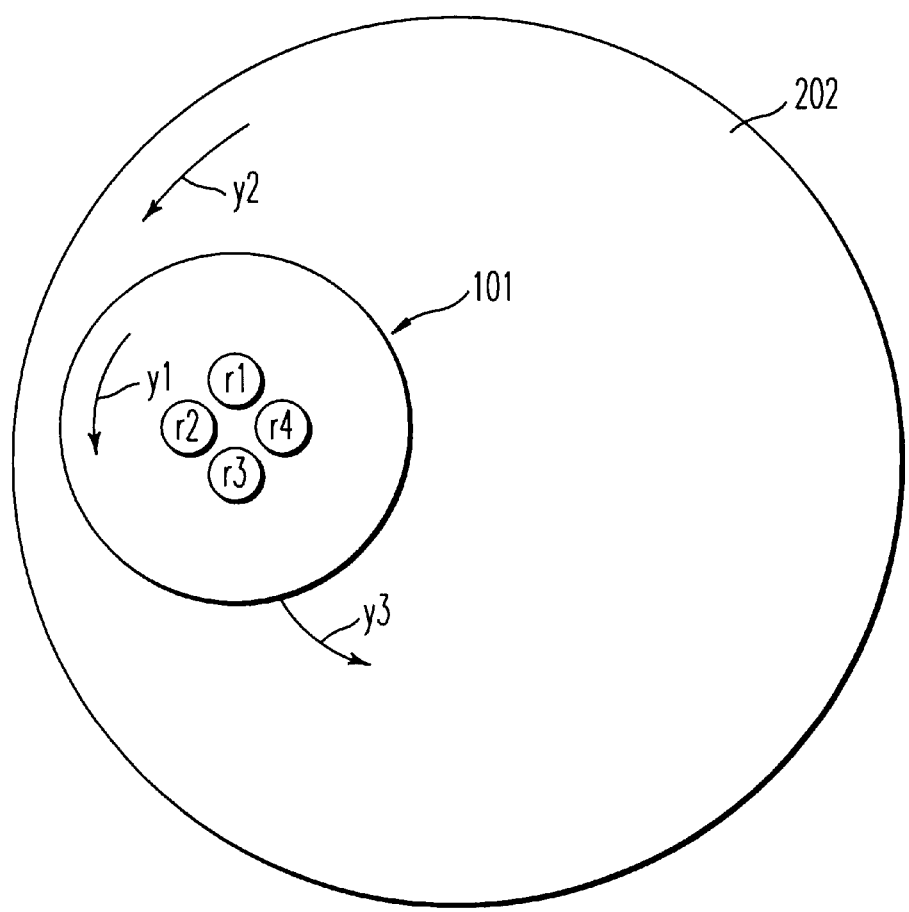
FIG. 21B shows one example of the wafer polishing apparatus in the fourth embodiment, which illustrates the sensor mounting position and the direction of sensitivity.

The example when the wafer W is polished using the wafer holding head according to the present invention will be described hereinafter. The sensitive directions of the four sensors 121a, 121b, 121c and 121d provided on the wafer holding head 101 are indicated by arrows, respectively, in FIG. 21A. The sensitive directions of the sensors 121a and 121a are directed toward the radius direction of the wafer holding head 101, and the sensitive directions of the sensors 121b and 121d are directed toward the direction of rotation of the wafer holding head 101. FIG. 21B shows the disposition of the wafer holding head 101 on the upper surface of the polishing pad 202, and r1, r2, r3 and r4 show the positions of the sensors 121a to 121d, respectively, when the wafer holding head 101 rotates. For example, the sensor 121a is disposed at each position in the order of r1, r2, r3 and r4 by allowing the wafer holding head 101 to rotate along the direction indicated by an arrow y1. The polishing pad 202 rotates along the direction of an arrow y2, and the wafer holding head 101 is allowed to rotate along the direction of an arrow y3 by mean of the carousel.

Figure 22A:
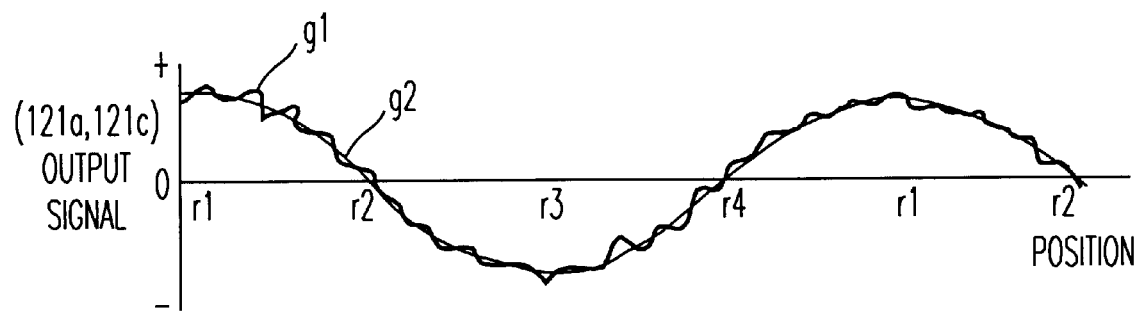
FIG. 22A is a graph showing one example of the wafer polishing apparatus in the fourth embodiment, which describes the output signal from the first sensor.

A sine wave output signal g1 containing high frequency components is emitted, for example, from the sensors 121a and 121c as shown in FIG. 22A by polishing the wafer W. The output signal g1 is converted into an output signal g2 after passing through a low-path filter provided in the processor 131. The polishing conditions of the wafer W is read by reading the change of the maximum value of the output signal g2.

Figure 22B:
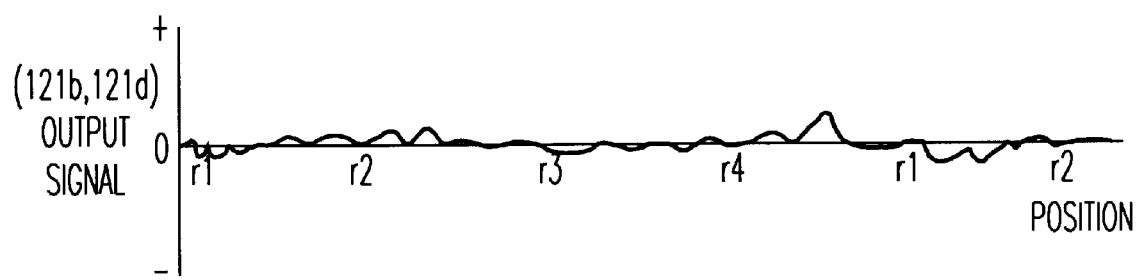
FIG. 22B is a graph showing one example of the wafer polishing apparatus in the fourth embodiment, which describes the output signal from the first sensor.
Figure 22C:
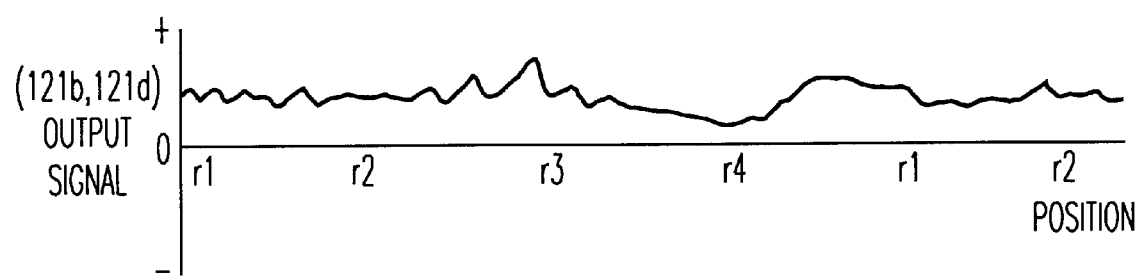
FIG. 22C is a graph showing one example of the wafer polishing apparatus in the fourth embodiment, which describes the output signal from the first sensor.

The sensors 121b and 121d output, on the other hand, the waves as shown in FIGS. 22B and 22C. The relation "the number of rotation of the carousel per unit time"+"the number of rotation of the wafer holding head 101 per unit time"="the number of rotation of the polishing pad 202 per unit time" is valid in the waveform shown in FIG. 22B, wherein the observed values are approximately zero since no torque is acting on the carrier 106 as described previously. FIG. 22C shows a waveform when the relation as described above is not valid, thereby the sensors 121b and 121d output a waveform corresponding to these values since a torque applied to the carrier 106.

FIGS. 13-A1 and 13-B1 show the construction of the two kinds of wafers W1 and W2 to be polished. The wafers W1 shown in FIG. 13-A1 is to be polished so as to bury Cu into the grooves in the $SiO_2$ layer (or the $SiO_2$ layer may be replaced with a low dielectric constant material), wherein the polishing end point is determined when the barrier metal layer is exposed to the surface by polishing the Cu layer to planarize the barrier metal layer together with the Cu layer. The wafer W2 shown in FIG. 13-B1 is, on the other hand, to be polished so as to planarize the oxide film, wherein the polishing end point is judged when the oxide film has been planarized. FIGS. 13-A2 and 13-B2 show the outputs from the processor 131 in the polishing procedures as described above, showing the maximum variations of the respective output signals g2.

The frictional force increases in the wafer W1, since the Cu layer to be polished is gradually planarized to increase the contact area against the polishing pad 202, thereby the output signal gradually increases as shown in FIG. 13-A2. When the Cu layer is more polished to expose the barrier metal layers on the surface, the output signal rapidly decreases since the barrier metal layer has a lower coefficient of friction than the Cu layer. Polishing is completed when the rapid decrease of the output signal has been detected.

The oxide film is planarized at the polishing end point in the wafer W2. Accordingly, polishing is completed when the oxide film is planarized and the maximum value of the output signal has been stabilized for a given time. In other words, polishing is completed when the output signal has been stabilized for a given time by continuing polishing after the planarization time h1 as shown in FIGS. 13-B1 and 13-B2.

[Fifth Embodiment]

Figure 23:
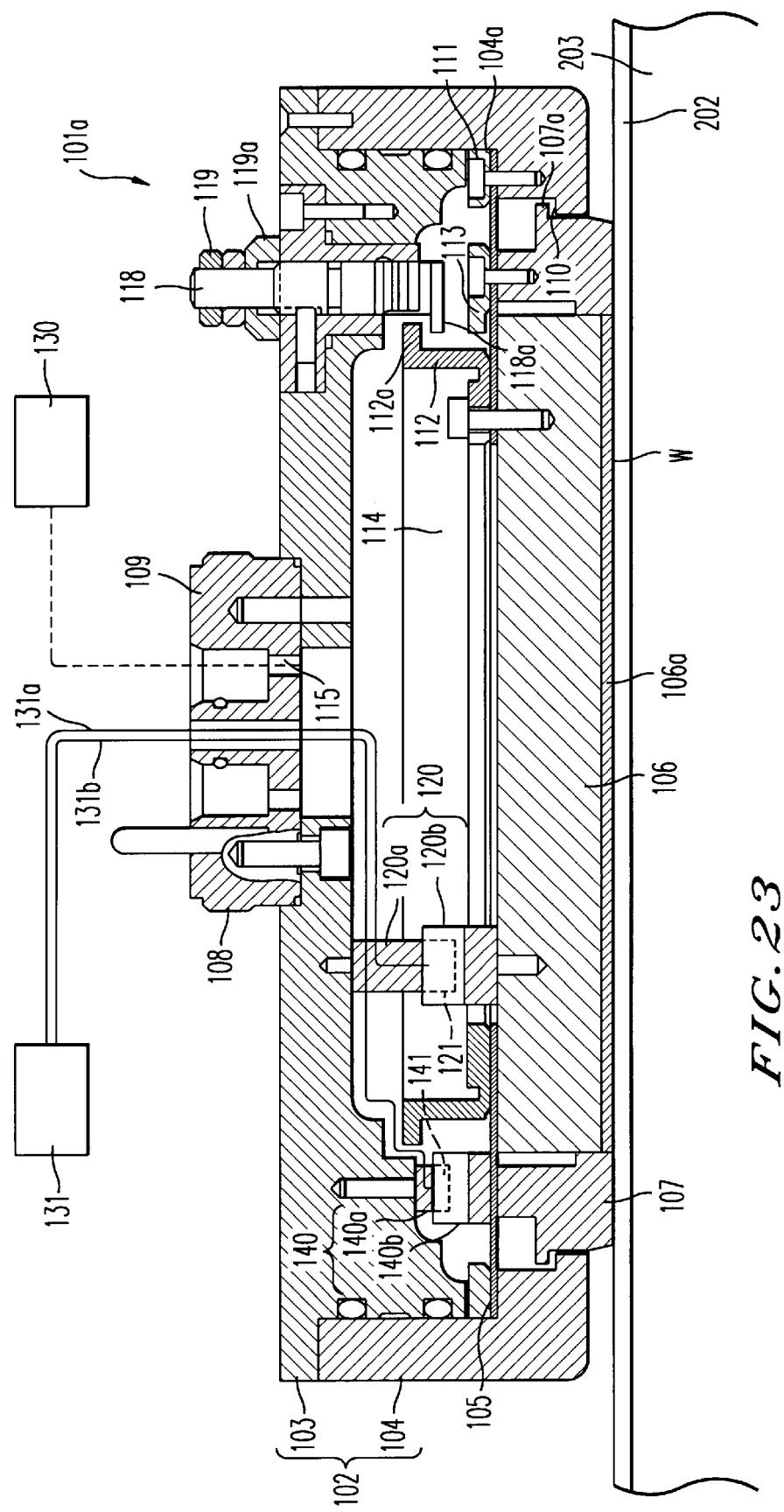
FIG. 23 shows a cross section of the wafer holding head in the drawing showing the wafer polishing apparatus according to the fifth embodiment of the present invention.

The wafer polishing apparatus and the method for polishing the wafer according to one embodiment of the present invention will be described hereinafter with reference to the drawings. FIG. 23 shows a cross section of the wafer holding head 101a in one embodiment according to the present invention. The wafer holding head in this embodiment has an approximately the same construction as in the wafer holding head 101 as shown in the fourth embodiment, wherein a plurality of the ring torque transfer mechanisms are provided on the upper face of the retainer ring 107 in the wafer holding head 101. Among the construction members in the wafer holding head 101a, the members having approximately the same constructions as in the wafer holding head 101 will be described using the same reference numerals.

The ring torque transfer mechanism 140 is provided with a plate-shape first member 140*a* formed so as to expand to the downward from the bottom of the top plate 103 along the circumference direction, and a second member 140*b* having a U-shaped cross section provided on the upper face of the retainer ring 107 via a diaphragm 105. The first member 140*a* and the second member 140*b* are disposed with their planarized portions toward the circumference direction, and the tip of the first member 140*a* is disposed within the U-shape of the second member 140*b*.

The tip of the first member 140*a* is a distance apart from the U-shaped inside of the second member 140*b* is as not disturb displacement of the retainer ring 107 along the axis line direction. The second member 140*b* is provided to be able to displace together with the retainer ring 107 along the axis direction relative to the first member 140*a*.

Figure 24:
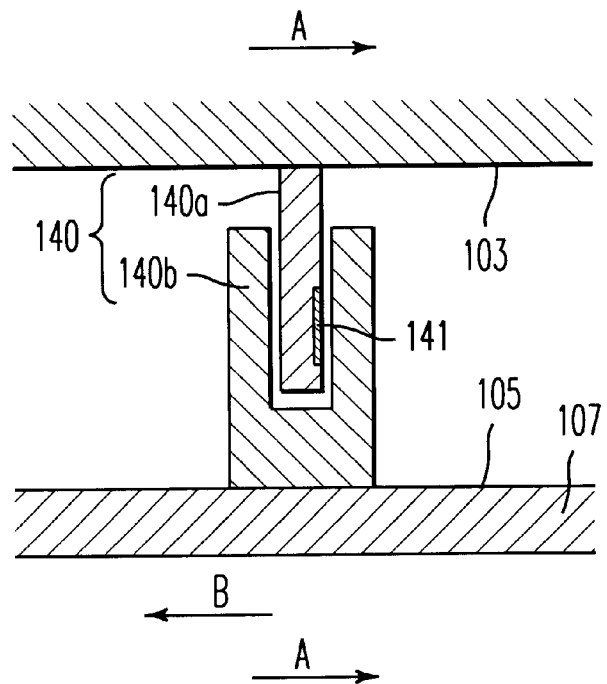
FIG. 24 shows a cross section for illustrating the torque transfer mechanism and the sensor of the wafer polishing apparatus according to the fifth embodiment.

The torque transfer mechanism 140 is provided for transferring the torque applied to the head body 102 to the retainer ring 107 when the head body 102 rotates during polishing the wafer W. When the head body 102 rotates along the direction indicated by an arrow A in FIG. 24 during polishing of the wafer W, the retainer ring 107 supported with the diaphragm 105 is allowed to rotate along the direction indicated by an arrow A while being twisted at the side indicated by an arrow B due to a frictional force between the lower face of the retainer ring and the polishing pad 202. The torque acting on the head body 102 is transferred to the retainer ring 107, while reducing the force acting on the diaphragm 105 along the twist direction by allowing one side of the first member 140*a* to contact the U-shaped inside of the second member 140*b*. The first member 140*a* and the second member 140*b* are relatively slidable with each other so as not to inhibit the floating effect of the retainer ring 107.

A second sensor 141 is provided on a part of the side face of the first member 140*a*. The second sensor 141 is provided to be parallel to the plane of the second member 140*b* directed toward the direction of rotation, and at the side where the sensor is pressed into the second member 140*b* when the wafer holding head 101*a* rotates.

The surface of the second sensor 141 is placed to be a slight distance apart from the inside of the second member 140*b* so that fluctuation of the retainer ring 107 is not disturbed, when the wafer holding head 101*a* is not rotating, in the ring torque transfer mechanism 140. The second sensor 141 is provided so that one side of the first member 140*a* where the second sensor 141 is provided is pressed to the inner face of the second member 140*b* when the wafer holding head 101*a* rotates.

A pressure sensor such as a piezoelectric element and a distortion gauge is used for the second sensor 141, to enable the pressing force between the first member a and the second member b caused by rotation of the wafer holding head 101*a* to be detected. The force, acting on the lower face of the retainer ring 107 by the friction with the polishing pad 202 during polishing of the wafer W, is directly detected with the second sensor 141.

A plurality of the torque transfer mechanisms 120 and the sensors 121 are provided on the upper face of the carrier 106 in the wafer holding head 101*a*, as in the wafer holding head 101. The torque transfer mechanisms 120 is defined to be a carrier torque transfer mechanisms 120, and the sensor 121 is defined to be a first sensor 121 hereinafter, in order to distinguish them from the torque transfer mechanism 140 and from the second sensor 141, respectively.

The surface of the second sensor 141 may slightly contact the inside of the second member 140*b* so as not to disturb fluctuation of the retainer ring 107 along the axis direction, when the wafer holding head 101 is not rotating. The second sensor 141 may be provided at the portion that is pressed by rotation of the wafer holding head 101, for example at the planer portion at the side of the second member 140*b*. The first member 140*a* may be formed to have a U-shaped cross section and the second member 140*b* may be formed into a plate shape, or both of the first and second members 140*a* and 140*b* may be formed into plate shapes, respectively.

Figure 25:
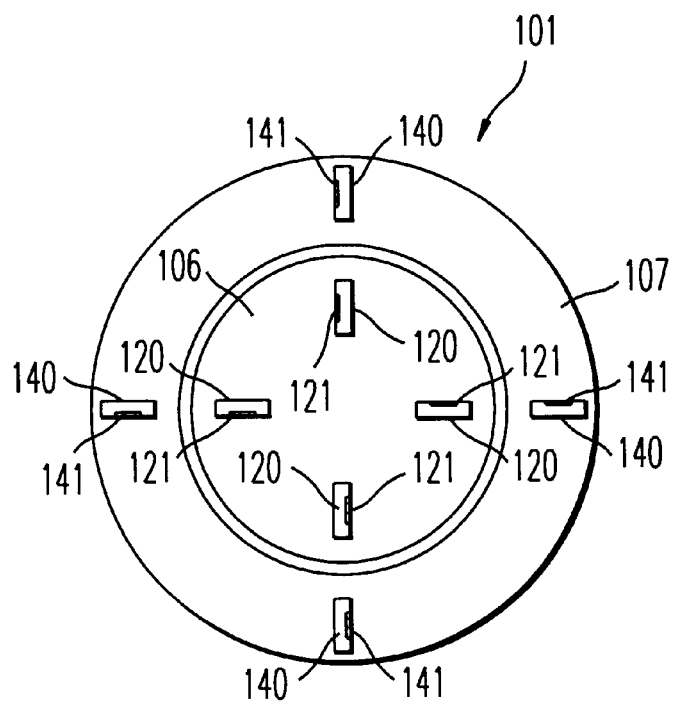
FIG. 25 illustrates the disposition of the torque transfer mechanism and the sensor of the wafer polishing apparatus according to the fifth embodiment.

The ring torque transfer mechanism 140 provided with the second sensor 141 is provided at plural sites along the circumference direction, actually at four sites with a same distance from the center of the rotation axis along the radius direction, on the upper surface of the retainer ring 107 of the wafer holding head 101 as shown in FIG. 25. Likewise, the carrier torque transfer mechanism 120 provided with the first sensor 121 is also provided at plural sites, for example at four sites with a same distance from the center of the rotation axis along the radius direction.

Respective second sensors 141 are connected to an processor 131 by harnesses 131*b* penetrating through the shaft 109 coupled with a spindle. The output signal from each second sensor 141 is sent to the processor 131 trough the harness 131*b* coupled to each sensor. The processor 131 receives the out put signal from each second sensor 141, and outputs a force acting between the lower surface of the retainer ring 107 and the polishing pad 202. Likewise, the output signal from the first sensor 121 is transferred to the processor 131, which outputs the force acting on the wafer W by receiving the output signal from each first sensor 121.

The wafer holding head 101*a* having the construction as described above is coupled by screwing its external thread 108 into the carousel. Other coupling structures other than using the external thread 108 may be adopted. When the wafer W is polished using the wafer holding head 101*a*, the wafer W is at first adhered on a wafer adhering sheet 106*a* provided at the lower face of the carrier 106. The surface of the wafer is allowed to contact the polishing pad 202 adhered on the upper face of a platen 203, while the periphery of the wafer W is locked with a retainer ring 107. Any materials that have been used for polishing the wafer may be used for the polishing pad 202, examples of them including a velour type pad prepared by impregnating a nonwoven fabric comprising polyester with a soft resin such as polyurethane, a suede type pad prepared by forming a resin foam layer comprising polyurethane foam on a substrate such as a polyester nonwoven fabric, or a resin foam sheet comprising independently foamed polyurethane.

Subsequently, a fluid such as air is supplied from the pressure adjusting mechanism 130 through the flow path 115 into the fluid chamber 114. The flow-in fluid flow adjusts the pressure in the fluid chamber 114, and controls the pressing pressure of the carrier 106 and the retainer ring 107 to the polishing pad 202. The carrier 106 and the retainer ring 107 assume floating structures, by which the carrier and the retainer ring are able to independently shift along the upper and lower directions with each other, supported with the diaphragm 105, and the pressing pressure to the polishing pad 202 is adjustable by the pressure in the fluid chamber 114.

The pressing pressure of the carrier 106 and the retained ring 107 to the polishing pad 202 is controlled, and the wafer ring is polished by allowing the platen to rotate, and the wafer holding head 101*a* to undergo a planetary motion, while feeding an slurry onto the surface of the polishing pad 202 and polishing face of the wafer W.

The carrier 106 and the retainer ring 107 holding the wafer W are twisted relative to the head body 102 by the force acting between the wafer W to be polished and the bottom face of the retainer ring 107, and the polishing pad 202. Then, the second sensor 141 and the first sensor 121 provided on the ring torque transfer mechanism 140 and the carrier torque transfer mechanism 120, respectively, are pressed onto the plane portion inside of the second members 140b and 120b to emit signals corresponding to the pressing pressure. In other words, the second sensor 141 transfers an output signal corresponding to the force acting between the bottom face of the retainer ring 107 and the polishing pad 202, and the first sensor 121 transfers an output signal corresponding to the force acting between the wafer W and the polishing pad 202, each independently, to the processor 131. The processor 131 calculates the force acting on the retainer ring 107 and the force acting on the wafer W, each independently, based on the output signals from plural second sensors and from plural first sensors 121, respectively.

Figure 26:
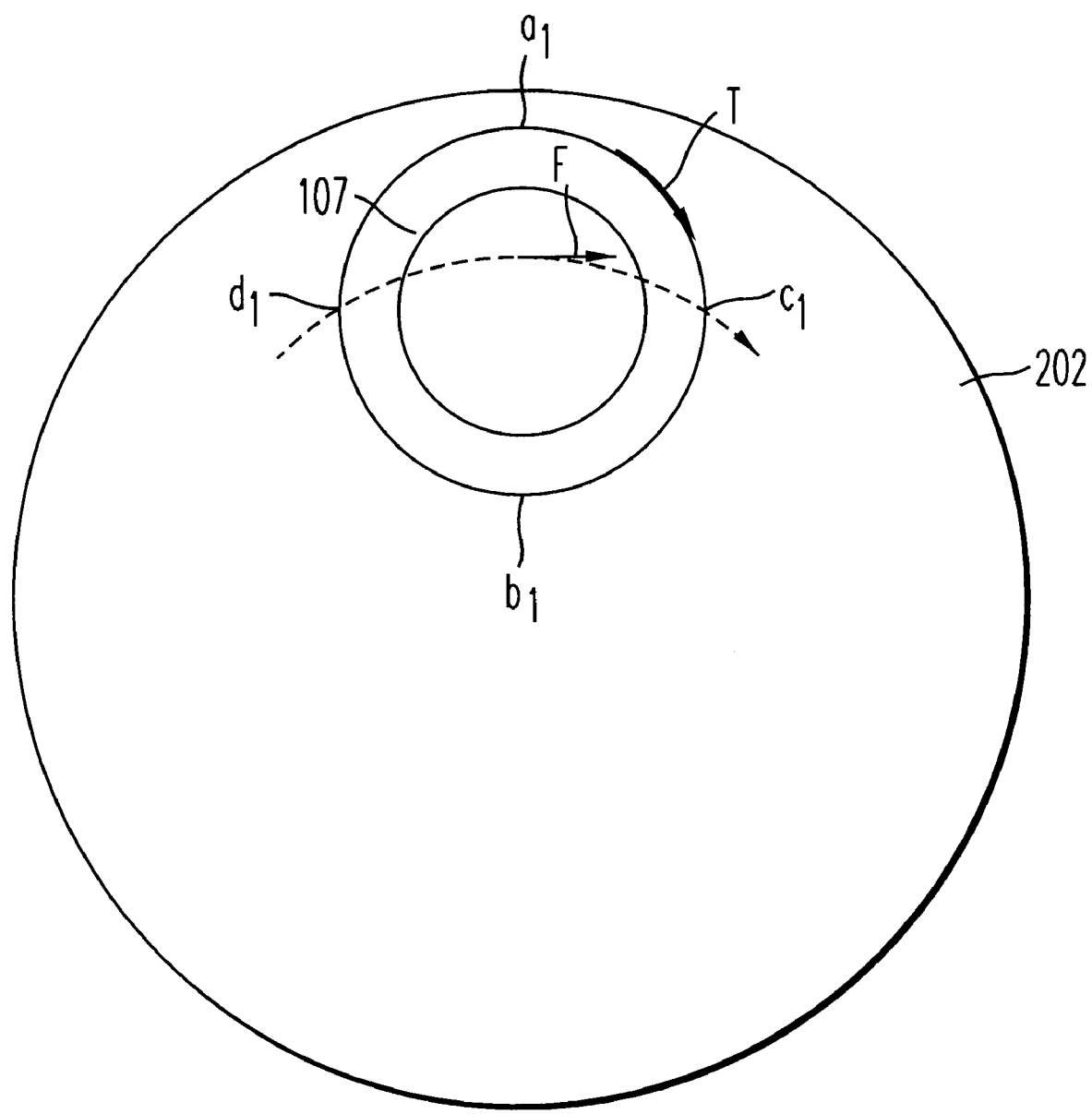
FIG. 26 describes the manner for detecting the force acting on the wafer with the sensor in the fifth embodiment.

For example, the rotational force T along the direction of rotation generated by rotation on the polishing pad 202, and the polishing force F along the direction of rotation of the polishing pad 202 generated by rotation of the polishing pad 202, act on the retainer ring 107 as shown in FIG. 26. The processor 131 is designed to calculate these rotational force T and polishing force F.

The rotational force T, generated by rotation of the wafer holding head 101a, acts along the direction of rotation of the retainer ring, and has different values at the inner diameter side and at the outer diameter side. The polishing force F, generated by rotation of the polishing pad 202, uniformly acts along the direction of rotation of the polishing pad 202 on the entire bottom face of the retainer ring 107.

The polishing force F acts on the entire contact face between the retainer ring 107 and the polishing pad 202, and is considered to be a resultant of forces acting at the center of the retainer ring 107 as shown in FIG. 26. The force acting on the retainer ring 107 by rotation of the polishing pad 202 is represented by F/2, at the position a1 where the tangent direction of the rotating retainer ring 107 and the direction of rotation of the polishing pad 202 coincide on the outer circumference part of the retainer ring 107. The rotational force T also act along the direction of rotation of the retainer ring 107. Since respective sensitive directions of the four second sensors 141 provided along the circumference direction of the retainer ring 107 are directed toward the direction of rotation of the wafer holding head 101a, the force Fra acting on the second sensor 141, disposed at the position a1 among the four sensors, is represented by the following equation:

$$Fra = F/2 + T \quad (6)$$

Likewise, the force Frb acting on the second sensor 141, disposed at the position b1 among the four sensors, is represented by the following equation:

$$Frb = F/2 - T \quad (7)$$

Accordingly, the polishing force F is determined from the equations (6) and (7):

$$Fra + Frb = F \quad (8)$$

The second sensor 141, disposed at the position a1 along the direction of rotation of the polishing pad 202 and at right angle to the positions a1 and b1, is provided with its sensitive direction along the direction of rotation of the wafer holding head 101a. Accordingly, the sensor only detect the rotational force T generated by rotation of the wafer holding head 101a. In other words, since the sensitive direction of the second sensor 141 is at right angle to the direction of rotation of the polishing pad 202 at the position c1, the second sensor 141 does not detect the polishing force F generated by the relative notion between the wafer holding head 101a and the polishing pad 202. Accordingly, the force Frc acting on the second sensor 141 disposed at the position c1 is represented as follows:

$$Frc = T \quad (9)$$

Likewise, the force Frd acting on the second sensor 141 disposed at the position d1 is represented as follows:

$$Frd = T \quad (10)$$

Therefore, the rotational force T and the polishing force F acting on the retainer ring 107 can be calculated from the equation (8), and the equation (9) or (10).

In general, the carrier 106 experiences no torque when Rc, Rh and Rp satisfy the following equation:

$$Rc + Rh = Rp \quad (11)$$

wherein Rc represents the number of rotation of the carousel per unit time, Rh represents the number of rotation of the wafer holding head 101a per unit time, and Rp represents the number of rotation of the platen 203 per unit time.

One second sensor 141 outputs a sine wave signal containing the maximum force Fra, the minimum force Frb, and the force Frc and Frd observed in the intermediate time between output of the maximum force and minimum force, in one rotation of the wafer holding head 101a. Since the rotation time (rotational speed) of the wafer holding head 101a is known, the rotational force T and the polishing force F are detectable with one second sensor 141. Accordingly, the rotational force T and the polishing force F can be calculated by detecting the signals emitted from one second sensor 141 every moment.

When two sensors 141 and 141 are provided at the positions a1 and b1, the processor 131 that simultaneously receives these output signals detects the polishing force F while polishing the wafer W. In other words, the polishing force F is enabled to be calculated from the equations (6), (7) and (8) by providing two second sensors 141. Accordingly, the polishing force F or the rotational force T are detectable during polishing of the wafer W, by providing at least two second sensors 141 on the upper face of the retainer ring 107, besides radially providing these second sensors 141 and 141 at an equal distance in an opposed relation with each other.

When the second sensors 141, 141 and 141 are disposed at the positions a1 and b1, and at the position c1 at right angle to the positions a1 and b1, respectively, the polishing force F and the rotational force T can be calculated from the equations (6), (7) and (8), and from the equation (9) or (10), respectively. The polishing force F and the rotational force T are simultaneously detectable while polishing the wafer by providing three second sensors 141 on the upper face of the retainer ring 107, wherein two of these three sensors are radially disposed at an equal distance from the center of rotation in an opposed relation with each other, and the remaining one sensor is disposed at right angle to the two second sensors 141.

Also, the polishing force F and the rotational force T are simultaneously detectable while polishing the wafer by providing at least four second sensors 141 on the upper face of the retainer ring 107, wherein two of these four sensors are radially disposed at an equal distance from the center of rotation in an opposed relation with each other, and the remaining two sensors are disposed at right angle to the two second sensors 141.

The polishing force F and the rotational force T are simultaneously detectable by providing a plurality of the second sensors 141, preferably four second sensors 141. As shown by the equation (8), the polishing force F is calculated based on respective outputs from the two second sensors 141. Accordingly, the polishing force F is detected by radially disposing at least two second sensors 141 at an equal distance in an opposed relation with each other with reference to the center of rotation of the retainer ring 107, or by providing the second sensors 141 at even numbers of sites as a whole.

As hitherto described, the processor 131 calculates the force acting on the wafer W held on the bottom face of the carrier 106 based on the output signals from the first sensor 121 provided on the upper face of the carrier 106 (the force acting on the wafer can be determined by the same method as described in the fourth embodiment). The processor 131 therefore simultaneously and independently calculates the force acting on the lower face of the retainer ring 107 and the force acting on the wafer W.

The example for planarizing the wafer W1 provided with an oxide film as shown in FIG. 13-B1 will be described hereinafter. The wafer W1 should be polished so as to planarize the oxide film having a rough surface up to the time h2 after passing through the time h1. The polishing end point in this case is when the oxide film on the wafer W1 has been planarized. The processor 131 calculates a detected value g3, based on the output from the second sensor 141 provided in the ring torque transfer mechanism 140, and a detected value g4 based on the output from the first sensor 121 provided in the torque transfer mechanism 120.

When the wafer is polished before the polishing pad 202 has been deteriorated, the contact area between the wafer W1 and the polishing pad 202 gradually increases to slowly increase polishing resistance of the wafer W1 in the time interval from the start of polishing to the time h1. In the time interval from the time h1 to the time h2, polishing resistance becomes constant since the contact area between the wafer W1 and the polishing pad 202 is constant.

Figure 27A:
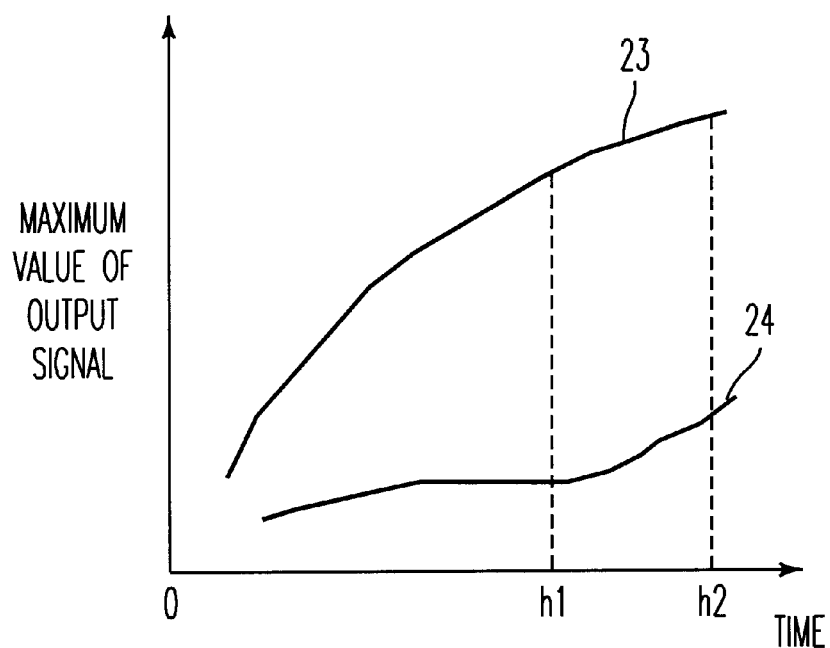
FIGS. 27A shows a graph for describing the results of output from the processor in polishing the wafer shown in FIG. 13-B1.

When the wafer W1 is polished after the polishing pad 202 has been deteriorated, the detected value g4 based on the output of the first sensor 121 gradually increases in the time interval from the time h1 to the time h2 as shown in FIG. 27A, and the detected value g3 based on the output of the second sensor 141 also simultaneously increases. The fact above shows that, since the polishing pad 202 is gradually deteriorated while polishing the wafer W, polishing resistance acting between the lower face of the retainer ring 107 and the polishing pad 202 gradually increases. Consequently, the detected value g4 corresponding to polishing resistance of the wafer W1 also increases in the time interval from the time h1 to the time h2, making it difficult to determine the polishing end point.

The detected values g3 and g4 show the maximum variations of the output signals from the sensors 141 and 121, respectively.

Figure 27B:
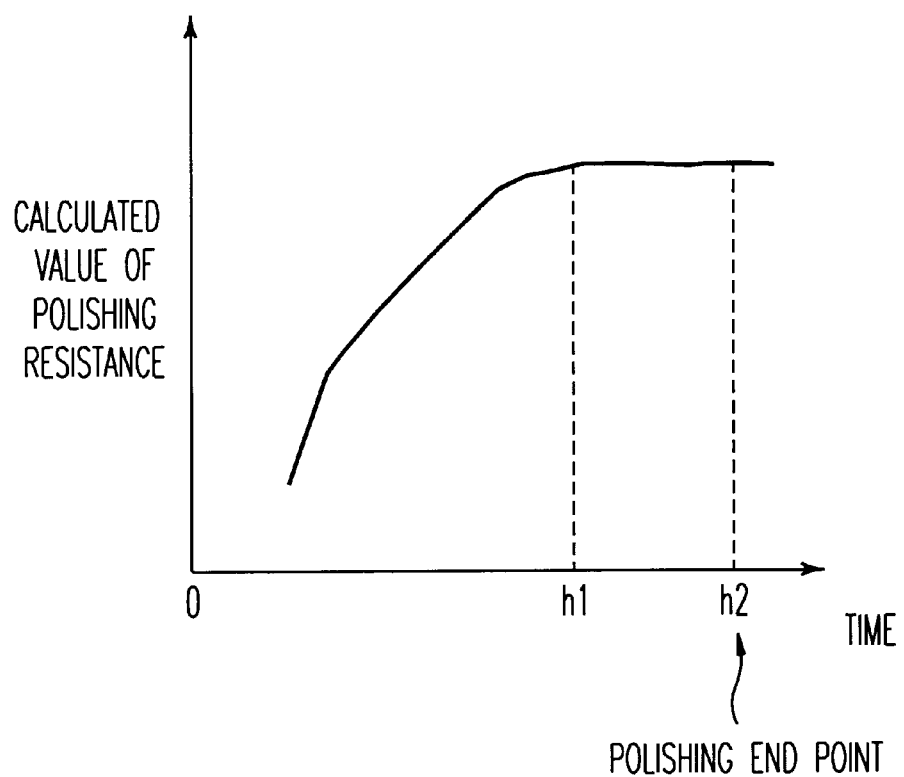
FIGS. 27B shows a graph for describing the results of output from the processor in polishing the wafer shown in FIG. 13-B1.

The polishing states of the wafer W1 can be recognized by correcting the detected values from the first sensor 121 that is observing polishing resistance of the wafer W1, based on changes of the surface state of the polishing pad 202, or based on changes in polishing resistance of the retainer ring 107 that is allowed to rotate by making direct contact with the polishing pad 202. When the rate of change of polishing resistance (or the rate of change of the detected value g3) ascribed to deterioration of the polishing pad 202 is subtracted from the polishing resistance value (or the detected value g4) containing the above rate of change, the calculated values in the time interval from the time h1 to the time h2 show a constant value as shown in FIG. 27B, making it possible to accurately detect the polishing end point.

When the polishing face of the wafer W has been planarized obtaining a desired polished face (or when reaching to the time h2), the polishing surface of the wafer W is judged to be in a desired state, thus completing polishing of the wafer W.

Deterioration of the polishing pad 202 is detectable while polishing the wafer, by providing the second sensor 141 in the ring torque transfer mechanism 140 provided on the upper face of the retainer ring 107 to detect the force acting on the retainer ring 107 making contact with the polishing pad 202. Work efficiency is improved since deterioration is detected while polishing the wafer. The diaphragm 105 is also prevented from being deteriorated, since the diaphragm 105 is prevented from suffering an excess force acting along the direction of rotation, by accurately transferring the torque acting on the head body 102 to the retainer ring 107 through the torque transfer mechanism 140.

The torque acting on the head body 102 is accurately transferred to the carrier 106 to prevent the diaphragm 105 from suffering an excess force along the direction of rotation, by providing the torque transfer mechanism 120 on the upper face of the carrier 106. Consequently, the diaphragm 105 is prevented from being deteriorated to maintain a stable floating effect for a long period of time.

The forces acting on the bottom face of the retainer ring 107 and the wafer W are directly detected with the sensors 141 and 121, respectively, by providing the second sensor 141 and the first sensor 121 in the ring torque transfer mechanism 140 and the carrier torque transfer mechanism 120, respectively. The force acting on the carrier 106 holding the retainer ring 107 and the wafer W can be directly and accurately detected, by directly detecting the force acting on the lower face of the retainer ring and on the wafer.

The polishing resistance of the wafer W, obtained by subtracting the rate of change ascribed to deterioration of the polishing pad 202, can be calculated with the processor 131 using the transferred output signals from the sensors 141 and 121, thereby allowing the polishing end point to be accurately detected.

The outputs from the second sensor 141 and the first sensor 121 are calculated with the processor 131, which outputs the forces acting on the retainer ring 107 and wafer W during polishing of the wafer W. Accordingly, the wafer W is polished while judging whether the polishing surface of the wafer W has reached to a desired state or not through observation of the force acting on the wafer W. Consequently, possibility of manufacturing the wafers in excess polishing or in insufficient polishing is diminished to realize secure polishing of the wafer W.

The force acting on the wafer W is securely detected even when the wafer holding head 102 is rotating, because the sensor 141 (121) is provided at the contact portion between the first member 140a (120a) and the second member 140b (120b). In addition, since the second member 140b (120b) is able to displace relative to the first member 140a (120a), displacement of the carrier 106 and the retainer ring 107, supported with the diaphragm 105, along the axis line direction is not disturbed to stabilize polishing of the wafer W.

While the plural sensors 141 (121) are radially provided with an equal distance with each other from the center of rotation of the wafer holding head 101a, the distance of a pair of the sensors, in an opposed relation with each other, from the center of rotation, and the distance of an another pair of the sensors, in an opposed relation with each other, from the center of rotation, may be different with each other, thereby allowing each sensor to detect the rotational force T at a given distance. In other words, providing plural pairs of the sensors in an opposed relation with each other allows the rotational force at various sites along the radius direction of the wafer W to be detected.

Figure 28A:
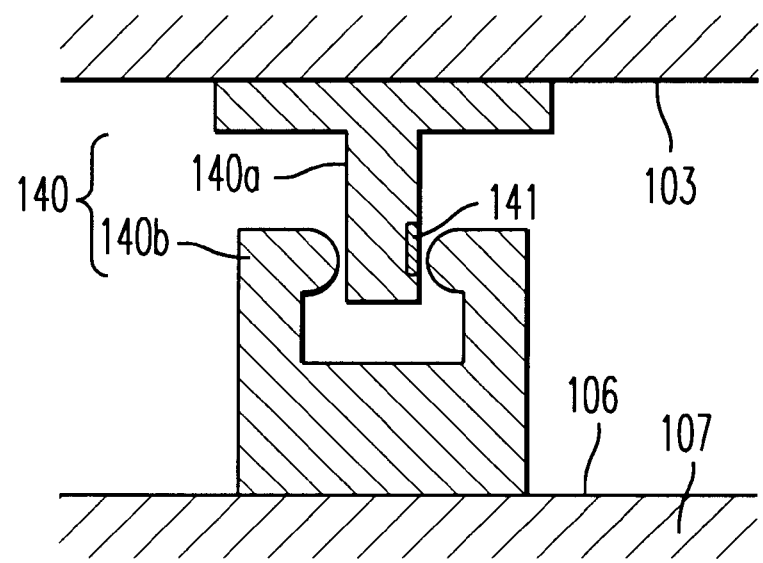
FIG. 28A shows an another example of the torque transfer mechanism and the sensor in the fifth embodiment.
Figure 28B:
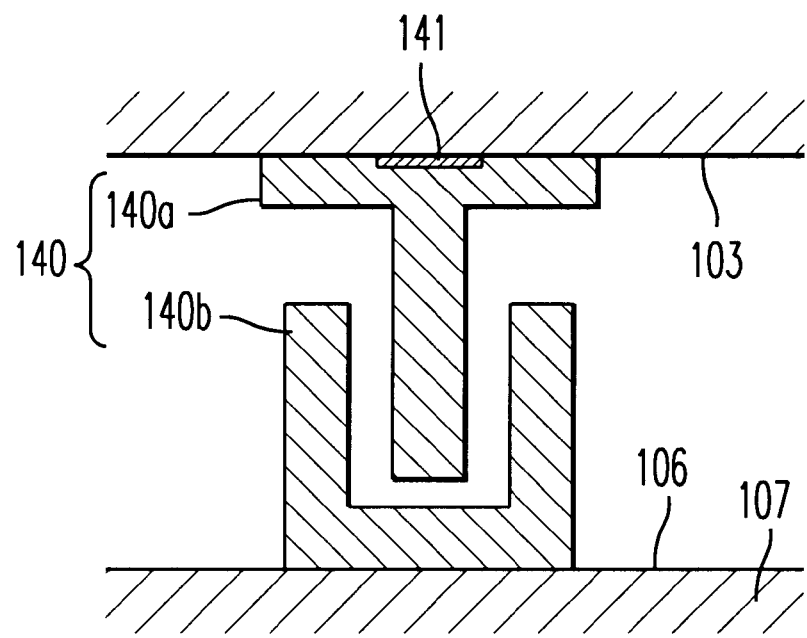
FIG. 28B shows an another example of the torque transfer mechanism and the sensor in the fifth embodiment.

It is possible to form either one of the contact portions of the first and second members 140a and 140b, or both of them, into a rod shape. Since the contact force can be reduced by forming the first and second members 140a and 140b into a rod shape, fluctuation of the retainer ring 107 along the ascending and descending directions (the floating effect) is more stabilized. It is also possible to detect the force acting on the wafer W along the direction of rotation using the shear force generated at the site where the second sensor 141 is disposed between the top plate 103 and the first member 140a (or between the retainer ring 107 and the second member 140b) as shown in FIG. 28B. The shear force is detectable by using a piezoelectric element as the second sensor 141. Detecting the shear force using the piezoelectric element allows the forces acting along the plural directions to be simultaneously detected with one second sensor 141, allowing the number of the second sensors 141 to be provided to be decreased. It is needless to say that the configuration shown in FIG. 28 may be also applied to the carrier torque transfer mechanism 120.

Figure 29:
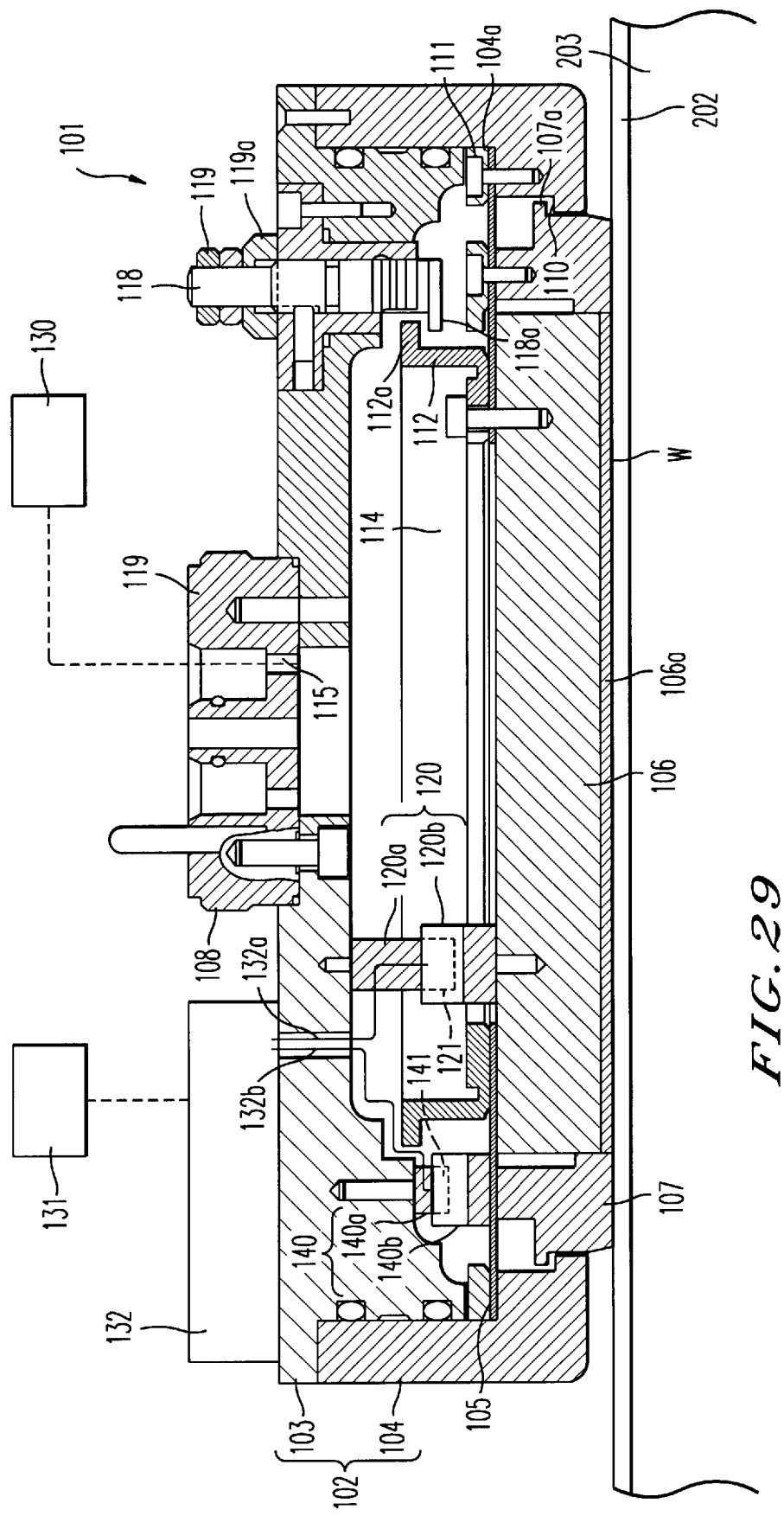
FIG. 29 shows a cross section of the wafer holding head in the drawing showing an another example of the wafer polishing apparatus in the fifth embodiment.

The second sensor 141 may be actuated by an actuation circuit of an actuation-amplification circuit unit 132 provided on the upper face of the head body 102 as shown in FIG. 29, and the output signal from the second sensor 141 may be transferred to the processor 131 via an amplification circuit of the actuation-amplification circuit unit 132. The harness 132b for connecting the second sensor 141 to the actuation-amplification circuit unit 132 is provided by penetrating through a part of the top plate 103 of the head body 102. Likewise, the first sensor 121 provided in the carrier torque transfer mechanism 120 is connected to the actuation-amplification circuit unit 132 via the harness 132a. Since the harnesses 132a and 132b can be shortened by providing the actuation-amplification circuit unit 132 on the head body 102, the sensor 141 is little affected by noises.

[Sixth Embodiment]

Figure 30:
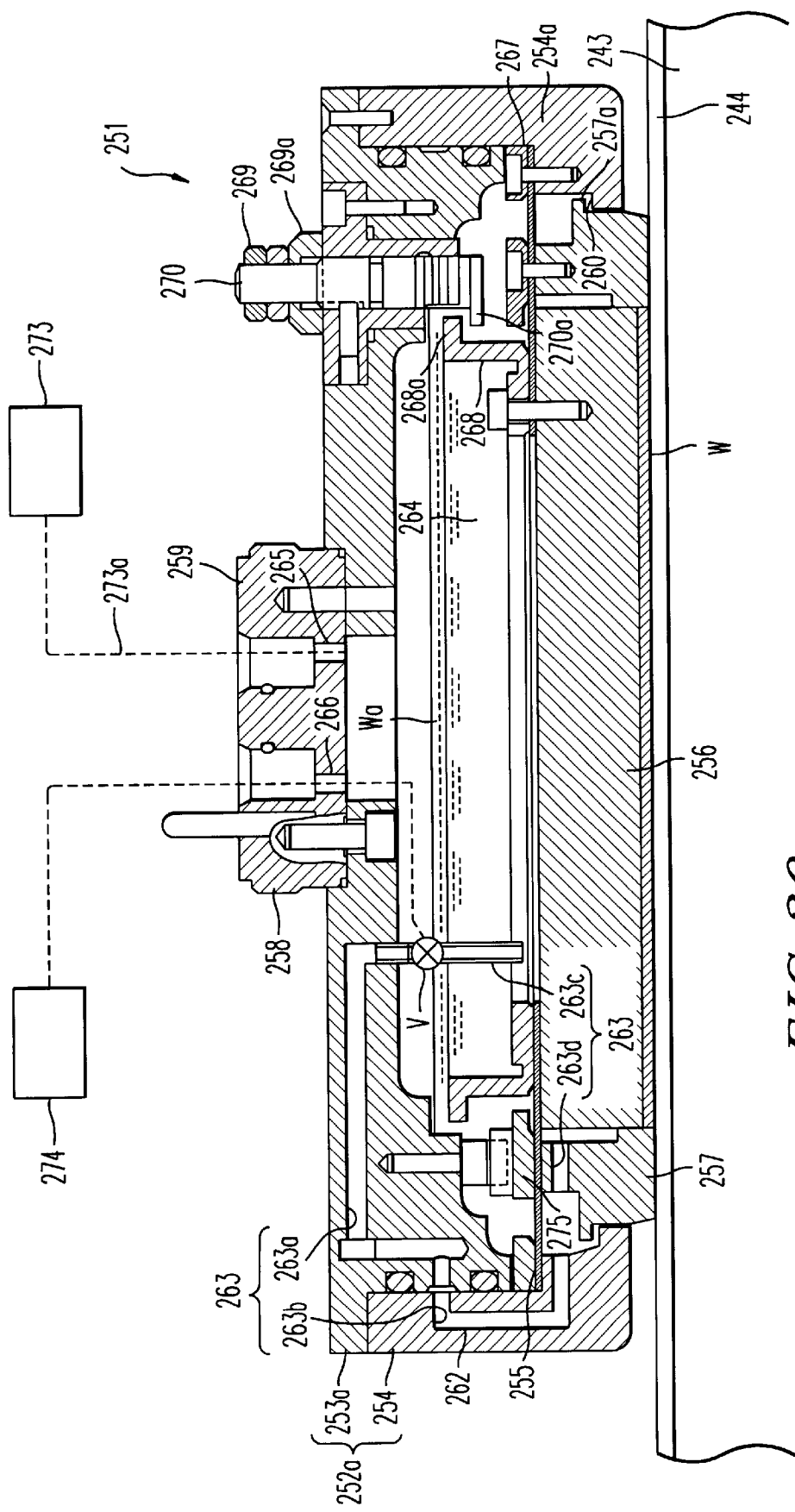
FIG. 30 shows a front view of the wafer holding head according to the present invention.

The wafer holding head according to the present invention will be described hereinafter with reference to the drawings. FIG. 30 shows a front cross section of the wafer holding head 251 in one embodiment of the present invention.

The portions similar to those in the conventional wafer holding head 245a are described using the same reference numerals in the following descriptions.

The wafer holding head 251 is provided with a head body 252a comprising a top plate 253a and a cylindrical circumference wall 254, a diaphragm 255 comprising an elastic member expanded in the head body 251a, a disk-shaped carrier 256 fixed at the lower face of the diaphragm 255, and ring-shaped retainer rings 257 provided on the inner wall of the circumference wall 254 and the carrier 256 in concentric relation with each other.

The head body 252a is composed of the disk-shaped top plate 253a and the cylindrical circumference wall 254 fixed below the circumference of the top plate 253a, and the lower end of the head body 102 is open forming a hollow cylinder. A fluid chamber 264, in which air and pure water Wa is fed together as a fluid from a fluid feed mechanism 273, is formed between the head body 252a and the diaphragm 255. The fluid chamber 264 communicates the fluid path 265 formed in a shaft 259, and controls the inner pressure by feeding air and pure water Wa from the fluid feed mechanism 273 through a tube 273a and a flow path 265.

The top plate 253a is fixed to the shaft 259, which is a coupling member for coupling the wafer holding head 251 to the arm, in a coaxial relation with each other. The flow path 265 and a wiring insertion path 266 are vertically formed in the shaft 259, and an external thread 258 for coupling, for example, to the arm is formed on the outer circumference face. The coupling construction between the arm and the shaft 259 is not limited to screwing, but other constructions may be used.

A step 254a is radially formed at the lower part of the circumference wall over the entire circumference, a radially protruding ring-shaped support plate 260 is formed at the circumference side of the lower end of the step 254a.

A top plate side cleaning liquid tube 263a, communicating from the inner circumference side of the bottom face to the face in opposed relation to the circumference wall 254 below the outer circumference, is formed on the top plate 253a. Also, a side wall side cleaning liquid tube 263b, in which one end of the top plate side cleaning liquid tube 263a communicates the end of opening at the outer circumference side of the top plate 253a, and the other end communicates the inner face of the step 254a along the radius direction, is formed on the circumference wall 254.

An inlet tube 263c, reaching near the bottom of the fluid chamber 264, is connected to the end of the top plate side cleaning liquid tube 263a at the inner circumference side of the bottom face of the top plate 253a, so that, of the liquid in the fluid chamber 264, only pure water pooled at near the bottom of the fluid chamber can be sucked. A valve V is provided at the inlet tube 263c, which is controlled to open and close with a controller 274 to control the flow of the cleaning liquid.

The cleaning liquid tube 263 for leading the cleaning liquid from the liquid chamber 264 to the lower part, or the tip, of the head body 252a is composed of the top plate side cleaning liquid tube 263a, the side wall side cleaning liquid tube 263b, the inlet tube 263a and the retainer ring side cleaning liquid tube 263d.

A plurality of the cleaning liquid tubes 263 are provided over the entire circumference of the wafer holding head 251 with a distance apart (only one tube is shown in FIG. 30), so that the lower end of the wafer holding head 251 can be equally cleaned over the entire circumference.

The diaphragm 255 comprising an elastic material such as a fiber-reinforced rubber is formed into a ring or disk, and is fixed with a diaphragm fixing ring 267 on the step 254a formed on the inner wall of the circumference wall 254.

The carrier 256 comprising a highly rigid material such as a ceramic is formed into a disk with an approximately constant thickness, and is fixed with a carrier fixing ring 268 provided on the upper face of the diaphragm 255. A ring-shaped step 268a is formed above the carrier fixing ring 268, and is engaged with a step 270 formed at the ends of the nuts 269 vertically penetrating through the top plate 253a, and at the ends of the stopper volts 270 fixed with the spacer 269a. When the wafer holding head 251 ascends by means of an ascending-descending mechanism (not shown) to bend the diaphragm 255 downward by the weight of the carrier 256, the diaphragm 255 does not suffer an excess force by allowing the step 268a to engage with the step 270a. The carrier 256 is provided with a wafer adhering sheet on its lower face (not shown).

The retainer ring 257 is formed into a ring-shape between the inner wall of the circumference wall 254 and the outer circumference face of the carrier 256 with a concentric relation between the inner wall of the circumference wall 254 and the outer circumference face of the carrier 256 with a slight gap between the inner wall of the circumference wall 254 and the outer circumference face of the carrier 256. The top end face and the bottom end face of the retainer ring 257 is formed to be horizontal, and the retainer ring 257 is fixed with a retainer ring fixing ring 275 provided on the top face of the diaphragm 255. A step 257a is formed on the outer circumference face of the retainer ring 257. The diaphragm 255 does not suffer a local excess force by allowing the step 257 to engage with the support plate 260, even when the diaphragm 255 locally bend by the weight of the retainer ring 257 and by the inner pressure of the fluid chamber 264 when the wafer holding head ascends by means of the ascending-descending mechanism. The retainer ring side cleaning liquid tube 263d, for leading pure water Wa spouting between the circumference wall 254 and the retainer ring 257 through the cleaning liquid tube 263, is formed between the retainer ring 257 and the carrier 256 at above the step 257a.

The carrier 256 and the retainer ring 257 assume a floating structure being able to freely displace along the axis direction by elastic deformation of the diaphragm 255.

The wafer holding head 251 having the construction as described above is used, for example, for the wafer polishing apparatus 241, and is coupled to the main polishing apparatus by screwing its external thread into the spindle provided on the arm. Coupling means other than screwing may be used for coupling the arm to the shaft. The wafer holding head 251 may be used for the wafer polishing apparatus 200 shown in FIG. 31, wherein the head is coupled to the spindle 211.

For polishing the wafer W using the wafer holding head 251, the wafer W is at first adhered on the wafer adhering sheet provided on the lower face of the carrier 256. The surface of the wafer W is allowed to contact the polishing pad 254 adhered on a rotation table 243 (a platen), while the periphery of the wafer is locked with the retainer ring 257. Any materials that have been used for polishing the wafer may be used for the polishing pad 254, examples of them including a velour type pad prepared by impregnating a nonwoven fabric comprising polyester with a soft resin such as polyurethane, a suede type pad prepared by forming a resin foam layer comprising polyurethane foam on a substrate such as a polyester nonwoven fabric, or a resin foam sheet comprising independently foamed polyurethane.

Then, air and pure water Wa is fed to the flow path 265 from a fluid feed mechanism 273. The fed fluids flow into the fluid chamber 264 to control the pressure in the fluid chamber 264, or the pressing pressure of the carrier 256 and the retainer ring 257 onto the polishing pad 244.

The wafer W is polished as described above by adjusting the pressing pressure of the carrier 256 and the retainer ring 257 onto the polishing pad 244 while allowing the rotation table 243 to rotate and the wafer holding head to revolve, besides supplying a slurry SL onto the surface of the polishing pad 244 and the face of the wafer W to be polished.

The wafer holding head 251 is cleaned when polishing of the wafer W has been completed, or when cleaning is required during polishing of the wafer W.

The wafer holding head 251 is cleaned as follows. At first, the wafer holding head 251 is allowed to displace toward the rotation table side 243 using the arm. Then, pure water Wa of the fluid in the fluid chamber 264 is introduced from the inlet tube 263c into the cleaning liquid tube 263 by back pressure supplied into the from the fluid feed mechanism 273. Pure water Wa is allowed to spout between the side wall 254 and the retainer ring 257 through the top plate side cleaning liquid tube 263a and the side wall side cleaning liquid tube 263b, and between the retainer ring 257 and the carrier 256 through the retainer ring side cleaning liquid tube 263d by the back pressure to clean these members. Since an additional fluid is fed into the fluid chamber 264 from the fluid feed mechanism 273, the pressure in the fluid chamber 264 is maintained within an appropriate range.

Pure water Wa fed to the fluid chamber 264 into the fluid chamber 264 by the fluid feed mechanism 273 is led to the tip of the head for cleaning the wafer holding head 251 in the wafer holding head 251 having the construction as described above. Consequently, the work for attaching and detaching the water supply hose can be eliminated to enable quick cleaning of the wafer holding head 251.

Since air is supplied into the fluid chamber 264 together with pure water Wa, the advantageous property of the gas that readily changes its volume in response to external pressure allows flexible displacement of the diaphragm 255 while maintaining good trailing property against fluctuation of the contact pressure of the polishing pad 244 with the wafer. In addition, the heat generated in the wafer holding head 251 is absorbed by pure water Wa having considerably large heat capacity as compared with air, making it possible to increase the heat capacity of the wafer holding head 251.

According to the wafer holding head 251 having the construction as described above, the wafer holding head 251 is quickly cleaned without decreasing work efficiency of the cleaning mechanism. Therefore, the wafer holding head 251 can be cleaned at any time, without being restricted at the time when polishing of the wafer has been completed.

Since temperature increase of the wafer holding head caused by the heat of friction by polishing is suppressed, and the chemical reaction between the slurry and the wafer is moderated, machining accuracy of the wafer is improved in a nearly ideal condition for polishing the wafer. Machining accuracy of the wafer and other members further improved by suppressing heat deformation.

While the example in which pure water Wa is used for the cleaning liquid, the liquid is not limited thereto, but a slurry SL in which slurry grains are suspended may be used.

The present invention is not limited to the embodiment as hitherto set forth, but any modifications including combinations of the forgoing embodiment (for example, a combination of the fourth embodiment or the fifth embodiment, and the sixth embodiment) may be provided.

What is claimed is:

1. A wafer polishing apparatus comprising:
   a polishing pad;
   a platen having a first surface, wherein said polishing pad is adhered to said first surface of said platen;
   a wafer holding head both for holding a first face of a wafer to be polished and for allowing a second face of the wafer to contact said polishing pad adhered to said first surface of said platen; and
   a head driving means for driving said wafer holding head to polish the second face of the wafer, wherein said wafer holding head includes:
   a head body having a head axis;
   a diaphragm expanded in a substantially vertical direction relative to said head axis of said head body;
   a fluid chamber formed between said diaphragm and said head body;
   a pressure adjusting means for adjusting a pressure of a fluid in said fluid chamber;

a disk-shaped carrier for holding the first face of the wafer to be polished, wherein said carrier is fixed to said diaphragm so that together said carrier and said diaphragm are displaceable along a direction of said head axis;

a retainer ring disposed in a concentric relationship with respect to an outer circumference of said carrier, wherein said retainer ring is fixed to said diaphragm so that together said retainer ring and said diaphragm are displaceable along said direction of said head axis, and wherein said retainer ring comes into contact with said polishing pad during polishing operations; and at least first and second guide members engaging each other at an engaging portion, wherein said at least first guide member is provided on said head body and said at least second guide member is provided on any one of said carrier and said retainer ring, and wherein said engaging portion of said at least first and second guide members is freely slidable along said direction of said head axis so that sliding movement of said engaging portion of said at least first and second guide members is limited in a direction of rotation of said wafer holding head.

2. The wafer polishing apparatus according to claim 1, wherein said engaging portion of said at least first and second guide members is located along an axis of said carrier, and any one of said circumference of said carrier and an inner circumference of said retainer ring forms a combination with an outer circumference of said retainer ring and said head body in a vicinity of said retainer ring.

3. A method for manufacturing a wafer, wherein a wafer polishing apparatus is used in a wafer polishing process, said wafer polishing apparatus including a polishing pad, a platen having a first surface, wherein said polishing pad is adhered to said first surface of said platen, a wafer holding head both for holding a first face of a wafer to be polished and for allowing a second face of the wafer to contact said polishing pad adhered to said first surface of said platen; and a head driving means for driving said wafer holding head to polish the second face of the wafer, wherein said wafer holding head includes a head body having a head axis, a diaphragm expanded in a substantially vertical direction relative to said head axis of said head body, a fluid chamber formed between said diaphragm and said head body, a pressure adjusting means for adjusting a pressure of a fluid in said fluid chamber, a disk-shaped carrier for holding the first face of the wafer to be polished, wherein said carrier is fixed to said diaphragm so that together said carrier and said diaphragm are displaceable along a direction of said head axis, a retainer ring disposed in a concentric relationship with respect to an outer circumference of said carrier, wherein said retainer ring is fixed to said diaphragm so that together said retainer ring and said diaphragm are displaceable along said direction of said head axis, and wherein said retainer ring comes into contact with said polishing pad during polishing operations; and at least first and second guide members engaging each other at an engaging portion, wherein said at least first guide member is provided on said head body and said at least second guide member is provided on any one of said carrier and said retainer ring, and wherein said engaging portion of said at least first and second guide members is freely slidable along said direction of said head axis so that sliding movement of said engaging portion of said at least first and second guide members is limited in a direction of rotation of said wafer holding head, said wafer polishing process including the steps of:

controlling said pressure in said fluid chamber;

controlling a rotation speed of said platen; and controlling a driving speed of said head driving means.

4. A method for manufacturing a wafer, wherein a wafer polishing apparatus is used in a wafer polishing process, said wafer polishing apparatus including a polishing pad, a platen having a first surface, wherein said polishing pad is adhered to said first surface of said platen, a wafer holding head both for holding a first face of a wafer to be polished and for allowing a second face of the wafer to contact said polishing pad adhered to said first surface of said platen; and a head driving means for driving said wafer holding head to polish the second face of the wafer, wherein said wafer holding head includes a head body having a head axis, a diaphragm expanded in a substantially vertical direction relative to said head axis of said head body, a fluid chamber formed between said diaphragm and said head body, a pressure adjusting means for adjusting a pressure of a fluid in said fluid chamber, a disk-shaped carrier for holding the first face of the wafer to be polished, wherein said carrier is fixed to said diaphragm so that together said carrier and said diaphragm are displaceable along a direction of said head axis, a retainer ring disposed in a concentric relationship with respect to an outer circumference of said carrier, wherein said retainer ring is fixed to said diaphragm so that together said retainer ring and said diaphragm are displaceable along said direction of said head axis, and wherein said retainer ring comes into contact with said polishing pad during polishing operations, and at least first and second guide members engaging each other at an engaging portion, wherein said at least first guide member is provided on said head body and said at least second guide member is provided on any one of said carrier and said retainer ring, and wherein said engaging portion of said at least first and second guide members is freely slidable along said direction of said head axis so that sliding movement of said engaging portion of said at least first and second guide members is limited in a direction of rotation of said wafer holding head, and wherein said engaging portion of said at least first and second guide members is located along an axis of said carrier, and any one of said circumference of said carrier and an inner circumference of said retainer ring forms a combination with an outer circumference of said retainer ring and said head body in a vicinity of said retainer ring, said wafer polishing process including the steps of:

controlling said pressure in said fluid chamber;

controlling a rotation speed of said platen; and controlling a driving speed of said head driving means.

5. A wafer polishing apparatus comprising:

a polishing pad;

a platen having a first surface, wherein said polishing pad is adhered on said first surface;

a wafer holding head both for holding a first face of a wafer to be polished and for allowing a second face of the wafer to contact said polishing pad, wherein the second face of the wafer is polished with said polishing pad by a relative movement between said wafer holding head and said platen, and wherein said wafer holding head is supported in a freely rotatable manner in a horizontal plane by a spindle and said spindle is connected to an upper part of said wafer holding head by a connecting portion; and a sensor for sensing a force acting on the wafer, wherein said sensor is provided at a face of said connecting portion connecting said spindle to said wafer holding head.

6. The wafer polishing apparatus according to claim 5, wherein said sensor comprises a piezoelectric element.

7. The wafer polishing apparatus according to claim 5,
wherein said wafer holding head is provided with a cylindrical shaft having external threads formed on a circumferential face of said upper part of said wafer holding head,
wherein said spindle is provided with an outer cylinder having both a downwardly-directed opening and internal threads, said internal threads being formed on an inner circumferential face of said outer cylinder so that said internal threads of said outer cylinder can be screwed into said external threads of said cylindrical shaft, said outer cylinder having a contact face formed thereon such that said contact face is disposed at a position so as to contact an upper end face of said cylindrical shaft when said external threads of said cylindrical shaft are screwed into said internal threads of said outer cylinder, and
a plurality of sensors disposed at spaced intervals from each other along a circumferential direction of said contact face.

8. The wafer polishing apparatus according to claim 7, wherein each sensor of said plurality of sensors comprise a piezoelectric element.

9. The wafer polishing apparatus according to claim 5,
wherein said wafer holding head is provided with a cylindrical shaft having an external thread on a circumferential face thereof, said cylindrical shaft being located at an upper part of said wafer holding head,
wherein said spindle is provided with an outer cylinder, internal threads, and a positioning member, such that said outer cylinder is connected to a lower part of a main spindle axis and is open downwardly, said internal thread is formed on an inner circumferential face of said outer cylinder for being screwed onto said external threads of said cylindrical shaft, and said positioning member is provided inside of said outer cylinder to allow a first face thereof to contact a lower end face of said shaft, while allowing a second face thereof to contact an upper end face of said cylindrical shaft when said external threads of said cylindrical shaft are screwed into said internal threads of said outer cylinder, and
a plurality of sensors disposed at spaced intervals from each other along a circumferential direction of a contact face between said lower end face of said shaft and said positioning member.

10. The wafer polishing apparatus according to claim 9, wherein each sensor of said plurality of sensors comprises a piezoelectric element.

11. A method for manufacturing a wafer using a wafer polishing apparatus having a platen with a surface on which a polishing pad is adhered, and a wafer holding head both for holding a first face of the wafer to be polished and for allowing a second face of the wafer to contact said polishing pad of said wafer polishing apparatus, said method comprising the steps of:
polishing the wafer against said polishing pad via a relative movement between said wafer holding head and said platen;
supporting said wafer holding head in a freely rotatable manner in a horizontal plane via a spindle at an upper part of said wafer holding head; and
continuing polishing by detecting a polished state of the wafer based on a result sensed by a sensor.

12. A wafer polishing apparatus including a platen having a surface on which a polishing pad is adhered, and a wafer holding head both for holding the wafer to be polished and for allowing a first face of the wafer to contact said polishing pad, wherein the wafer is polished with said polishing pad by allowing individual rotation of said wafer holding head with respect to said platen, said wafer holding head comprising:
a head body having a head axis, a top plate, and a face of a peripheral wall, wherein said peripheral wall is provided adjacent to an outer circumference of said top plate;
a diaphragm expanded in a direction substantially vertical relative to said head axis of said head body;
a pressure adjusting means for adjusting a pressure of a fluid in a fluid chamber, wherein said fluid chamber is formed between said diaphragm and said head body;
a carrier provided for holding the first face of the wafer to be polished, wherein said carrier is fixed to said diaphragm so that together said carrier and said diaphragm are displaceable along a direction of said head axis;
a retainer ring disposed in a concentric relationship between an inner surface of said peripheral wall of said head body and an outer circumference of said carrier, wherein said retainer ring is fixed to said diaphragm so that together said retainer ring and said diaphragm are displaceable along said direction of said head axis;
a plurality of torque transfer means for transferring a torque of said head body to said carrier, wherein said plurality of torque transfer means are provided along a direction of a circumference between said head body and said carrier;
a plurality of first sensors provided at each torque transfer means of said plurality of torque transfer means, wherein said plurality of first sensors is for observing a force acting on the wafer along a direction of rotation of said wafer holding head; and
a processor for calculating the force acting on the wafer based on an output from each first sensor of said plurality of first sensors, wherein said processor is connected to each first sensor of said plurality of first sensors.

13. The wafer polishing apparatus according to claim 12, wherein a first torque transfer means of said plurality of torque transfer means is provided with:
a first member formed so as to expand downwardly from a bottom face of said top plate; and
a second member provided on an upper face of said carrier so as to contact a part of said first member along said direction of rotation of said wafer holding head during polishing operations, wherein said second member is displaceable along a direction of an axis relative to said first member, and wherein said first sensor is provided at a contact portion between said first and second members.

14. A method for manufacturing a wafer using a wafer polishing apparatus including a platen having a surface on which a polishing pad is adhered, and a wafer holding head both for allowing a first face of the wafer to contact said polishing pad by holding the wafer to be polished, said method comprising the steps of:
polishing the wafer with said polishing pad by allowing said wafer holding head and said platen to rotate individually,
wherein said wafer holding head includes:

a head body including a head axis, a top plate, and a cylindrical circumference wall, wherein said cylindrical circumference wall is provided adjacent to an outer circumference of said top plate;

a diaphragm expanded in a direction substantially vertical relative to said head axis of said head body;

a pressure adjusting means for adjusting pressure of a fluid in a fluid chamber, wherein said fluid chamber is formed between said diaphragm and said head body;

a carrier for holding a first face of the wafer to be polished, wherein said carrier is fixed to said diaphragm so that together said carrier and said diaphragm are displaceable along a direction of said head axis;

a retainer ring disposed in a concentric relationship between an inner wall of said cylindrical circumference wall of said head body and an outer circumference of said carrier, wherein said retainer ring is fixed to said diaphragm so that together said retainer ring and said diaphragm are displaceable along said direction of said head axis, and wherein said retainer ring contacts said polishing pad during polishing operations;

a plurality of first torque transfer means for communicating torque of said head body to said carrier, wherein each first torque transfer means of said plurality of first torque transfer means is provided along a circumferential direction between said head body and said carrier;

a plurality of first sensors for sensing a force acting on the wafer along a direction of rotation of said wafer holding head, wherein each first sensor of said plurality of first sensors is provided at each first torque transfer means of said plurality of first torque transfer means; and a processor for calculating the force acting on the wafer based on an output from each first sensor of said plurality of first sensors, wherein said processor is connected to each first sensor of said plurality of first sensors, wherein the wafer held on said wafer holding head is allowed to rotate while allowing the wafer to contact said polishing pad, wherein the force acting on the wafer is calculated with said processor based on said outputs from each first sensor of said plurality of first sensors, and wherein the wafer is polished while judging a polished state of the wafer based on an output from said processor.

15. A wafer polishing apparatus including a platen having a surface on which a polishing pad is adhered, and a wafer holding head for allowing a first face of the wafer to contact said polishing pad by holding the wafer to be polished, the wafer being polished with said polishing pad by allowing said wafer holding head and said platen to individually rotate, said wafer holding head comprising:

a head body including a head axis, a top plate, and a cylindrical circumference wall, wherein said cylindrical circumference wall is provided adjacent to an outer circumference of said top plate;

a diaphragm expanded in a direction substantially vertical relative to said head axis of said head body;

a pressure adjusting means for adjusting pressure of a fluid in a fluid chamber, wherein said fluid chamber is formed between said diaphragm and said head body;

a carrier for holding a first face of the wafer to be polished, wherein said carrier is fixed to said diaphragm so that together said carrier and said diaphragm are displaceable along a direction of said head axis;

a retainer ring disposed in a concentric relationship between an inner wall of said cylindrical circumferential wall and an outer circumference of said carrier fixed to said diaphragm, wherein together said retainer ring and said diaphragm are displaceable along said direction of said head axis, and wherein said retainer ring contacts said polishing pad during polishing operations;

a plurality of first torque transfer means for communicating torque of said head body to said carrier, wherein each first torque transfer means of said plurality of first torque transfer means is provided along a circumferential direction between said head body and said carrier;

a plurality of first sensors for sensing a force acting on said retainer ring along a direction of rotation of said wafer holding head, wherein each first sensor of said plurality of first sensors are provided at each first torque transfer means of said plurality of first torque transfer means; and a processor for calculating the force acting on said retainer ring based on outputs from each first sensor of said plurality of first sensors, wherein said processor is connected to each first sensor of said plurality of first sensors.

16. The wafer polishing apparatus according to claim 15, provided with:

a plurality of second torque transfer means for communicating torque of said head body to said carrier, wherein each second torque transfer means of said plurality of second torque transfer means are provided along said circumferential direction between said head body and said carrier; and a plurality of second sensors for sensing the force acting on the wafer along said direction of rotation of said wafer holding head, wherein each second sensor of said plurality of second sensors are provided at each second torque transfer means;

wherein said processor is connected to each second sensor of said plurality of second sensors so that the force acting on the wafer is calculated based on said outputs both from each first sensor of said plurality of first sensors and said outputs from each second sensor of said plurality of second sensors.

17. A method of manufacturing a wafer using a wafer polishing apparatus including a platen having a surface on which a polishing pad is adhered, and a wafer holding head for holding the wafer to allow a first face of the wafer to contact said polishing pad, said method comprising the method steps of:

polishing the wafer with said polishing pad by allowing said wafer holding head and said platen to individually rotate, said wafer holding head including:

a head body including a head axis, a top plate, and a cylindrical circumference wall, wherein said cylindrical circumference wall is provided adjacent to an outer circumference of said top plate;

a diaphragm expanded substantially vertical relative to said head axis of said head body;

a pressure adjusting means for adjusting pressure of a fluid in a fluid chamber, wherein said fluid chamber is formed between said diaphragm and said head body;

a carrier for holding the first face of the wafer to be polished, wherein said carrier is fixed to said diaphragm and wherein together said carrier and said diaphragm are displaceable along a direction of said head axis;

a retainer ring disposed in a concentric relationship between an inner wall of said cylindrical circumferential peripheral wall and an outer circumference of said carrier, wherein said retainer ring is fixed to the diaphragm so that together said retainer ring and said diaphragm are displaceable along said direction of said head axis, and said retainer ring contacts said polishing pad during polishing operations;

a plurality of first torque transfer means for communicating torque of said head body to said carrier, wherein each first torque transfer means of said plurality of first torque transfer means is provided along a direction of said circumference between said head body and said carrier;

a plurality of second torque transfer means for communicating torque acting on said head body to said retainer ring, wherein each second torque transfer means of said plurality of second torque transfer means is provided between said head body and said retainer ring along said direction of said circumference;

a plurality of first sensors for sensing the force acting on said carrier along a direction of rotation of said wafer holding head, wherein each first sensor of said plurality of first sensors is provided at each first torque transfer means of said plurality of first torque transfer means; and a plurality of second sensors for sensing the force acting on said retainer ring along said direction of rotation of said wafer holding head, wherein each second sensor of said plurality of second sensors is provided at each second torque transfer means of said plurality of second torque transfer means, wherein detected signals of each first sensor of said plurality of first sensors are corrected to corrected values based on outputs from each second sensor of said plurality of second sensors, and wherein the wafer is polished while detecting the force acting on the wafer based on said corrected values.

18. A wafer holding head of a wafer polishing apparatus for polishing a wafer by allowing the wafer and a platen to travel relative to each other, while allowing a first face of the wafer to be polished to contact a polishing pad adhered to a surface of said platen, said wafer holding head comprising:

a head body including a head axis, a top plate, and a cylindrical circumference wall, wherein said cylindrical circumference wall is provided adjacent to an outer circumference of said top plate;

a diaphragm expanded in a substantially vertical direction relative to said head axis of said head body;

a fluid feed means for feeding a fluid in a fluid chamber, wherein said fluid chamber is formed between said diaphragm and said head body and wherein said fluid chamber is for controlling pressure in said fluid chamber; and a carrier for folding a first face of the wafer, wherein said carrier is fixed to the diaphragm so that together said carrier and said diaphragm are displaceable along a direction of said head axis, wherein said fluid feed means supplies both a gas and a cleaning liquid as fluid in said fluid chamber, wherein said head body has a cleaning solution tube for guiding said cleaning liquid from said liquid chamber to a tip of said head body, and wherein a valve is openable and closable via a controller provided in said cleaning solution tube.

* * * * *